US00RE37375B1

(19) United States
(12) Reissued Patent
Satoh et al.

(10) Patent Number: US RE37,375 E
(45) Date of Reissued Patent: Sep. 18, 2001

(54) SURFACE ACOUSTIC WAVE FILTER

(75) Inventors: Yoshio Satoh; Osamu Ikata; Tsutomu Miyashita; Takashi Matsuda; Mitsuo Takamatsu, all of Nakahara-ku (JP)

(73) Assignee: Fujitsu Limited, Kawasaki (JP)

(21) Appl. No.: 09/158,074

(22) Filed: Sep. 22, 1998

Related U.S. Patent Documents

Reissue of:
(64) Patent No.: 5,559,481
Issued: Sep. 24, 1996
Appl. No.: 07/965,774
Filed: Oct. 23, 1992

(30) Foreign Application Priority Data

Oct. 28, 1991 (JP) ..... 3-281694
Feb. 19, 1992 (JP) ..... 4-032270

(51) Int. Cl.[7] ..... H03H 9/64
(52) U.S. Cl. ..... 333/193; 333/133; 333/194; 310/313 R
(58) Field of Search ..... 333/193–196, 333/133; 310/313 R, 313 B, 313 C, 313 D

(56) References Cited

U.S. PATENT DOCUMENTS

| | | | | |
|---|---|---|---|---|
| Re. 32,859 | * | 2/1989 | Marshall et al. | 333/151 |
| 3,582,540 | * | 6/1971 | Adler et al. | 348/507 |
| 4,044,321 | | 8/1977 | Vasile | 333/194 |
| 4,166,258 | * | 8/1979 | Tseng | 333/195 |
| 4,295,108 | * | 10/1981 | Ieki | 333/193 |
| 4,495,431 | * | 1/1985 | Grudkowski | 310/313 B |
| 4,625,184 | * | 11/1986 | Niitsuma et al. | 333/150 |
| 4,684,841 | * | 8/1987 | Este et al. | 310/313 B |
| 4,694,266 | * | 9/1987 | Wright | 333/196 |
| 4,734,664 | * | 3/1988 | Hikita et al. | 333/193 |
| 4,785,270 | | 11/1988 | Kinsman | 333/193 |
| 4,954,793 | | 9/1990 | Misu et al. | 333/133 |
| 4,978,879 | * | 12/1990 | Satoh et al. | 310/313 A |
| 5,015,973 | | 5/1991 | Kawakami et al. | 333/206 X |
| 5,039,957 | * | 8/1991 | Greer et al. | 331/107 A |
| 5,115,216 | * | 5/1992 | Hikita et al. | 333/195 |
| 5,202,652 | | 4/1993 | Tabuchi et al. | 333/193 |
| 5,294,898 | | 3/1994 | Dworsky et al. | 333/189 X |

FOREIGN PATENT DOCUMENTS

| | | | |
|---|---|---|---|
| 3323612 | * | 1/1984 | (DE) . |
| 0337703 | | 10/1989 | (EP) . |

(List continued on next page.)

OTHER PUBLICATIONS

"Active Development of SAW Resonator," *Nikkei Electronics*, Nov. 29, 1976, pp. 76 and 80.*

"Theory and Design of Filters," *Sangyo–Shuppan*, pp. 192–203.*

Y. Ebata et al. "SAW Resonator on $LiTaO_3$ Substrate and Application Thereof to Oscillator for VTR," *Journal of Institute of Electronics and Communication Engineers*, vol. J66–C, No. 1, Jan. 1983, pp. 23–30.*

(List continued on next page.)

*Primary Examiner*—Robert Pascal
*Assistant Examiner*—Barbara Summons
(74) *Attorney, Agent, or Firm*—Staas & Halsey LLP

(57) ABSTRACT

A SAW filter includes a first SAW resonator having a pair of terminals and a predetermined resonance frequency ($f_{rp}$), the first SAW resonator being provided in a parallel arm of the SAW filter. A second SAW resonator has a pair of terminals and a predetermined resonance frequency ($f_{rs}$) approximately equal to a predetermined antiresonance frequency of the first SAW resonator ($f_{ap}$). The second SAW resonator is provided in a series arm of the SAW filter. An inductance element is connected in series to the first SAW resonator.

59 Claims, 75 Drawing Sheets

FOREIGN PATENT DOCUMENTS

| | | | | |
|---|---|---|---|---|
| 0353073 | | 1/1990 | (EP) . | |
| 2283587 | * | 3/1976 | (FR) . | |
| 52-19044 | * | 2/1977 | (JP) . | |
| 52-48452 | | 4/1977 | (JP) . | |
| 54-11120 | | 6/1977 | (JP) . | |
| 53-105156 | | 9/1978 | (JP) . | |
| 56-165428 | | 5/1980 | (JP) . | |
| 56-50613 | | 5/1981 | (JP) . | |
| 56-62416 | | 5/1981 | (JP) . | |
| 58-20002 | | 2/1983 | (JP) . | |
| 60-81911 | * | 10/1983 | (JP) . | |
| 60-81910 | | 5/1985 | (JP) | 333/193 |
| 60-114010 | | 6/1985 | (JP) . | |
| 61-127220 | | 6/1986 | (JP) . | |
| 63-88910 | * | 4/1988 | (JP) . | |
| 63-132515 | | 6/1988 | (JP) . | |
| 64-78511 | | 3/1989 | (JP) . | |
| 1-231417 | | 9/1989 | (JP) . | |
| 1-260911 | | 10/1989 | (JP) . | |
| 1-290308 | | 11/1989 | (JP) . | |
| 2-58915 | | 2/1990 | (JP) . | |
| 2-69012 | | 3/1990 | (JP) . | |
| 4-16014 | * | 5/1990 | (JP) . | |
| 3-220911 | * | 9/1991 | (JP) . | |
| 4-16014 | | 1/1992 | (JP) | 333/133 |
| 4-253412 | * | 9/1992 | (JP) | 333/193 |
| 4-253414 | * | 9/1992 | (JP) . | |
| 5-167388 | | 7/1993 | (JP) | 333/133 |
| 5-206778 | | 8/1993 | (JP) . | |

OTHER PUBLICATIONS

G. Kuraishi, "Microwave Circuits," *Tokyo Denki* Daigaku Shuppan–Kyoku, p. 199.*

O. Ikata et al., "Development of 800 MHz Band SAW Filters Using Weighting for the Number of Finger Pairs," *1990 Ultrasonics Symposium*, pp. 83–86.*

K. Yamanouchi et al., "Applications for Piezoelectric Leaky Surface Waves," *1990 Ultrasonics Symposium*, pp. 11–13.*

Patent Abstracts of Japan, vol. 15, No. 506 (E–1148) 20 Dec. 1991.*

The Transactions of the Institute of Electronics and Communication Engineers of Japan, Examination, Group 5, Telecommunications, vol. J65–B, No. 2, Feb., 1982, pp. 177–184 (137–280) Feb. 25, 1982, Tokyo.

Minature SAW Antenna Duplexer Used in 800–MHz Portable Telephone for Reverse Frequency Allocation Systems, M. Hikita, et al, Oct. 1989, pp. 31–38.

National Convention Record, 1985, The Institute of Electronics and Communication Engineers of Japan, Part 1, Mar. 27–30, 1985, p. 1–97.

Acoustic Surface Wave Resonators for Broadband Applications, J. Vandewege, et al, pp. 663–667, Proceeding of the 8th European Microwave Conference, Sep., 1978.

Attentuators, 9–5, Symmetrical T– and H–Attenuators, Electronic Engineering Databook, pp. 237–238(1963).

Transmission Circuit Networks and Filters, pp. 78–81, 102–113, (1972).

Uniform Recurring Structure Progagation Constant, pp. 103–105, Wire Transmission Science, 1982.

"Distributed Constant Circuit", pp 305–307, Basic Studies in Electronic, Telecommunications and Electrical Engineering, Mar., 1973.

Electronics Technology Series No. 7, New Piezoelectric Transducer—Resonator—Filter Technology 1996, 8th Edition, Editorial Staff, General Technology Publications, pp. 141–143.

*Patent Abstracts of Japan*, vol. 15, No. 74 (E–1036), Feb. 21, 1991 & JP–A–02 295212 (Fujitsu), Dec. 6, 1990.

*Electric Circuit II*, Tadashi Sekiguchi, Ph.D., Tokyo University, Published Nov. 10, 1977.

*Handbook of Filter Synthesis*, Zverev, 1967, pp. 425–427.

Yamanouchi et al., "5 GHz Range SAW Filter Fabricated by Electron Beam Exposure with O–Plasma Ashing Techniques" *Japanese Journal of Applied Physics*, Supplements; vol. 25, No. 1, 1985; pp. 154–156.

Yamanouchi et al., "Positive/Negative Reflection—Type SAW Reflectors on St–Quartz Using New Fabrication Technique"; *Electronics Letters*, vol. 21, No. 21, Oct. 1985, pp. 966–968.

* cited by examiner

F MATRIX $$\begin{pmatrix} V_1 \\ I_1 \end{pmatrix} = \begin{pmatrix} A & B \\ C & D \end{pmatrix} \begin{pmatrix} V_2 \\ I_2 \end{pmatrix}$$

FIG. 7A
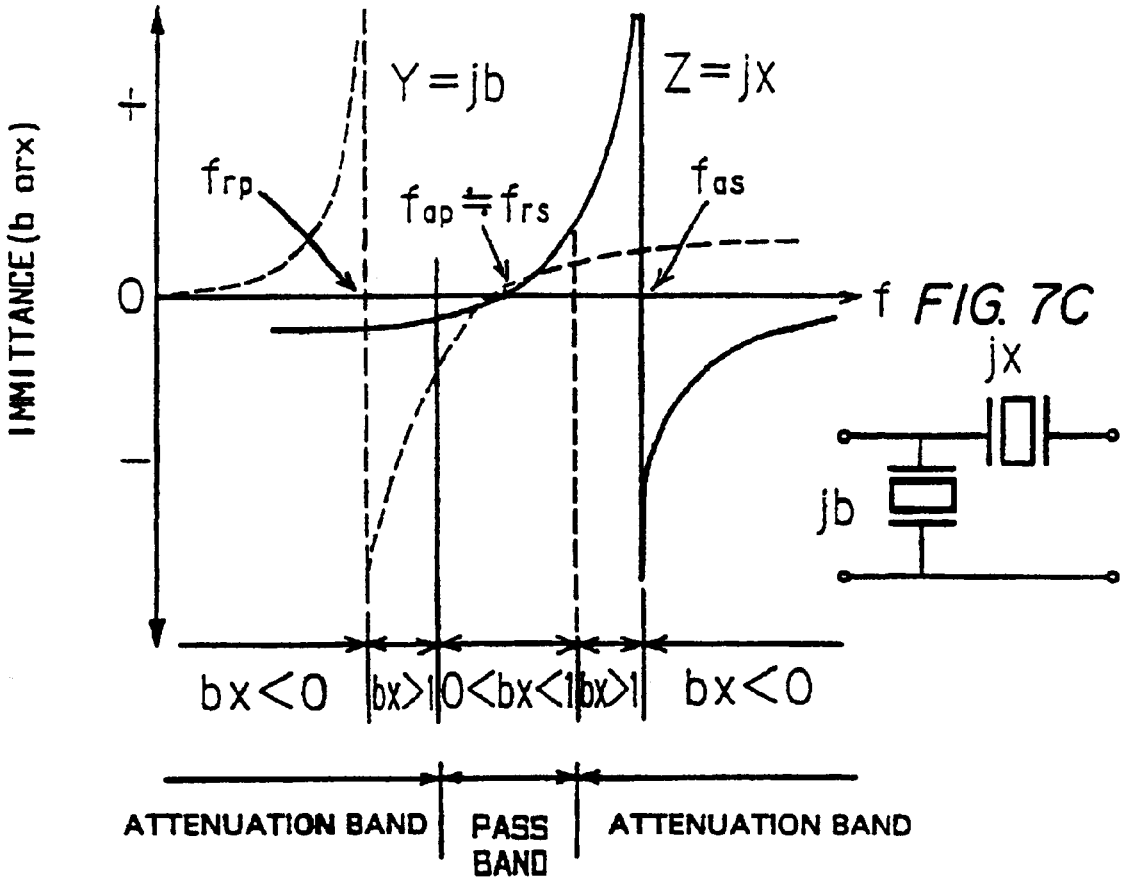
FIG. 7C
FIG. 7B
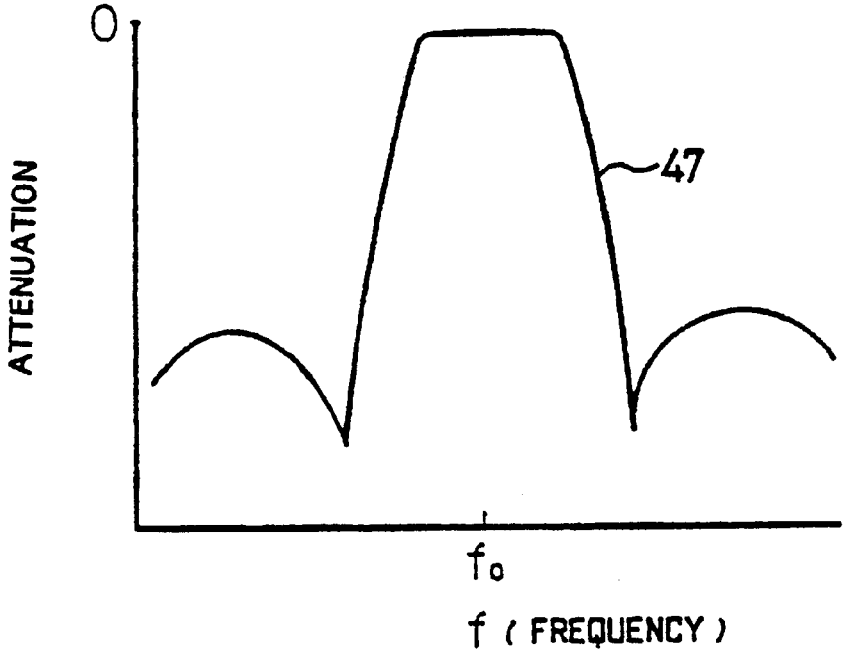

FIG. 12A
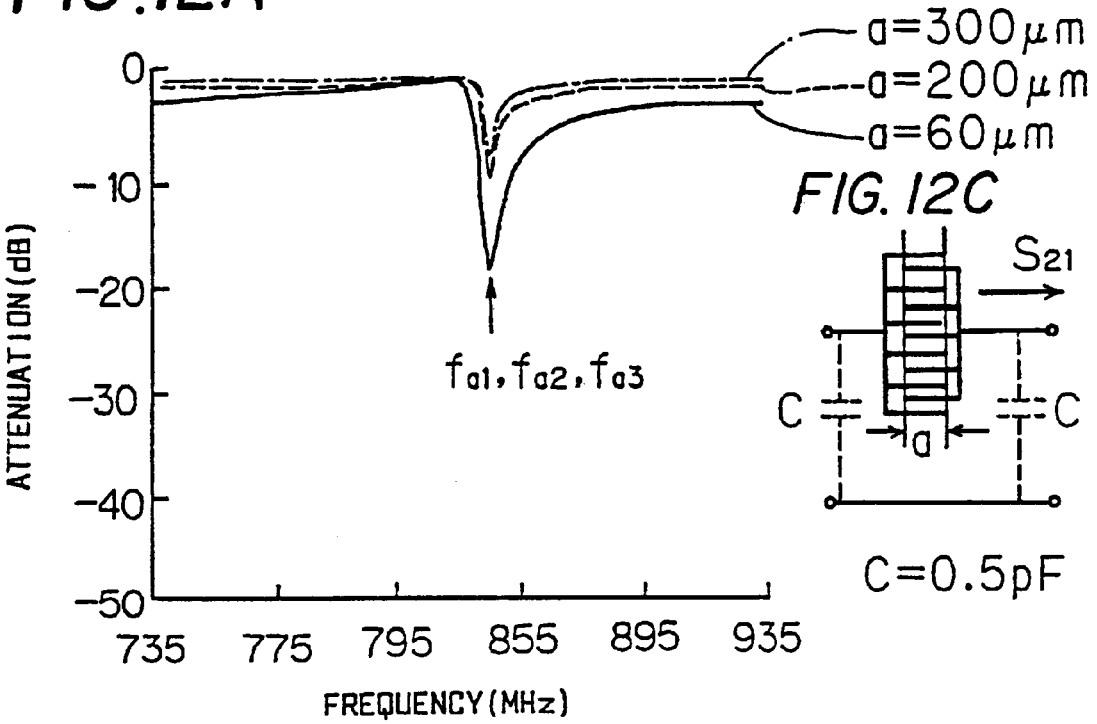
FIG. 12C
FIG. 12B
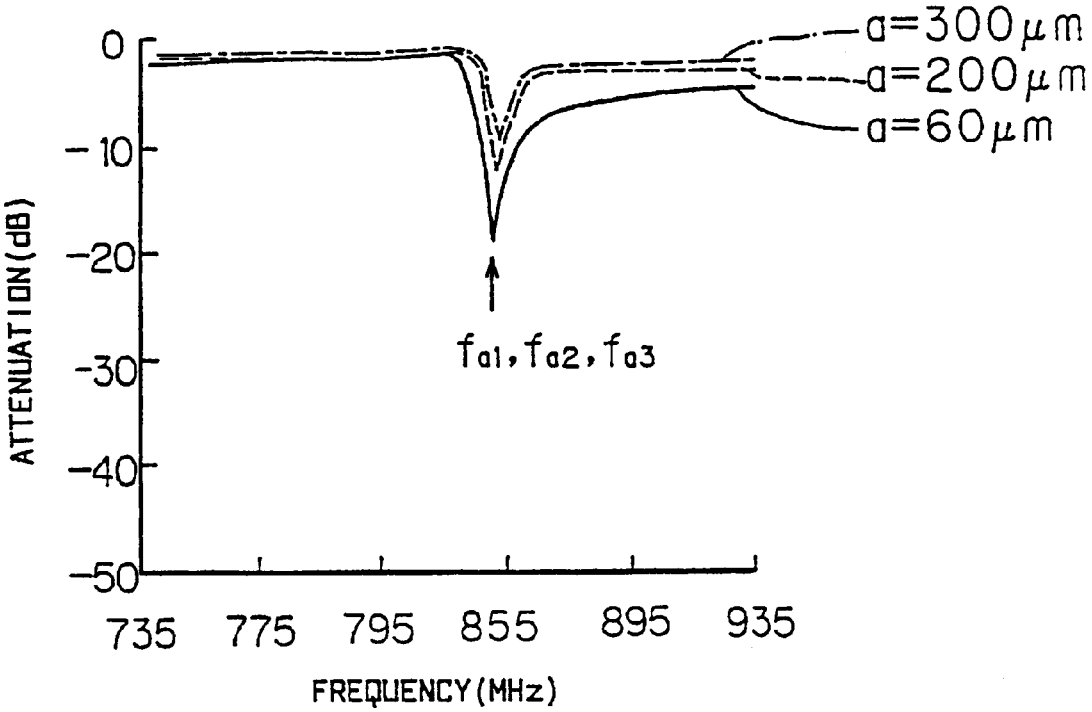

frs>fap
frs−fap=19MHz $f_{ap} < f_{rs}$
$f_{ap}$
$f_{rp}$
$f_{rs}$
$f_{as}$
$j_x$
$j_b$
bx<0
bx>1
bx<0
bx>1
bx<0
0<bx<1
0<bx<1
+
0
-
IMAGINARY PART OF IMMITTANCE

ATTENUATION $$Yp = \frac{1}{25}\left(\frac{1-S_{21}}{S_{21}}\right)(S)$$

IMPEDANCE $$Zs = 100\left(\frac{1-S_{21}}{S_{21}}\right)(\Omega)$$

FIG. 53
(AMENDED)
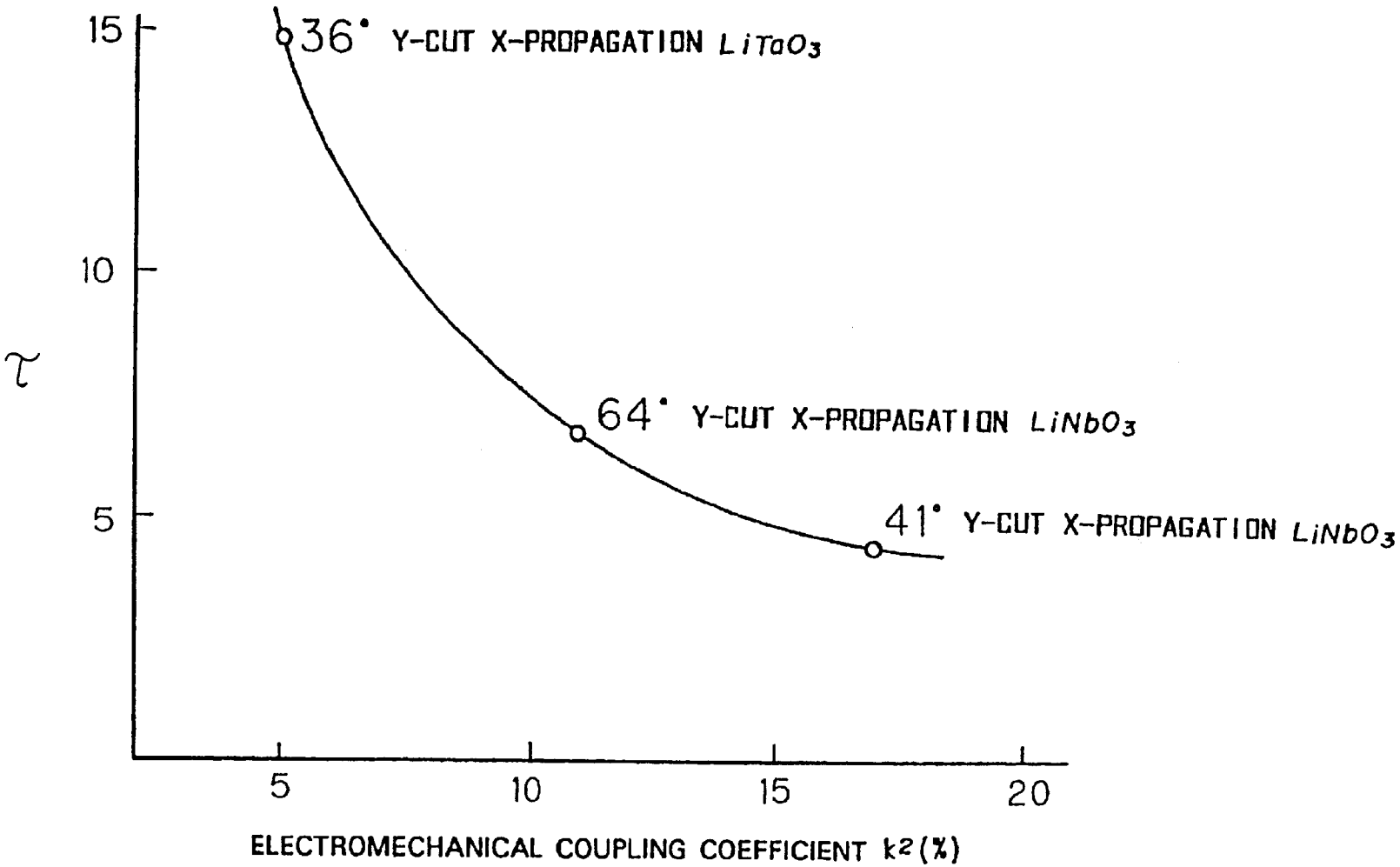

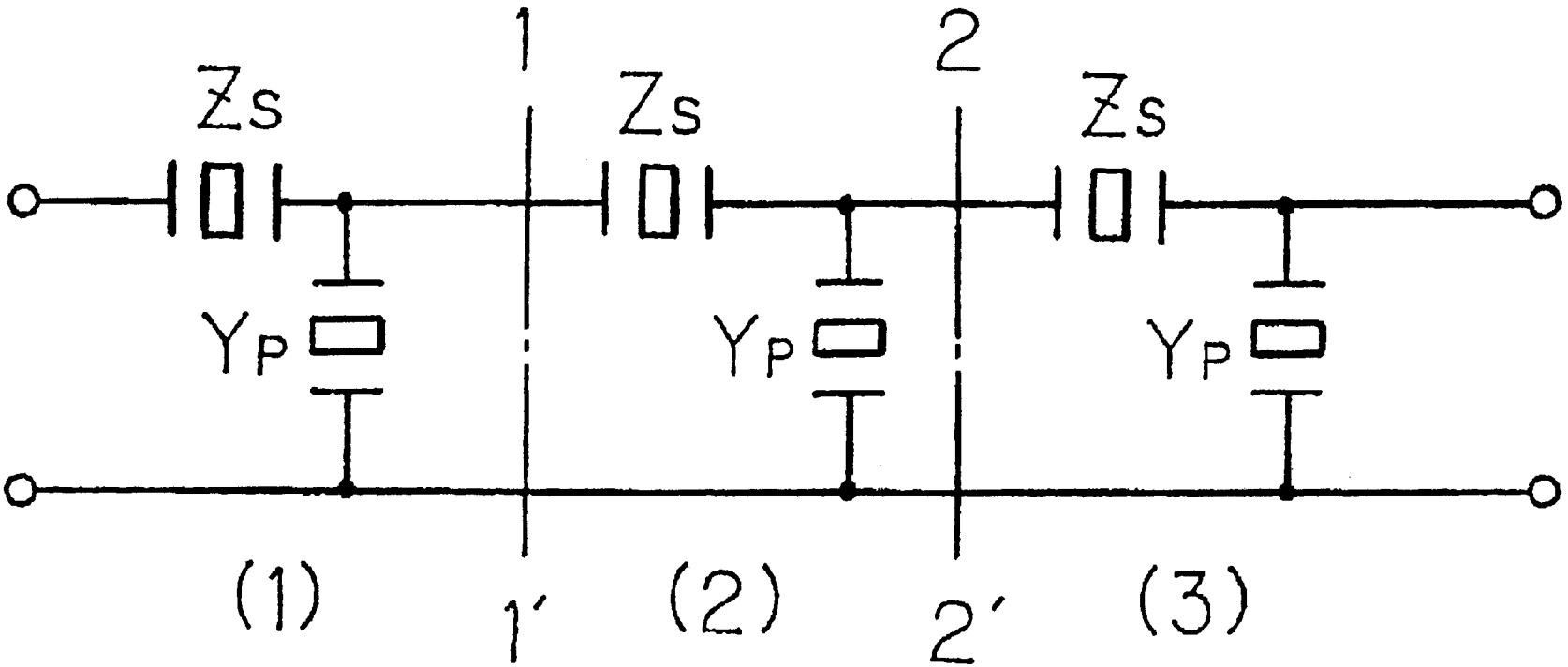
FIG. 64 RELATED ART
(AMENDED)

SURFACE ACOUSTIC WAVE FILTER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention generally relates to surface acoustic wave (SAW) filters, and more particularly to a ladder-type SAW filter suitable for an RF (Radio Frequency) filter provided in pocket and mobile telephones, such as automobile phone set and portable phones.

2. Description of the Prior Art

In Japan, an automobile phone or portable phone system has a specification in which a transmission frequency band is ±8.5 MHz about a center frequency of 933.5 MHz. The ratio of the above transmission band to the center frequency is approximately 2%.

Recently, SAW filters have been employed in automobile phone or portable phone systems. It is required that the SAW filters have characteristics which satisfy the above specification. More specifically, it is required that the pass band width is so broad that 1) the ratio of the pass band to the center frequency is equal to or greater than 2%, 2) the insertion loss is small and equal to 5 dB–2 dB, and 3) the suppression factor is high and equal to 20 dB–30 dB.

In order to satisfy the above requirements, SAW filters are substituted for conventional transversal filters. Generally, SAW elements are so connected that a ladder-type filter serving as a resonator is formed.

FIG. 1 is an equivalent circuit of a SAW filter disclosed in Japanese Laid-Open Patent Publication No. 52-19044. A SAW filter 1 shown in FIG. 1 comprises a SAW resonator 3 in a series arm 2, and a SAW resonator 5 in a parallel arm 4. The equivalent parallel capacitance $C_{OB}$ of the resonator 5 in the parallel arm 4 is larger than the equivalent parallel capacitance $C_{OA}$ of the resonator 3 in the series arm 2.

The SAW filter 1 shown in FIG. 1 has a characteristic shown in FIG. 2. A curve 6 shows an attenuation quantity v. frequency characteristic of the SAW filter 1. As indicated by arrows 7 shown in FIG. 2, the suppression factor increases as the equivalent parallel capacitance $C_{OB}$ increases. However, as the equivalent parallel capacitance $C_{OB}$ increases, the band width decreases, as indicated by arrows 8, and the insertion loss increases, as indicated by an arrow 9. Hence, the characteristic deteriorates, as indicated by a broken line 10. When trying to obtain a suppression factor equal to or larger than 20 dB, the band width is decreased so that the ratio of the pass band to the center frequency is equal to or smaller than 1%, and does not satisfy the aforementioned specification of the 800 MHz-band radio systems.

SUMMARY OF THE INVENTION

It is a general object of the present invention to provide a SAW filter in which the above disadvantages are eliminated.

A more specific object of the present invention is to provide a SAW filter having a large band width, a large suppression factor, and a small insertion loss.

The above objects of the present invention are achieved by a SAW filter comprising: a first SAW resonator (21, R1A, R1B) having a pair of terminals and a predetermined resonance frequency ($f_{rp}$), the first SAW resonator being provided in a parallel arm (24) of the SAW filter; a second SAW resonator (23) having a pair of terminals and a predetermined resonance frequency ($f_{rs}$) approximately equal to the predetermined antiresonance frequency of the first SAW resonator ($f_{ap}$), the second SAW resonator being provided in a series arm (24) of the SAW filter; and an inductance element (25, L1) connected in series to the first SAW resonator.

BRIEF DESCRIPTION OF THE DRAWINGS

Other objects, features and advantages of the present invention will become more apparent from the following detailed description when read in conjunction with the accompanying drawings, in which:

FIGS. 7A to 7C are diagrams showing an immittance characteristic of a SAW resonator and a filter characteristic of the filter shown in FIG. 3 using that SAW resonator;

FIGS. 12A to 12C are diagrams showing an aperture length dependence on a series-arm resonator;

FIG. 53 is a diagram showing the relation between $k^2$ and $\tau$;

FIG. 64 is a circuit diagram of a [conventional] *comparative example of the* SAW filter;

DESCRIPTION OF THE PREFERRED EMBODIMENTS

Figure 1:
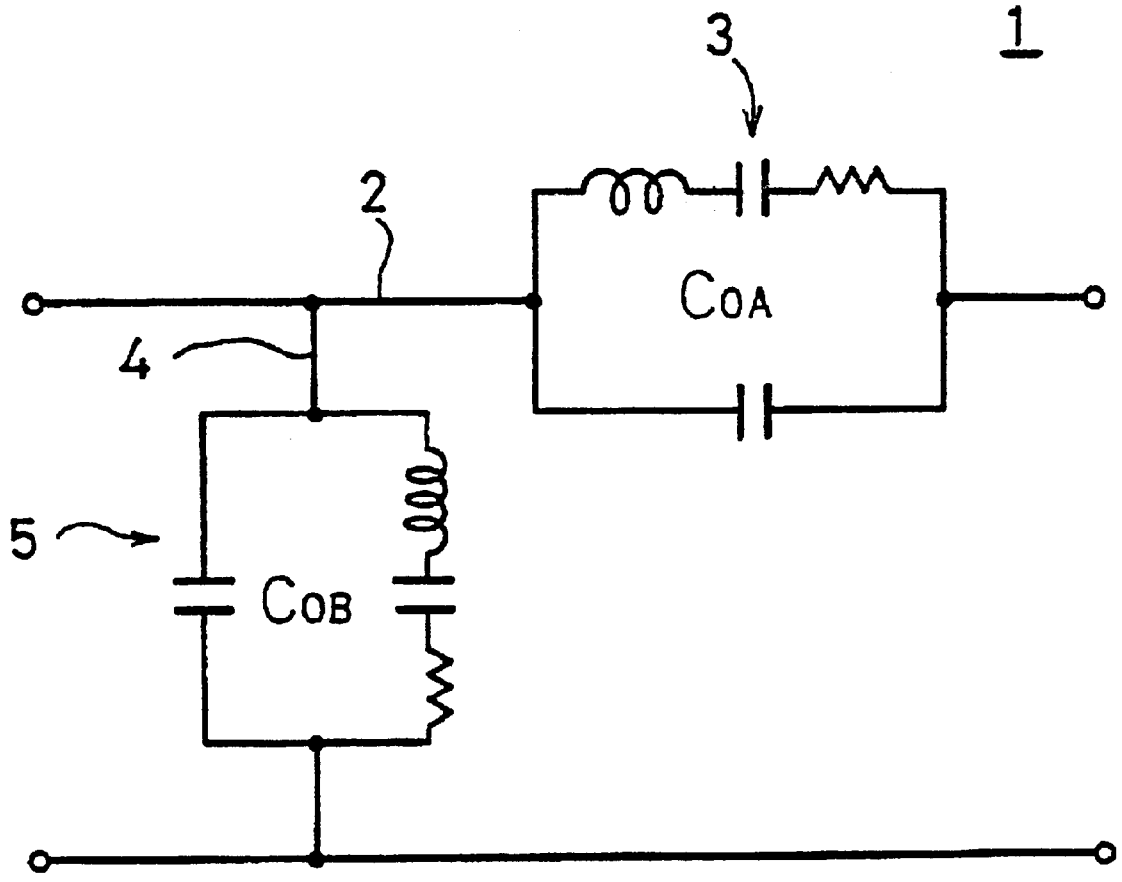
FIG. 1 PRIOR ART
FIG. 1 is an equivalent circuit diagram of a conventional SAW filter.
Figure 2:
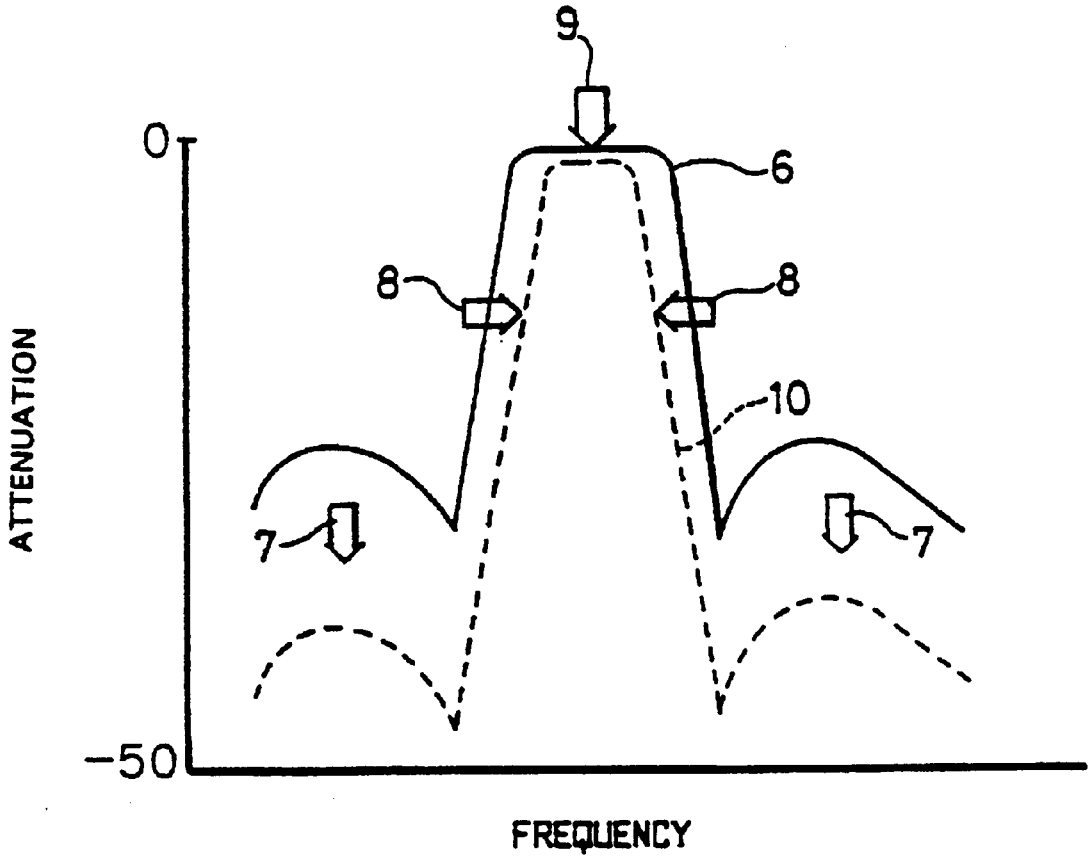
FIG.2 PRIOR ART
FIG. 2 is a graph of a characteristic of the conventional SAW filter shown in FIG. 1.
Figure 3:
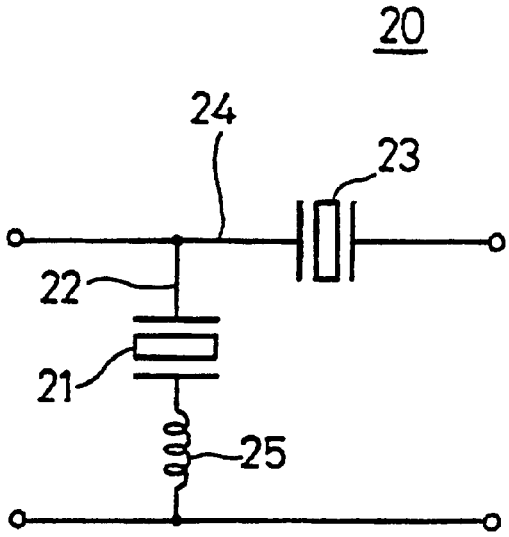
FIG. 3 is a circuit diagram of a SAW filter according to the present invention.

FIG. 3 shows an overview of a SAW filter 20 according to the present invention. The SAW filter 20 comprises a first SAW resonator 21 having a pair of terminals, a parallel arm 22, a second SAW resonator 23 having a pair of terminals, a series arm 24, and an inductor 25. The first resonator 21 connected to the parallel arm 22 has a predetermined resonance frequency $f_{rp}$. The second resonator 21 connected to the series arm 24 has a predetermined resonance frequency $f_{rs}$ approximately equal to an antiresonance frequency $f_{ap}$ of the first resonator 21. The inductor 25 is connected in series to the first resonator 21, and provided in the parallel arm 22.

The principle of the SAW filter 20 will now be described. Use of image parameters is convenient to verify whether or not a resonance circuit has a filter characteristic. The details of image parameters are described in the following document: Yanagisawa et al., "Theory and Design of Filters", Sanpo Shuppan, Electronics Sensho, pp.192–pp.203, 1974.

Figure 4:
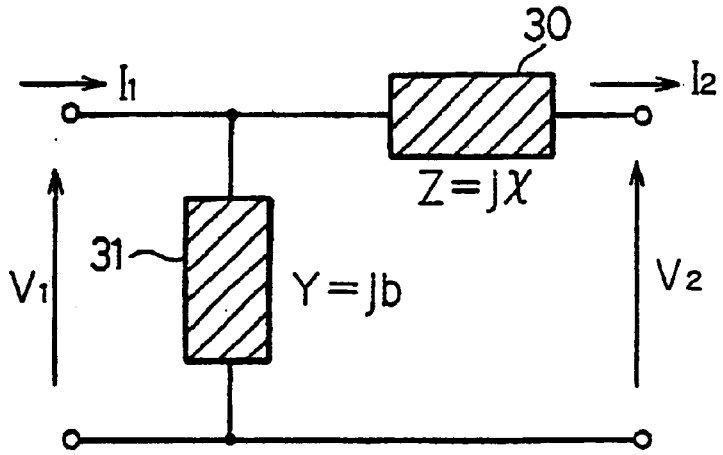
FIG. 4 is a block diagram of the basic structure of a filter circuit using a resonator.

First of all, a basic ladder-type circuit having a filter characteristic will be described with reference to FIG. 4. Two black boxes 30 and 31 shown in FIG. 4 are respectively SAW resonators. For the sake of simplicity, it will now be assumed that the SAW resonators 30 and 31 are respectively reactance circuits having no resistance, and that the impedance Z of the resonator 30 provided in the series arm is equal to jx, and the admittance Y of the resonator 31 provided in the parallel arm is equal to jb.

According to the image parameter method, an image transfer quantity γ (a complex number) defined in the following equation has the important meaning:

$$\exp(\gamma) = \sqrt{V_1 \cdot I_1 / V_2 \cdot I_2} \tag{1}$$

where $V_1$ and $I_1$ denote an input voltage and an input current, respectively, and $V_2$ and $I_2$ denote an output voltage and an output current, respectively. The equation (1) can be rewritten as follows:

$$\tanh(\gamma) = \tanh(\alpha + j\beta) \tag{2}$$

$$= \sqrt{(B \cdot C)/(A \cdot D)}$$

where A, B, C and D denote parameters of an F matrix showing the whole circuit shown in FIG. 4. When the value expressed by the equation (2) is an imaginary number, the two-terminal-pair circuit shown in FIG. 4 has a pass band characteristic. With the above value being a real number, the circuit shown in FIG. 4 has an attenuation characteristic. The ABCD parameters can be rewritten using the above-mentioned x and b:

$$A=1$$

$$B=jx$$

$$C=jb$$

$$D=1-bx \tag{3}$$

Hence, the following equation (4) can be obtained from the equation (2) using the above ABCD parameters:

$$\tanh(\gamma) = \sqrt{bx/(bx-1)} \tag{4}$$

When 0<bx<1, that is, when b and x have the same sign and are small values, the entire circuit shown in FIG. 4 has a pass band characteristic. When bx<0 or bx>1, that is, when the b and x have different signs or the product of bx is a large value, the circuit shown in FIG. 4 has an attenuation characteristic.

In order to qualitatively understand the frequency characteristics of b and x, the impedance and admittance of the SAW resonators will not be considered.

Figure 5A:
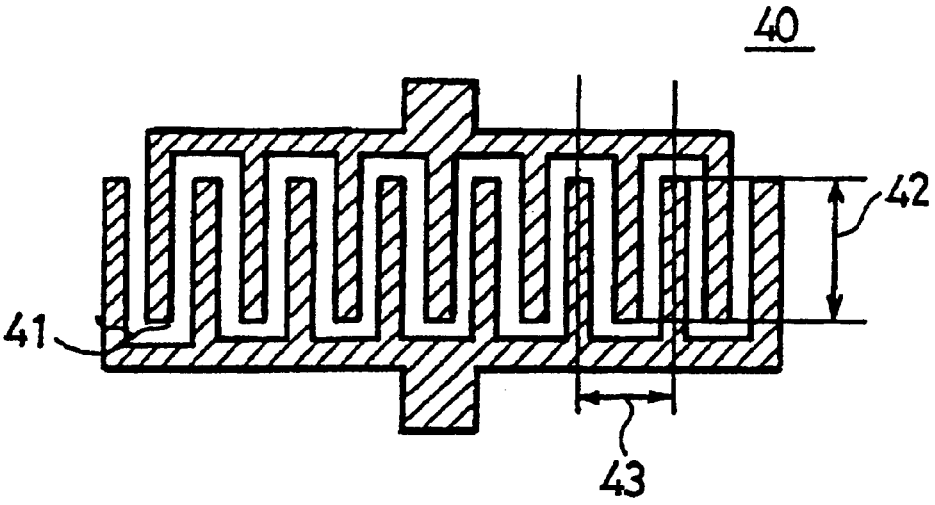
FIGS. 5A, 5B and 5C are diagrams showing a one-terminal-pair SAW resonator.

As shown in FIG. 5A, a SAW resonator having a pair of terminals comprises an interdigital electrode 40 (see "Nikkel Electronics", November 29, pp.76–pp.98, 1976). A reference number 41 indicates a pair of electrodes, 42 indicates an aperture length (crossing width), and 43 indicates an interdigital electrode period. When the resistance of the interdigital electrode 40 is neglected, the SAW resonator shown in FIG. 5A has an equivalent circuit 45 shown in FIG. 5B, in which $C_0$ denotes the electrostatic capacitance of the interdigital electrode 40, $C_1$ and $L_1$ denote equivalent constants. Hereinafter, the equivalent circuit 45 is depicted by symbol 46 shown in FIG. 5C.

Figure 5B:
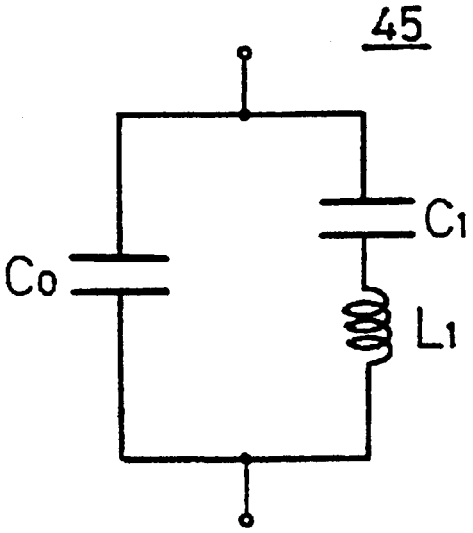
Figure 5C:
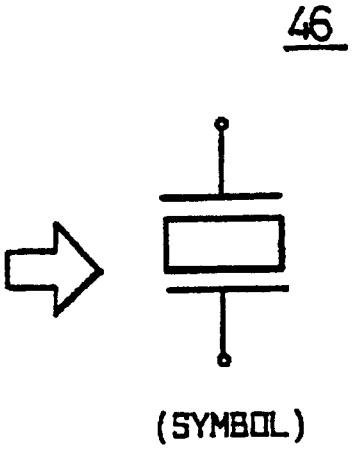
Figure 6A:
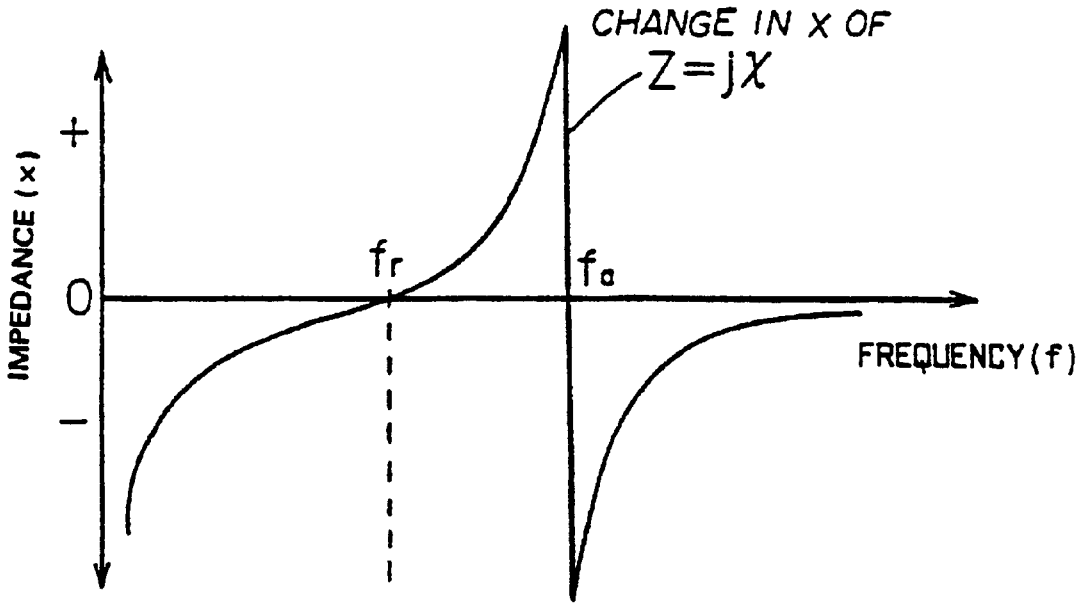
FIGS. 6A and 6B are diagrams showing frequency characteristics of impedance and admittance of the one-terminal-pair SAW resonator.
Figure 6B:
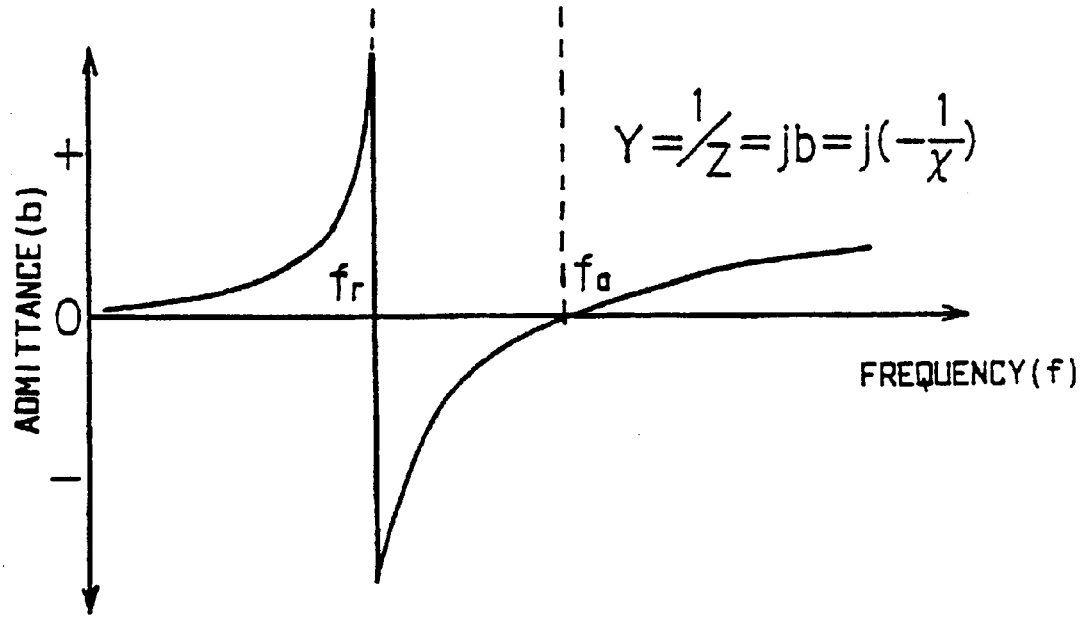

FIGS. 6A and 6B qualitatively show an impedance vs. frequency characteristic (A) of the equivalent circuit shown in FIG. 5B, and an admittance vs. frequency characteristic (B) thereof. The characteristics shown in FIGS. 6A and 6B are double resonance characteristics in which two resonance frequencies $f_r$ and $f_a$ exist. It will be noted that a resonator having a crystal has a double resonance characteristic. When the resonators respectively having a double resonance characteristic are arranged in the series and parallel arms, respectively, and an antiresonance frequency $f_{ap}$ of the parallel arm is made approximately equal to a resonance frequency $f_{rs}$ of the series arm, a circuit can be configured which has a band-pass-type filter characteristic having the center frequencies $f_{ap}$ and $f_{rs}$. This is because, as shown in an immittance vs. frequency characteristic shown in FIG. 7A, the relation 0<bx<1 is satisfied in a frequency range around the center frequency $f_{ap} \approx f_{rs}$ and that frequency range is a pass band, while the relation bx>1 is satisfied in a frequency range slightly away from the center frequency and the relation bx<0 is satisfied in a frequency range far away from the center frequency, the latter two frequency ranges serving as attenuation bands. Hence, the SAW filter shown in FIG. 4 has a qualitative filter characteristic 47 shown in FIG. 7B.

A description will now be given of the factors that determine the band width in the resonator-type SAW filters. As is seen from FIGS. 7A and 7B, the band width is mainly dependent on the difference between the resonance frequency $f_r$ and the antiresonance frequency $f_a$ of each of the two resonators. The band width increases as the above difference increases, while the band width decreases as the difference decreases. The resonance frequency $f_r$ and the antiresonance frequency $f_a$ can be determined using the following equations, using the equivalent circuit constants shown in FIG. 5B:

$$f_r = 1/\left[2 \cdot x\sqrt{(C_1 \times L_1)}\right] \quad (5)$$

$$f_a = f_r \cdot \sqrt{(1 + 1/\tau)} \quad (6)$$

$$\tau = C_0 / C_1 \quad (7)$$

where $\tau$ denotes the capacitance ratio. The ratio of the pass band to the center frequency ($\Delta f/f_o$) is mainly dependent on the difference between $f_r$ and $f_a$, and is therefore expressed in the following expression, using the equations (6) and (7):

$$\Delta f/f_o = 2(f_a - f_r)/(f_a + f_r) \approx 2/(4\tau + 1). \quad (8)$$

It can be seen from the equation (8) that the capacitance ratio $\tau$ is the main factor which determines the ratio of the pass band to the center frequency. However, as set forth in Japanese Laid-Open Patent Publication No. 52-19044, the capacitance ratio is much dependent on the type of substrate material used for the interdigital electrode. For example, an ST-cut crystal having a small electromechanical coupling coefficient has a capacitance ratio $\tau$ equal to or greater than 1300, while a 36° Y-cut X-propagation $LiTaO_3$ substrate having a large electromechanical coupling coefficient has a capacitance ratio $\tau$ of approximately 15. The ratio of the pass band to the center frequency is 0.04% for ST-cut crystal, and 3.3% for the 36° Y-cut X-propagation $LiTaO_3$ substrate. Hence, the band width is much dependent on the substrate material.

The band width decreases as the equivalent parallel capacitance $C_{OB}$ increases in order to improve the side lobe suppression factor according to Japanese Laid-Open Patent Publication No. 52-19044.

Figure 8A:
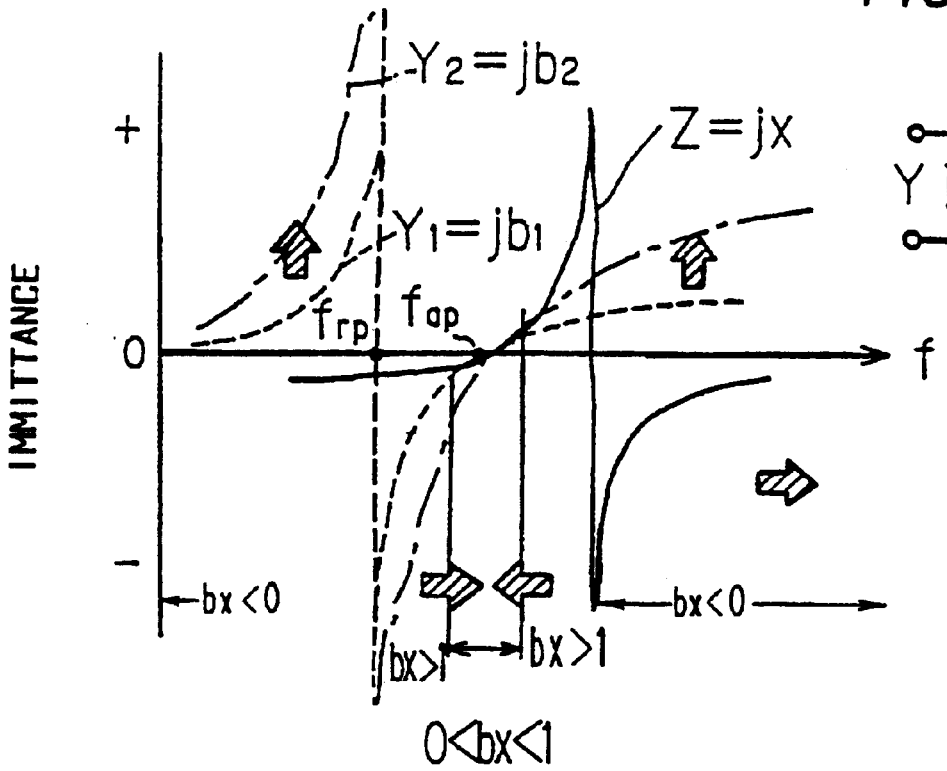
FIGS. 8A to 8C are diagrams showing the characteristics of the conventional SAW filter shown in FIG. 1.
Figure 8C:
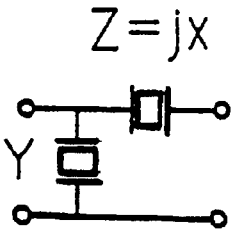
Figure 8B:
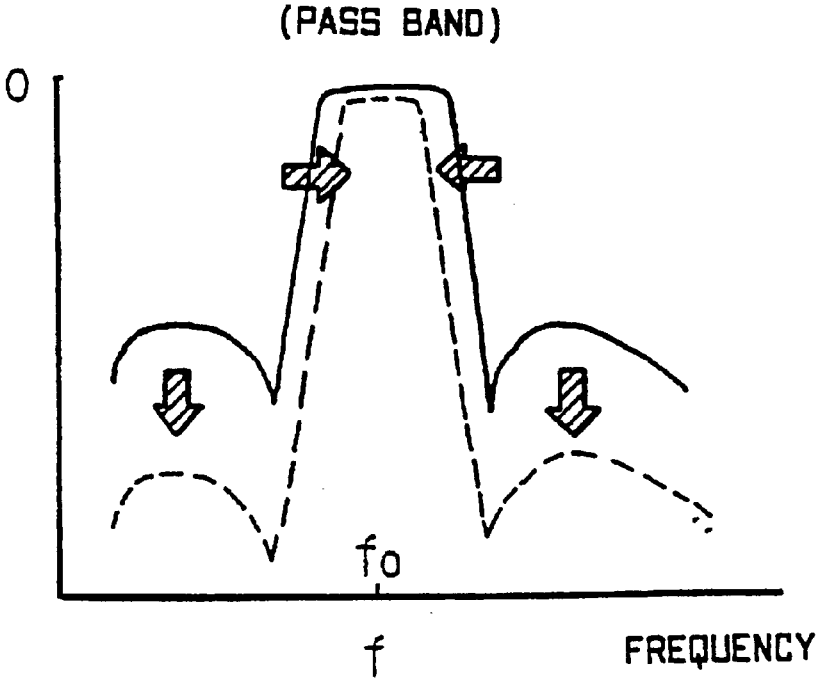

The above phenomenon will now be described with reference to FIGS. 8A, 8B and 8C. As is seen from the previous description of the principle of the present invention, as the admittance value increases while $f_r$ and $f_a$ of the parallel resonator (see, FIG. 8C) are kept constant, the product of bx has a negative sign and increases, as shown in FIG. 8A. However, the bx product increases around the center frequency, and hence the range of bx>1 increases. Hence, the pass band in which the relation 0<bx<1 stands is narrowed, and a sufficient pass band cannot be obtained. This phenomenon is indicated by arrows in FIG. 8B.

The following two conditions must be satisfied in order to eliminate the above disadvantages. The first condition is to increase the difference between the resonance frequency $f_r$ and the antiresonance frequency $f_a$ in at least one of the resonators provided in the series and parallel arms (see, FIG. 8C). The second condition is to increase either the impedance or admittance of the above-mentioned one of the resonators. As the impedance or admittance increases, the side lobe attenuation quantity increases. When the above two conditions are satisfied, the side lobe attenuation quantity can be improved while the pass band is improved or prevented from being narrowed.

Figure 9B:
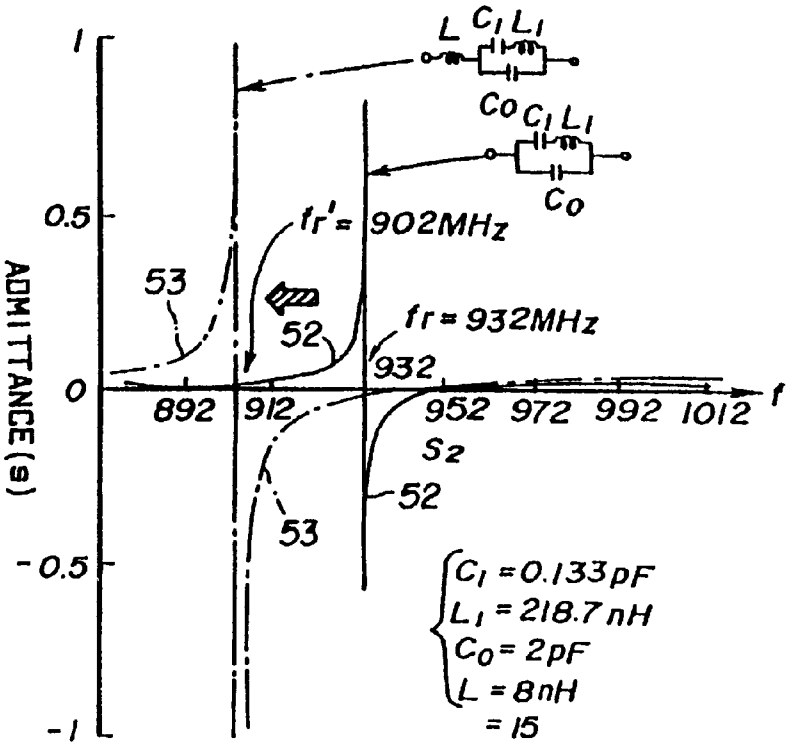
FIGS. 9A and 9B are diagrams showing effects obtained when an inductance is connected in series to a resonator.
Figure 9A:
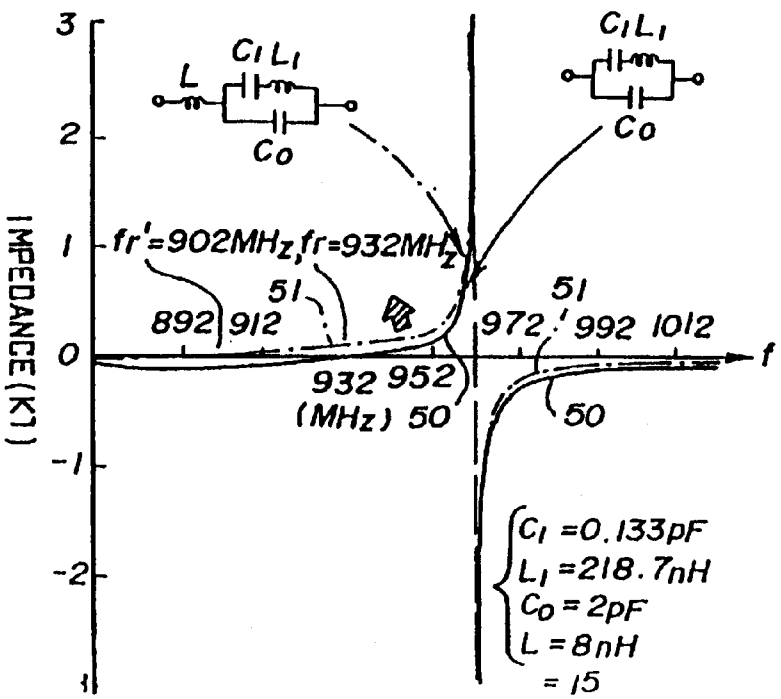

Regarding the first condition, it is effective to provide an inductor L connected in series to a SAW resonator having a pair of terminals in order to increase the difference between $f_r$ and $f_a$. FIGS. 9A and 9B respectively show an impedance vs. frequency characteristic of a SAW filter in which an inductor having an inductance of 8 nH is connected to a resonator, and an admittance vs. frequency characteristic thereof. The parameters of the equivalent circuits of the SAW resonators used for obtaining the characteristics are illustrated in FIGS. 9A and 9B.

FIG. 9A shows an impedance characteristic curve 50 obtained before the inductor L is connected to the resonator, and an impedance characteristic curve 51 obtained after the inductor is connected thereto. FIG. 9B shows an admittance characteristic curve 52 obtained before the inductor L is connected to the resonator, and an admittance characteristic curve 53 obtained after the inductor L is connected thereto.

It can be seen from FIG. 9A that the inductance L increases the distance between the resonance frequency $f_r$ and the antiresonance frequency $f_a$. In the graph of FIG. 9A, the distance is increased by approximately 30 MHz. This is because, as shown in FIG. 9A, the inductance L functions to shift the impedance characteristic curve of the original resonator upwards to the plus side by $\omega L$, and hence the resonance frequency $f_r$ changes to $f_r'$. In this case, the antiresonance frequency $f_a$ has little variation. The admittance, which is the reciprocal of the impedance, changes, as shown in FIG. 9B. In this case, the resonance frequency $f_r$ changes to $f_r'$.

Regarding the aforementioned second condition, the admittance value increases due to the inductance L, as shown in FIG. 9B. However, as shown in FIG. 9A, the impedance value decreases in frequencies outside of the pass band. Hence, if the inductance L is added to the resonator provided in the series arm, it is necessary to provide an additional means for increasing the impedance value. The above additional means is, for example, an arrangement in which a plurality of identical SAW resonators are connected in series to each other (cascaded).

Figure 10A:
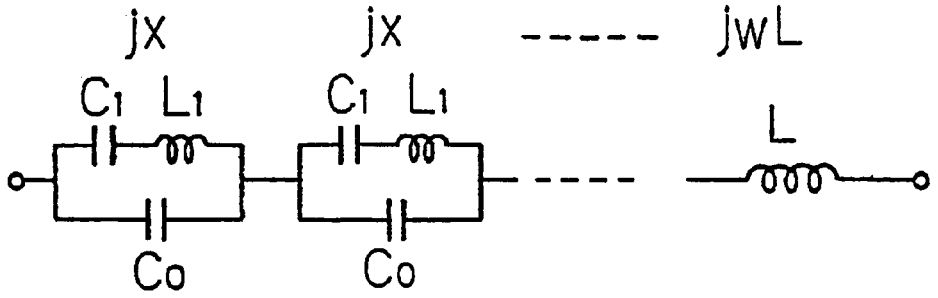
FIGS. 10A and 10B are diagrams showing effects obtained when n one-terminal-pair resonators are connected in series.
Figure 10B:
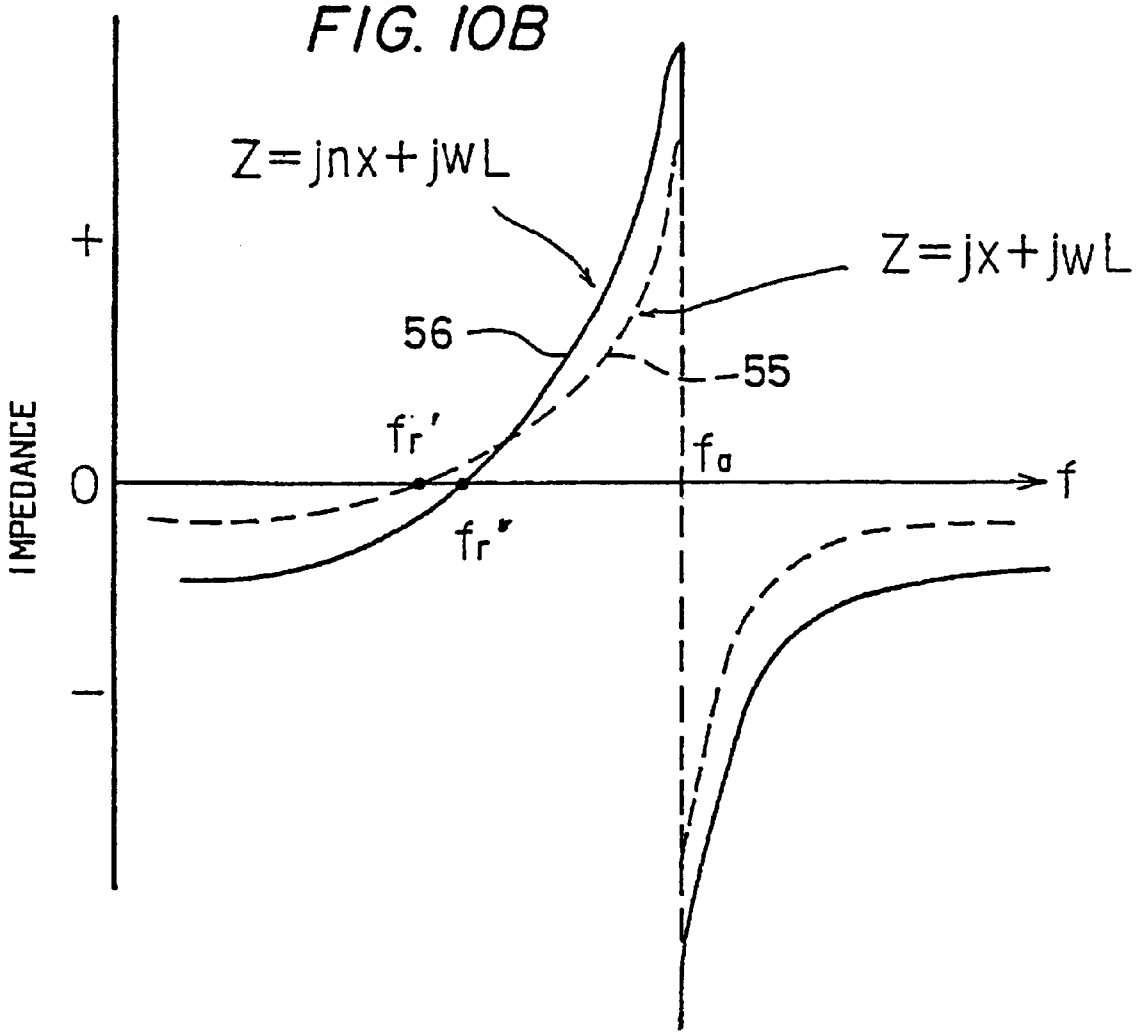

FIGS. 10A and 10B show an impedance characteristic curve 56 of a resonance arrangement in which n identical SAW resonators, each having a pair of terminals, are cascaded. As shown in FIGS. 10A and 10B, the impedance value of the resonance arrangement having the n cascaded resonators is n times that of the single resonator. The resonance frequency of the resonator with the inductor L connected thereto is $f_r''$. That is, the difference between $f_r''$ and $f_a$ of the resonance arrangement with the inductor L connected thereto is slightly smaller than the difference between $f_r'$ and $f_a$ of a single resonator with the inductor L connected thereto. However, the difference between $f_r''$ and $f_a$ of the resonance arrangement with the inductor L connected thereto is larger than that without the inductor L. It is possible to further increase the difference between the resonance frequency and the antiresonance frequency by using a larger inductance L.

In order to increase the band width, it is also possible to select the antiresonance frequency $f_{ap}$ of the parallel arm resonator and the resonance frequency $f_{rs}$ of the series arm resonator so that $f_{rs}>f_{ap}$. In this case, the condition bx<0 occurs around the center frequency, and hence the aforementioned pass band condition is not satisfied. Hence, there is a possibility that an insertion loss and a ripple may increase. However, by controlling $\Delta f = f_{rs} - f_{ap}$, it is possible to substantially suppress the increase in the insertion loss and the ripple and to expand the increase in the pass band.

A description will now be given of embodiments of the present invention. The embodiments which will be described are based on a simulation. Hence, this simulation will be described first, as well as the results of comparisons between the experimental results and the simulation in order to show the validity of the simulation.

The equivalent circuit shown in FIG. 5B easily simulates the characteristic of the SAW resonator having a pair of terminals, while that equivalent circuit is not suitable for simulating, with high accuracy, variations in the number of figure pairs, the aperture length and the electrode thickness, and the effects of a reflector. With the above in mind, the inventors have proposed an improved simulation which uses a Smith's equivalent circuit model and expands a transfer matrix to analyze the SAW resonators (see O. Ikata et al., "1990 ULTRASONIC SYMPOSIUM" Proceedings, vol. 1, pp.83–pp.86, 1990; the disclosure of which is hereby incorporated by reference).

Figure 11A:
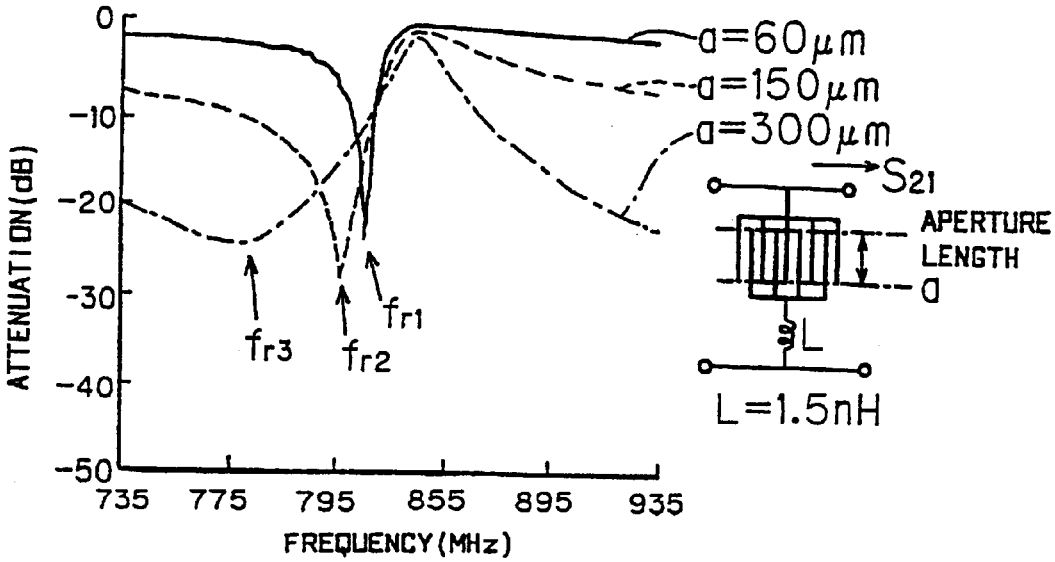
FIGS. 11A and 11B are diagrams showing an aperture length dependence on a parallel-arm resonator.
Figure 11B:
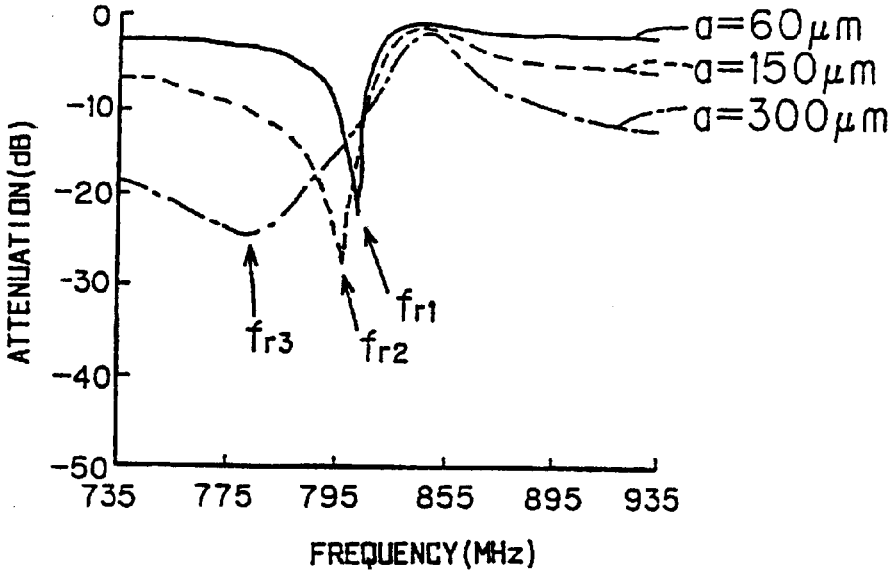

FIG. 11A is a graph showing the results of the simulation (calculation) for an arrangement in which a SAW resonator having a pair of terminals is disposed in the parallel arm. FIG. 11B is a graph showing the results of the experiment on an arrangement in which a one-terminal-pair SAW resonator including an interdigital electrode made of Al-2% Cu and having a film thickness of 1600Å is disposed in a parallel arm, and bonding wires (L=1.5 nH) having a length of 3 mm are connected to the interdigital electrode. It can be seen from FIGS. 11A and 11B that the calculation values match the experiment values with respect to variations in the resonance points ($f_{r1}$, $f_{r2}$, $f_{r3}$) as well as the attenuation quantities observed around the resonance points for different aperture lengths (a=60, 150, 300 $\mu$m).

FIG. 12A is a graph showing the results of the simulation for an arrangement in which a SAW resonator having a pair of terminals is disposed in the series arm (see, FIG. 12C). The bonding pads used in the experiment which will be described later were slightly large, and the simulation was carried out taking into account a stray capacitance 0.5 pF of the bonding pads. FIG. 12B is a graph showing the results of the experiment on an arrangement in which a SAW resonator having a pair of terminals is disposed in the series arm. It can be seen from FIGS. 12A, 12B and 12C that the antiresonance frequencies $f_{a1}$, $f_{a2}$ and $f_{a3}$ do not depend on the aperture length and that the simulation results match the experimental results regarding variations in the attenuation quantity around the resonance frequencies.

Hence, it will be apparent from the above that the results of a simulation of the filter with the combination of the resonators disposed in the parallel and series arms match the results of the experiment. The embodiments described below are based on the result of simulations.

Figure 13:
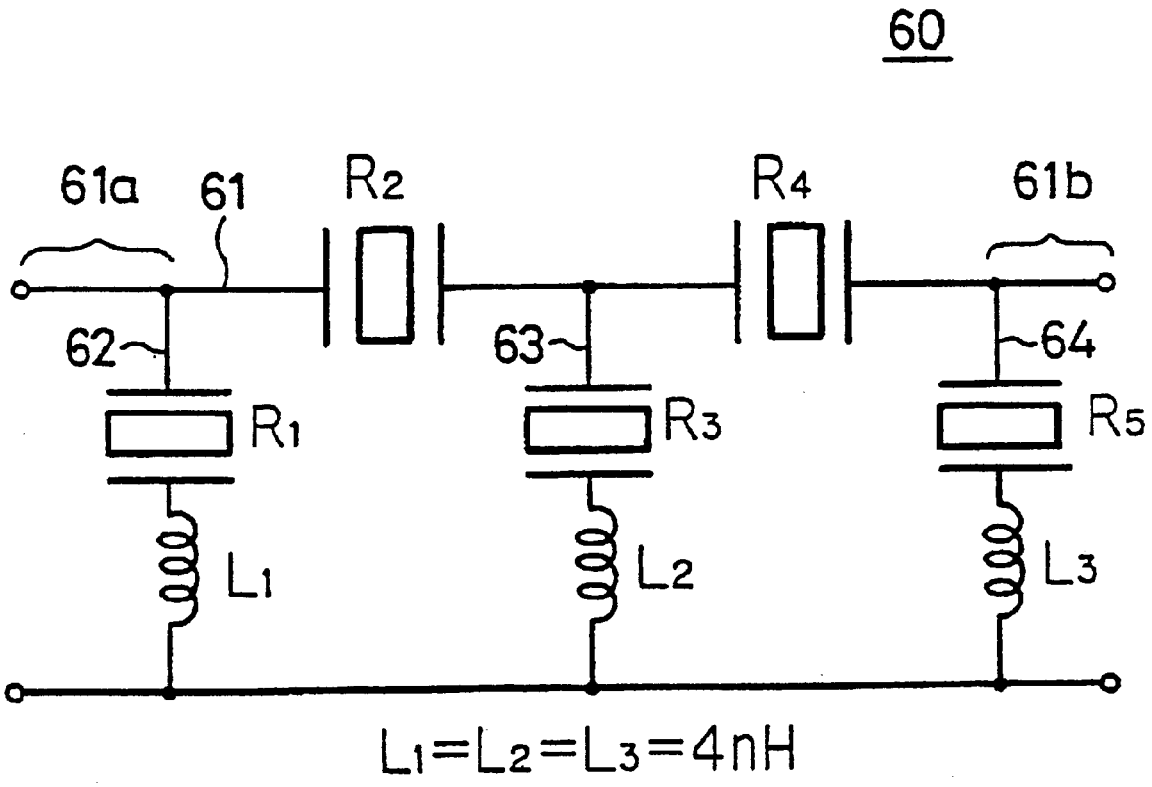
FIG. 13 is a circuit diagram of a SAW filter according to a first embodiment of the present invention.

FIG. 13 shows a SAW filter 60 according to a first embodiment of the present invention. In Japan, an automobile and portable telephone system has a specification in which the ±8.5 MHz range about a center frequency of 933.5 MHz is a transmission band for mobile telephones and the ±8.5 MHz range about a center frequency of 878.5 MHz separated from 933.5 MHz by −55 MHz is a [reception] *rejection* band. The SAW filter 60 according to the first embodiment of the present invention is designed to be suitable for transmission filters of mobile telephones.

As shown in FIG. 13, two one-terminal-pair SAW resonators R2 and R4 are arranged in a series arm 61, and three one-terminal-pair SAW resonators R1, R3 and R5 are respectively arranged in parallel arms 62, 63 and 64. Inductors L1, L2 and L3 are provided in the parallel arms 62, 63 and 64, and are connected in series to the resonators R1, R3 and R5, respectively. Each of the resonators R1–R5 has the interdigital electrode structure shown in FIG. 5A. The number of finger pairs is 100, and the aperture length is 80 $\mu$m. The electrodes are made of Al-2% Cu, and are 3000 Å thick. The resonance frequencies of the resonators R1, R3 and R5 respectively provided in the parallel arms 62, 63 and 64 are 912 MHz, and the antiresonance frequencies thereof are 934 MHz. The resonance frequencies of the resonators R2 and R4 respectively provided in the series arm 61 are 934 MHz, and the antiresonance frequencies thereof are 962 MHz. The inductors L1, L2 and L3 respectively have an inductance L of 4 nH.

Figure 14:
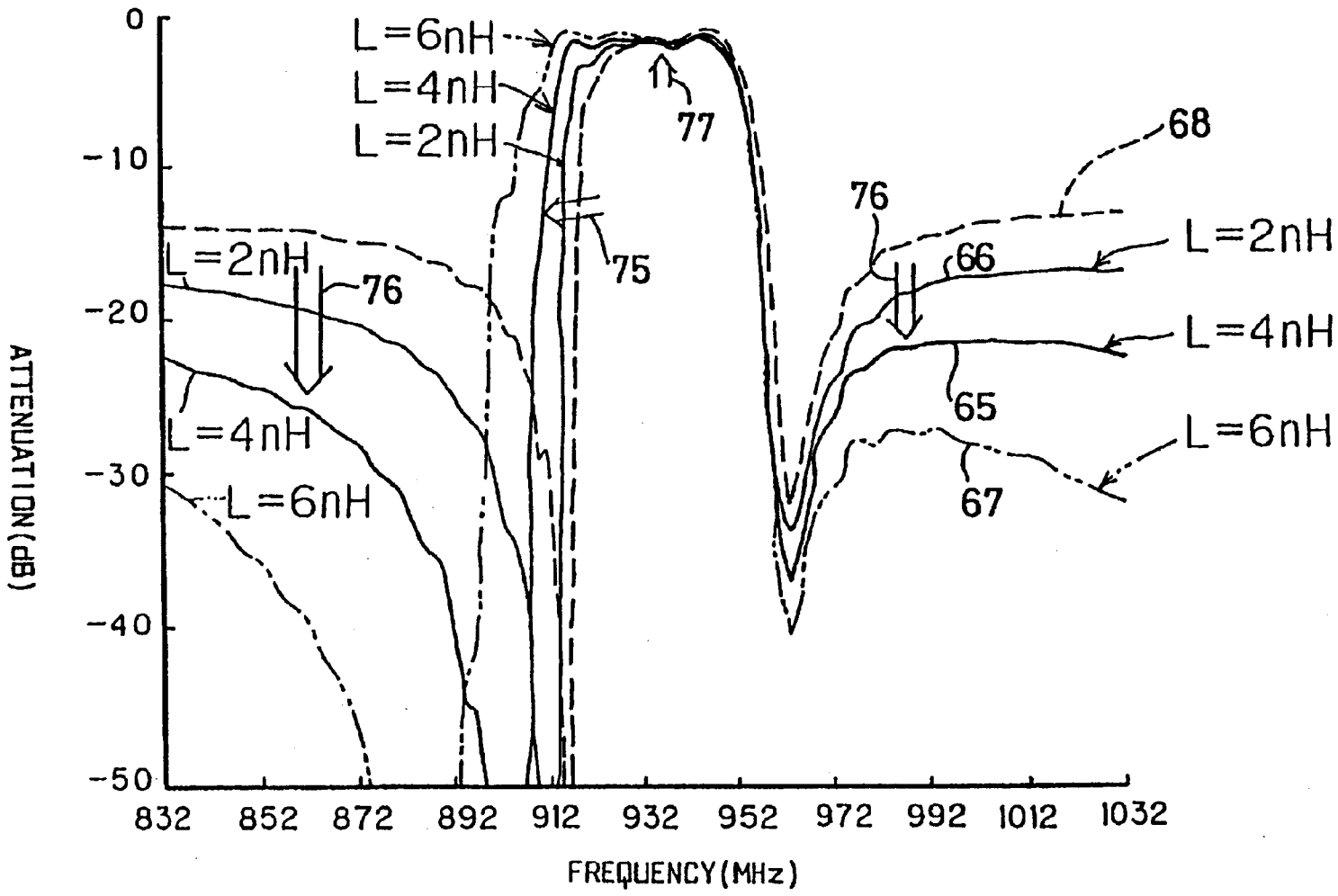
FIG. 14 is a diagram showing a band characteristic of the filter shown in FIG. 13.

The SAW filter 60 having the above structure has a band characteristic indicated by a curve 65 shown in FIG. 14. Characteristic curves 66 and 67 in FIG. 14 are respectively obtained when the inductance L is equal to 2 nH and 6 nH.

Figure 15A:
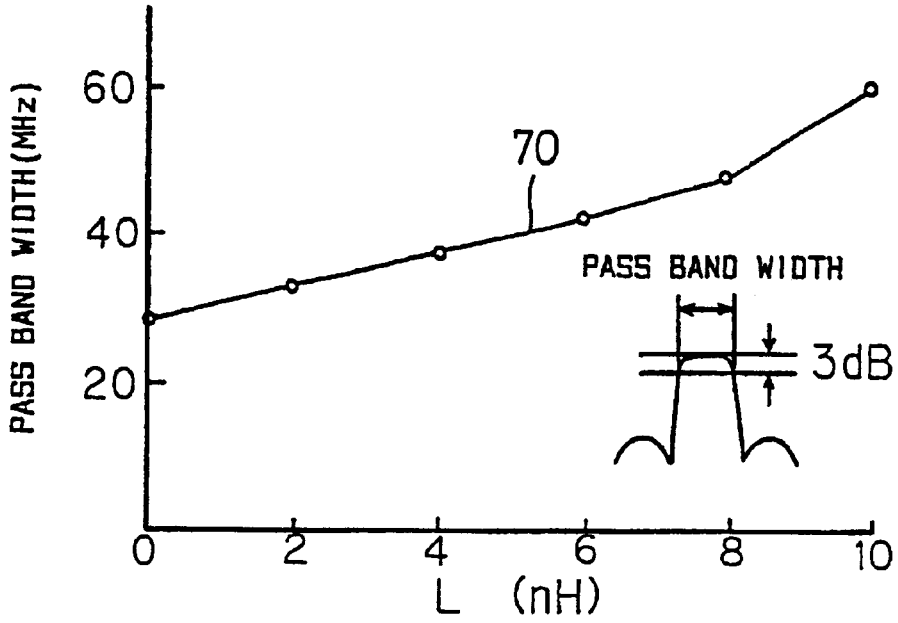
FIGS. 15A and 15B are diagrams showing effects obtained when an inductance is added to a parallel-arm resonator.

A curve 70 shown in FIG. 15A illustrates the inductance' dependence on the band width obtained on the basis of the graphs of FIG. 14. The band width is defined as the frequency width between the points on the curve where the insertion loss is 3 dB greater than the minimum value.

Figure 15B:
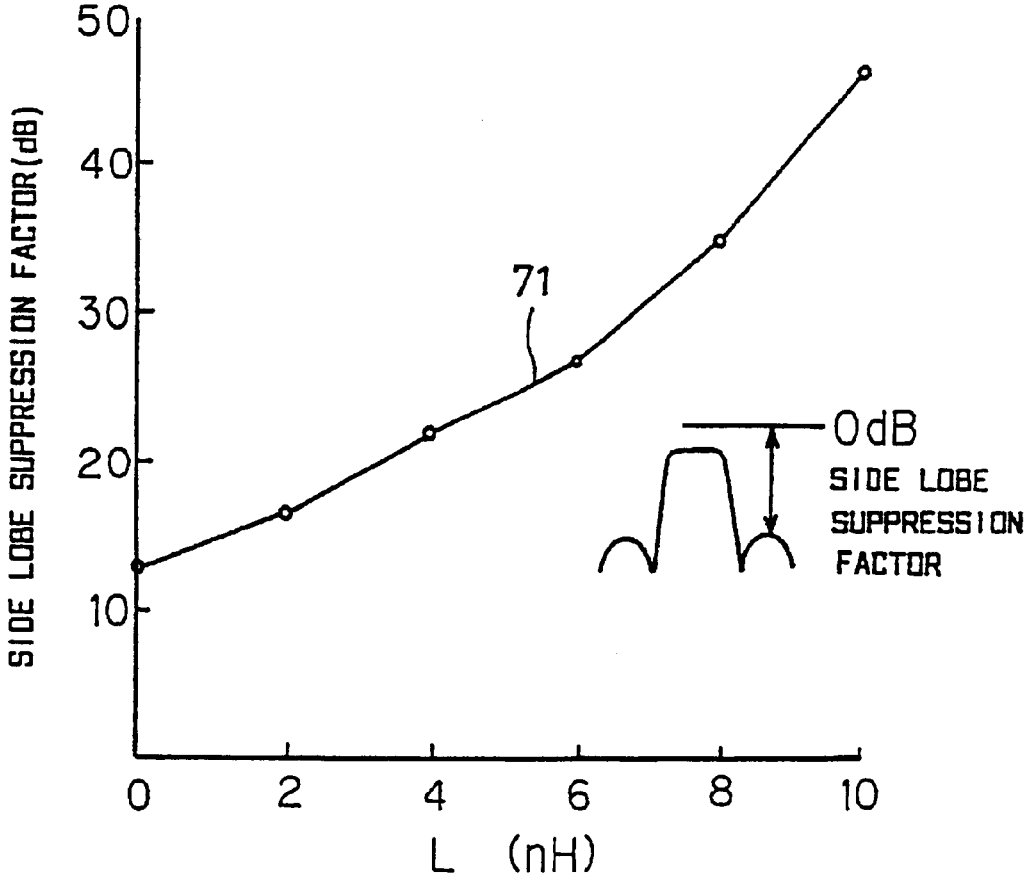

A curve 71 shown in FIG. 15B illustrates a side lobe suppression factor' dependence on the inductance obtained on the basis of the graphs of FIG. 14. It can be seen from FIG. 14 that a sufficient suppression factor is not obtained at a frequency which is 55 MHz lower than the center frequency when the inductance L is too large. With the above in mind, an inductance L of 4 nH is selected. The value of the inductance L is suitable selected in accordance with the specification of filters.

A curve 68 in FIG. 14 shows a band characteristic of a configuration in which L1=L2=L3=0 in FIG. 13. It can be seen from comparison between the band characteristic (curve 65) of the first embodiment and that (curve 68) of the conventional filter that the filter 60 according to the first embodiment has a large pass band width (arrow 75), a large side lobe suppression factor (arrows 76), and a low insertion loss (arrow 77).

Figure 16:
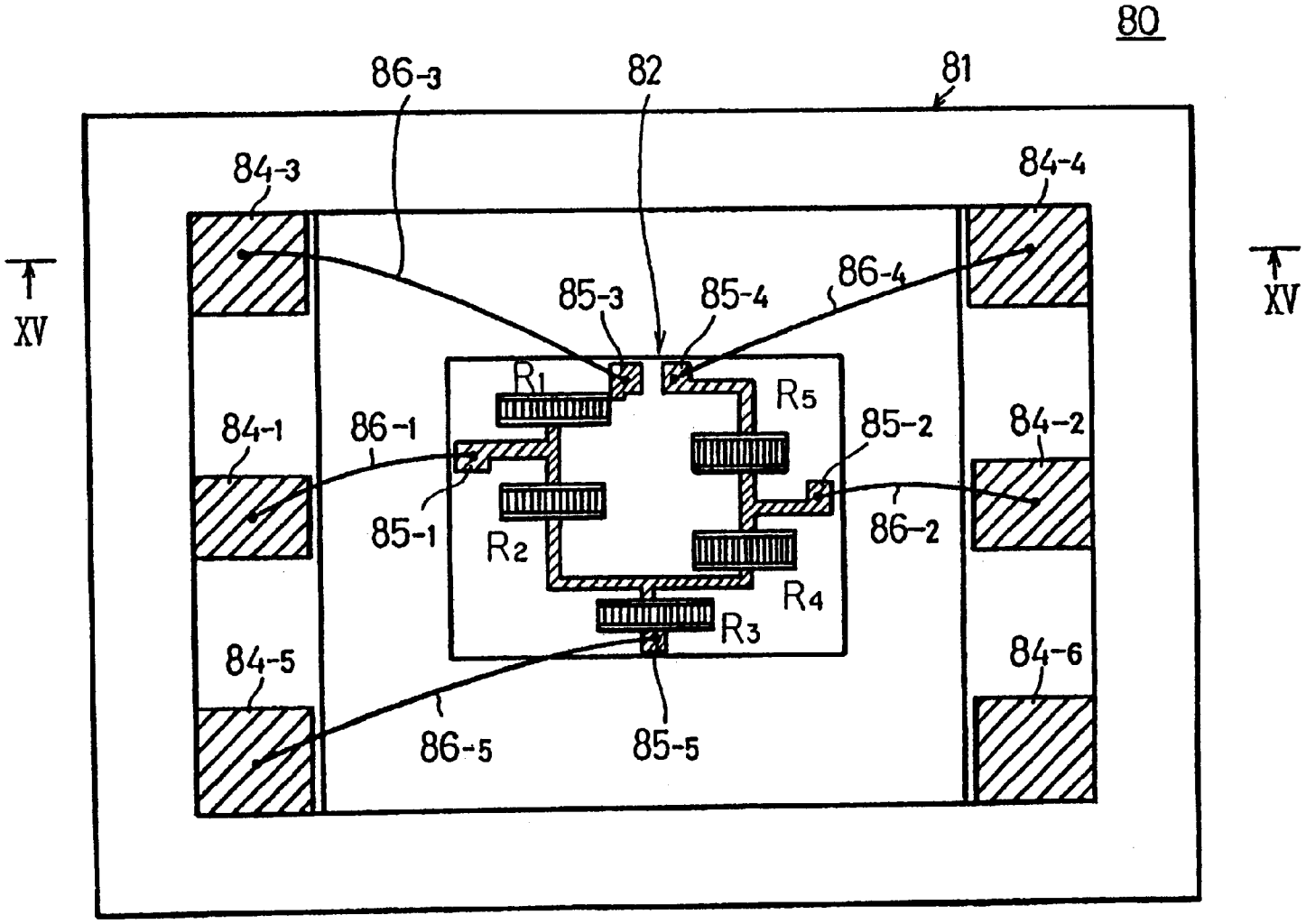
FIG. 16 is a plan view of the structure of the SAW filter shown in FIG. 13 with a lid removed therefrom.
Figure 17:
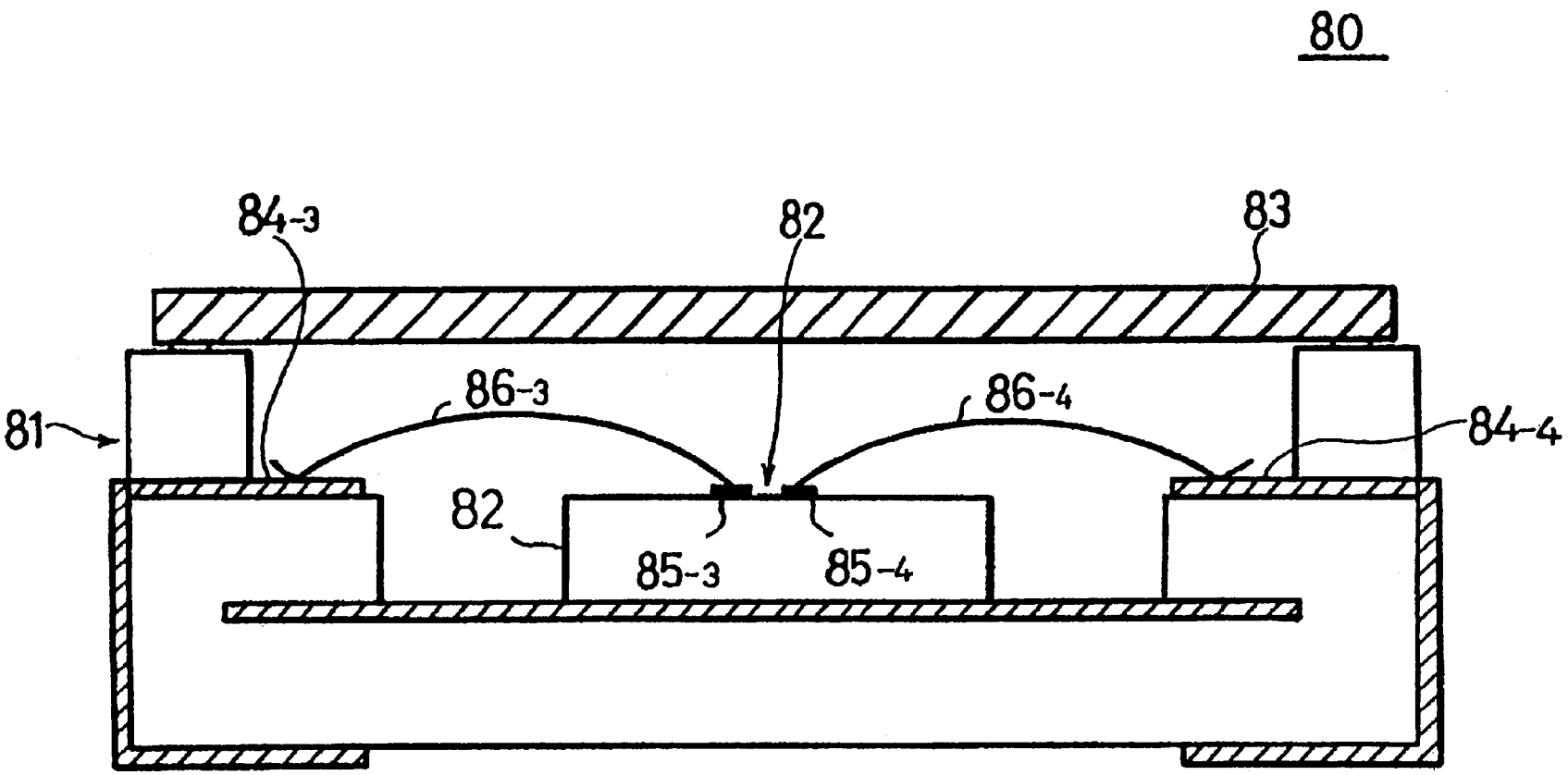
FIG. 17 is a cross-sectional view taken along a line XVII—XVII shown in FIG. 16.

FIGS. 16 and 17 show a SAW filter device 80 which functions as the SAW filter 60 shown in FIG. 13. The SAW filter device 80 comprises a ceramic package 81, a filter chip 82, and a lid 83 serving as the ground. The ceramic package 81 is made of alumina ceramics, and has dimensions of 5.5 mm (length)×4 mm (width)×1.5 mm (height). Electrode terminals $\mathbf{84}_{-1}$–$\mathbf{84}_{-6}$ made of Au are formed on the ceramic package 81. The filter chip 82 is made of $LiTaO_3$, and has dimensions of 2 mm (length)×1.55 mm (width)×0.5 mm (thickness).

Resonators R1–R5 are arranged on the filter chip 82 so that each of the resonators R1–R5 does not own propagation paths in common with other resonators. Each of the resonators R1–R5 has an interdigital electrode made of Al-2% Cu in which the number of finger pairs is 100, the aperture length is 80 $\mu$m, and the film thickness is 3000 Å.

Further, two signal line terminals $\mathbf{85}_{-1}$ and $\mathbf{85}_{-2}$ for bonding and three ground terminals $\mathbf{85}_{-3}$, $\mathbf{85}_{-4}$ and $\mathbf{85}_{-5}$ for bonding are formed on the surface of the filter chip 82. Reference numbers $\mathbf{86}_{-1}$–$\mathbf{86}_{-5}$ indicate bonding wires made of Al or Au. The bonding wires $\mathbf{86}_{-1}$–$\mathbf{86}_{-5}$, each having a diameter of 25 $\mu$mø, connects the terminals $\mathbf{84}_{-1}$–$\mathbf{84}_{-5}$ and the terminals $\mathbf{85}_{-1}$–$\mathbf{85}_{-5}$. The bonding wires $\mathbf{85}_{-1}$ and $\mathbf{86}_{-2}$ respectively form parts of the series arms 61a and 61b. The wire $\mathbf{86}_{-3}$ is connected between the ground electrode terminals $\mathbf{84}_{-3}$ and $\mathbf{85}_{-3}$, and the wire $\mathbf{86}_{-4}$ is connected between the ground electrode terminal $\mathbf{84}_{-4}$ and $\mathbf{85}_{-4}$. The wire $\mathbf{86}_{-5}$ is connected between the ground electrode terminals $\mathbf{84}_{-5}$ and $\mathbf{85}_{-5}$. The wires $\mathbf{86}_{-3}$–$\mathbf{86}_{-5}$ are long and, for example, 2.0 mm long.

According to the theory of high frequencies, a fine, long wire has an inductance component. According to the theoretical equation of a ribbon inductor located in a space (see Kuraishi, "Exercise Microwave Circuit", Tokyo Denki Daigaku Shuppan-Kyoku, pp. 199), the inductances of the wires $\mathbf{86}_{-3}$, $\mathbf{86}_{-4}$ and $\mathbf{86}_{-5}$ are approximately equal to 1 nH. [It] *If the high attenuation and wide pass band are needed, it* is insufficient to obtain an inductance of 4 nH by means of only the wires. As will be described later, inductors are formed on the ceramic package 81 and the filter chip 82. In this manner, the inductors L1, L2 and L3 are formed.

Figure 18:
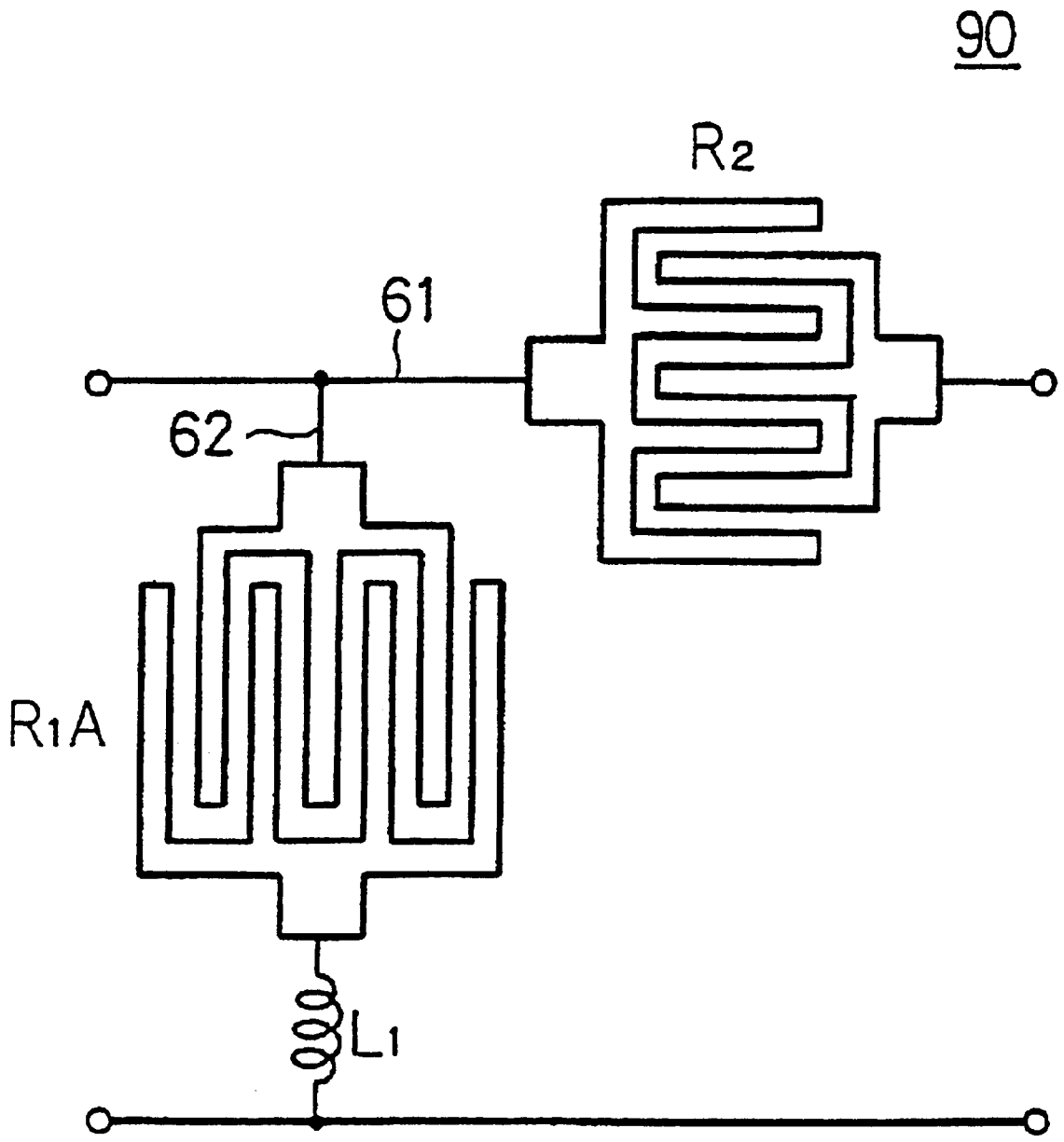
FIG. 18 is a diagram of a SAW filter according to a second embodiment of the present invention.

A description will now be given of a SAW filter according to a second embodiment of the present invention. FIG. 18 shows a SAW filter 90 according to the second embodiment of the present invention. In FIG. 18, parts that are the same as parts shown in the previously described figures are given the same reference numbers. The resonator R2 in the series arm 61 has an aperture length As of 80 $\mu$m. A resonator R1A and the inductor L1 connected in series to each other are provided in the parallel arm 62. The resonator R1A has an aperture length Ap of 120 $\mu$m. The aperture length Ap is larger than the aperture length As, being 1.5 times the aperture length As. The numbers Np and Ns of finger pairs of the resonators R2 and R1A are 100.

Figure 19:
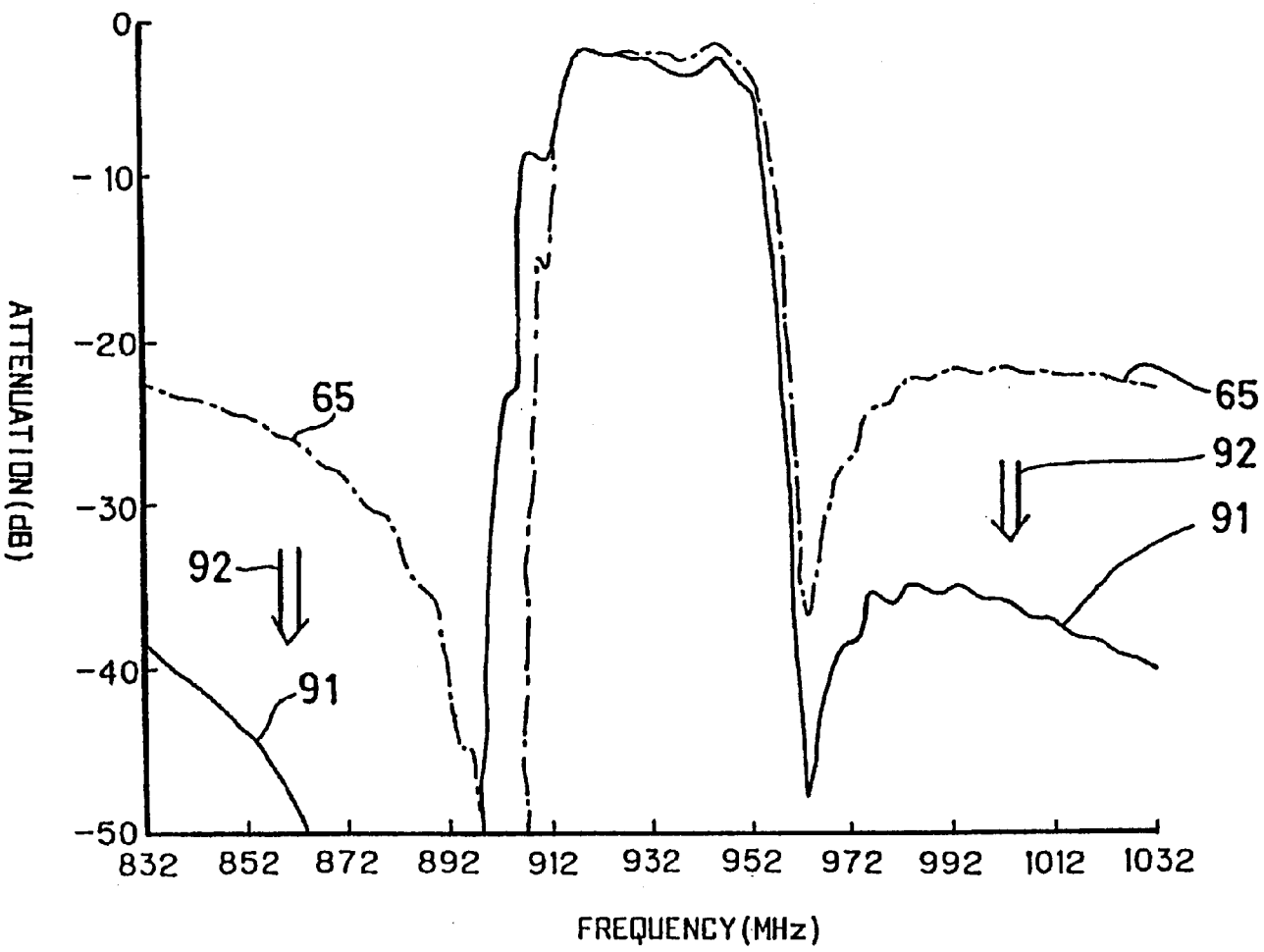
FIG. 19 is a diagram showing a band characteristic of the filter shown in FIG. 18.

The filter 90 shown in FIG. 19 has a band characteristic indicated by a curve 91 shown in FIG. 19. It can be seen from comparison between the curve 91 and the characteristic curve 65 of the filter 60 that the filter 90 has an improved side lobe suppression factor without a change in the pass band width.

Figure 20A:
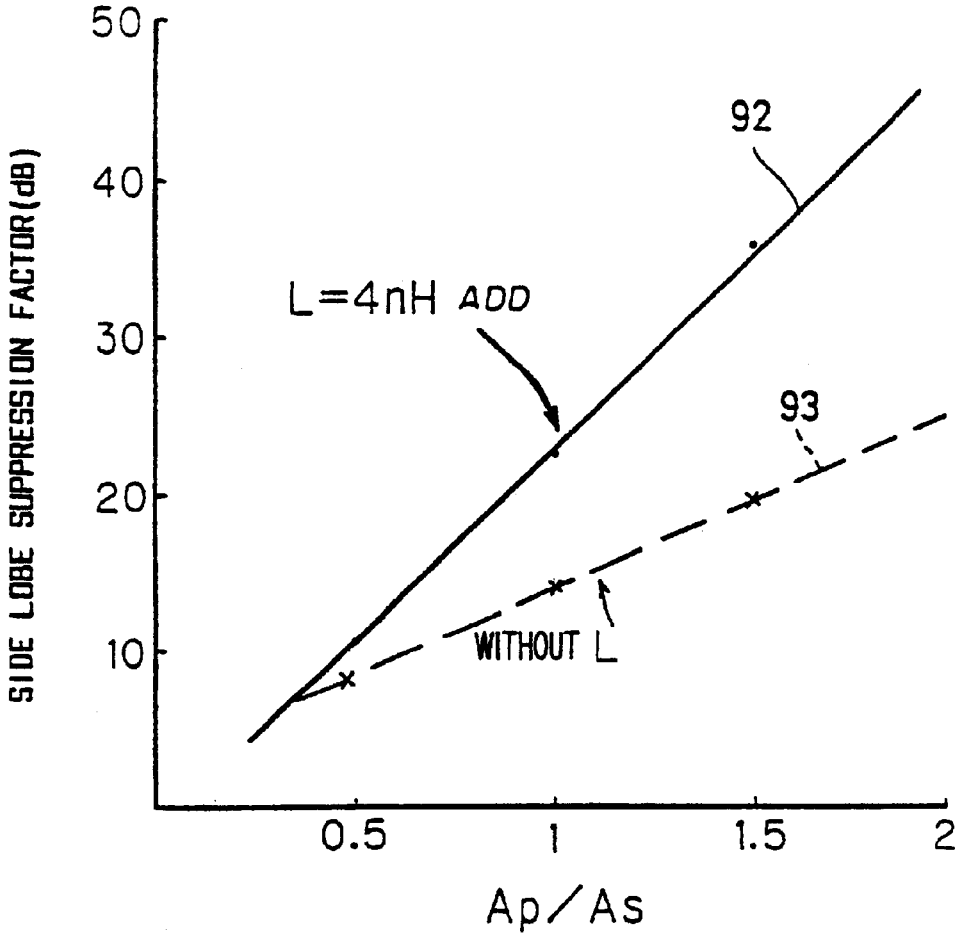
FIGS. 20A and 20B are diagrams showing effects based on the ratio of the aperture length of the parallel-arm resonator to the aperture length of the series-arm resonator.
Figure 20B:
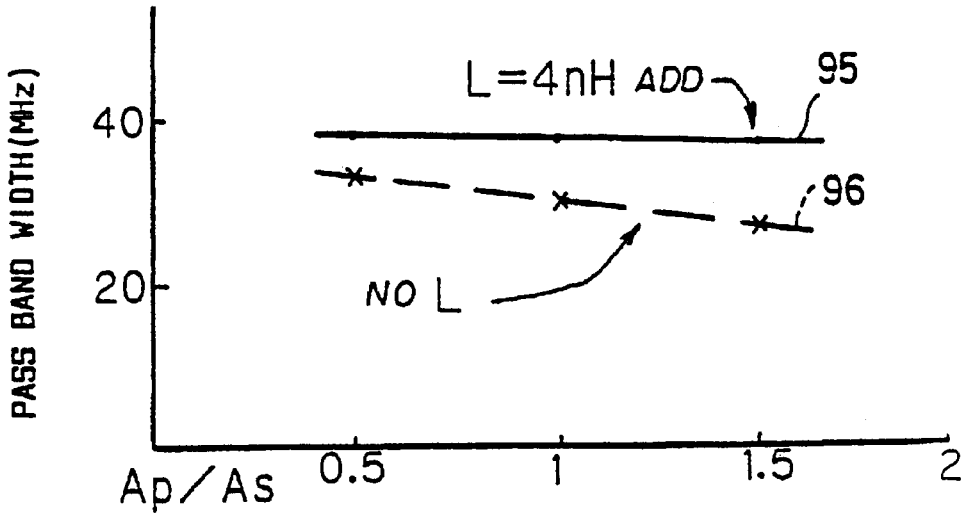

FIGS. 20A and 20B show a band characteristic' dependence on the aperture length in the filter shown in FIG. 18. More particularly, FIG. 20A shows a curve 92 indicating the dependence on the aperture length with an inductance L of 4 nH connected to the resonator, and a curve 93 indicating the dependence on the aperture length without any inductance. The horizontal axis of FIG. 20A denotes the ratio Ap/As, and the vertical axis thereof denotes the side lobe suppression factor (dB). FIG. 20B shows a pass band width s, the ratio Ap/As characteristic. A curve 95 indicates the dependence on inductance with an inductance L of 4 nH connected to the resonator, and a curve 96 indicates the dependence on inductance without any inductance.

The following can be seen from FIGS. 20A and 20B. First, the side lobe suppression factor increases when making the aperture length Ap of the resonator R1A in the parallel arm 62 larger than the aperture length As of the resonator R2 in the series arm 61. Second, the effect of the aperture length Ap of the resonator R1A is increased without deterioration of the pass band width by providing the inductor L1 in the parallel arm 62. It can be seen from the above that the filter 90 has an improved side lobe suppression factor while the pass band width is not narrowed, as compared to the filter 60.

A description will now be given of a third embodiment of the present invention with reference to FIG. 21, in which parts that are the same as parts shown in the previously described figures are given the same reference numbers. A SAW filter 100 shown in FIG. 21 comprises a resonator R1B provided in the parallel arm 62, and the resonator R2 provided in the series arm 61. The number Ns of finger pairs of the resonator R2 is 100. The inductor L1 is connected in series to the resonator R1B. The number Np of finger pairs of the resonator R1B, and is 1.5 times the number Ns of finger pairs. The aperture lengths As and Ap of the resonators R2 and R1A are 80 $\mu$m.

Figure 21:
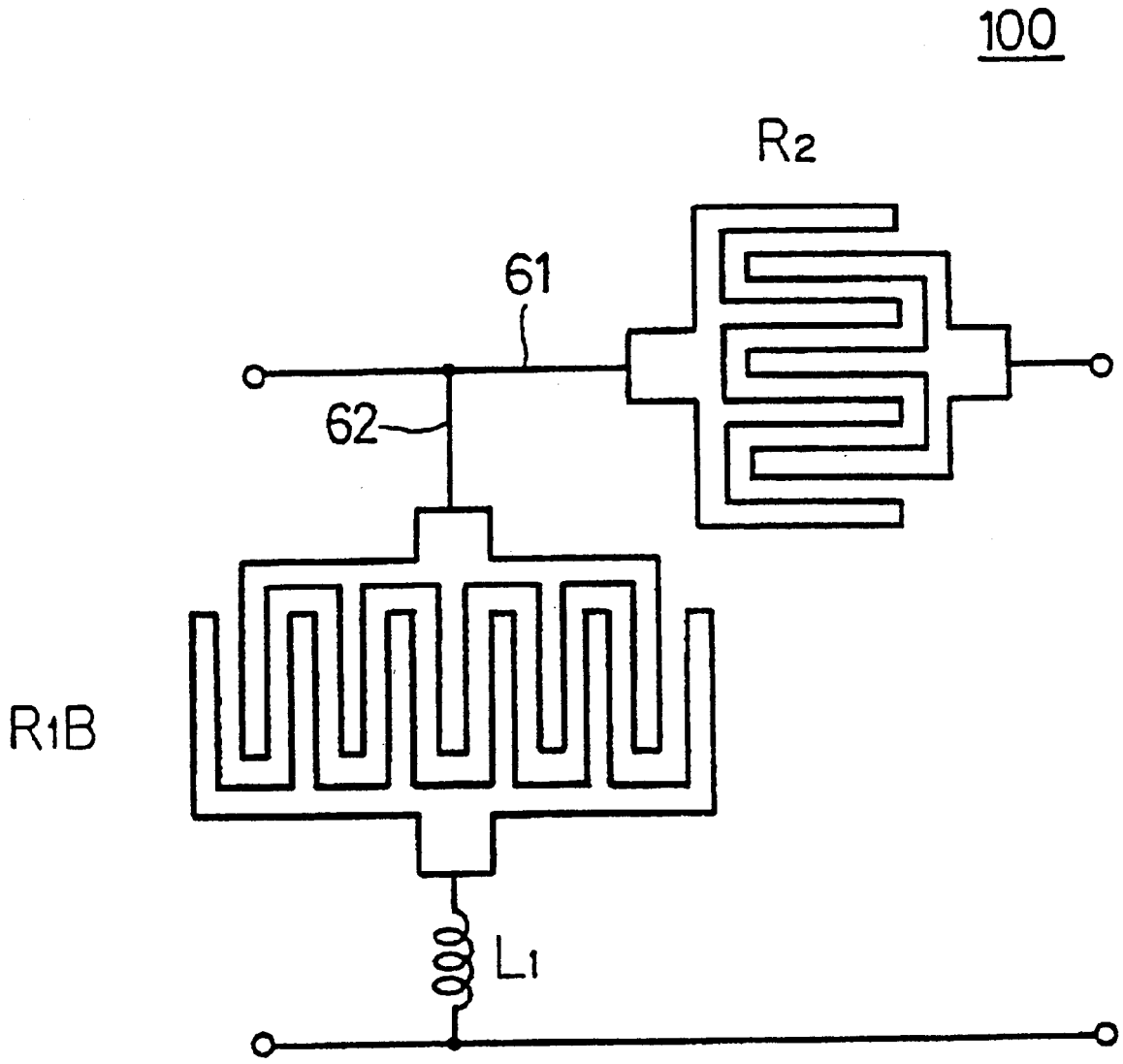
FIG. 21 is a diagram of a SAW filter according to a third embodiment of the present invention.
Figure 22:
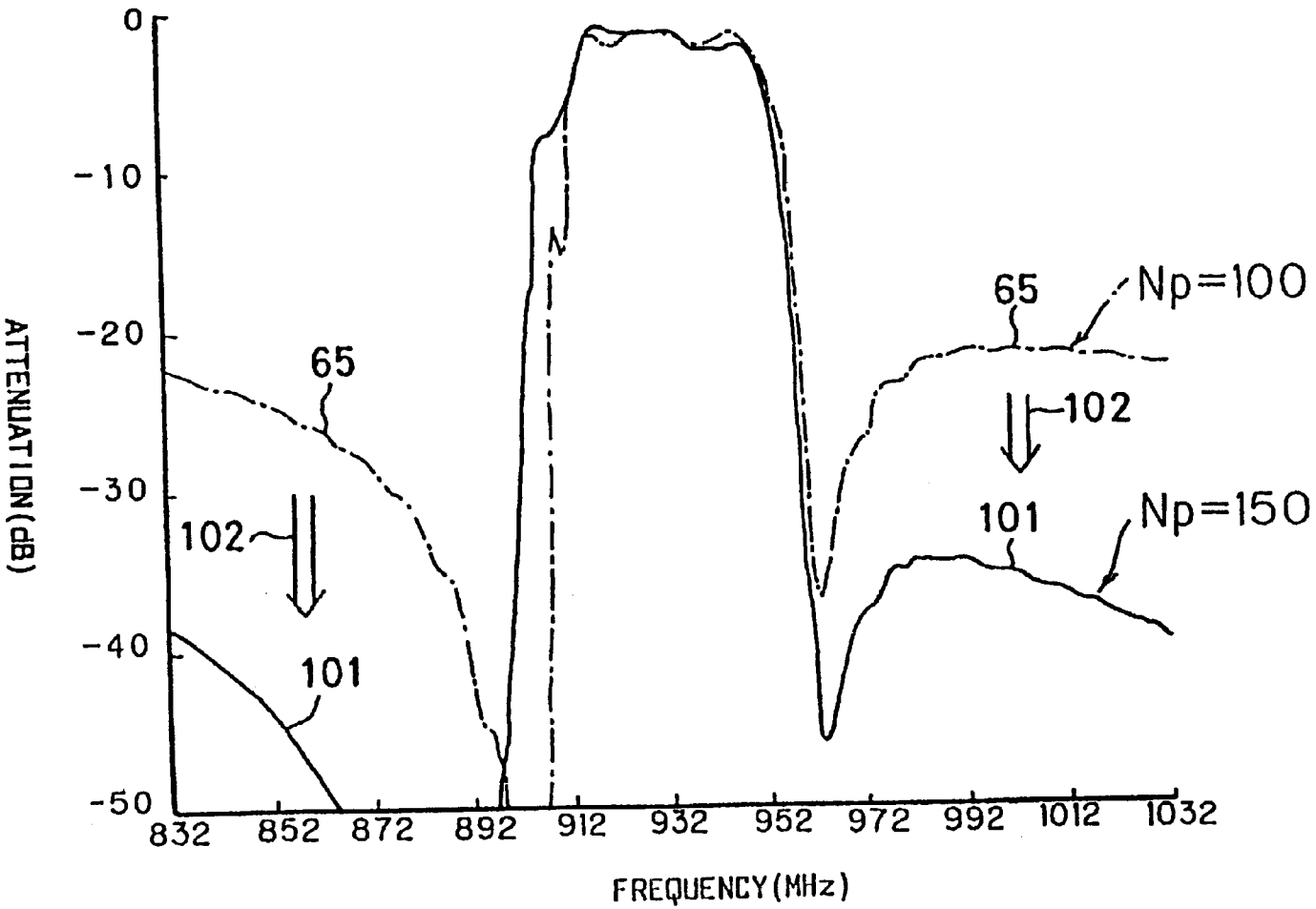
FIG. 22 is a diagram showing a band characteristic of the filter shown in FIG. 21.

The filter 100 shown in FIG. 21 has a band characteristic indicated by a curve 101 shown in FIG. 22. It can be seen from comparison between the band characteristic curve 65 of the filter 60 and the characteristic curve 101 of the filter 100 that the filter 100 has an improved side lobe suppression factor indicated by arrows 102 without reducing the pass band width. It can also be seen from comparison between the band characteristic curve 91 of the filter 90 and the characteristic curve 101 that the insertion loss of the filter 100 is less than that of the filter 90. Hence, the filter 100 has an improved side lobe suppression factor while the pass band width is reduced, and has an insertion loss smaller than that of the filter 90.

A description will now be given of a fourth embodiment of the present invention with reference to FIG. 23, in which parts that are the same as parts shown in the previously described figures are given in the same reference numbers. A filter 110 according to the fourth embodiment is intended to increase the difference between the resonance frequency $f_r$ and the antiresonance frequency $f_a$ of the resonator in the series arm and to thereby improve the band characteristic. Two identical resonators R2 are provided in the series arm 61, and two identical resonators R4 are provided therein. An inductor Ls having an inductance of 3 nH is connected in series to the resonators R2, and another inductor Ls having an inductance of 3 nH is connected in series to the resonators R4. The resonators R1, R3 and R5 are respectively provided in the parallel arms 62, 63 and 64. The filter 110 has a band characteristic indicated by a curve 111 shown in FIG. 24.

A description will now be given of the effects provided by adding one inductor Ls and two resonators R2 and R4. When one inductor Ls and two resonators R2 and R4 are omitted from the filter 110, the remaining circuit configuration consists of five resonators R1, R2, R3, R4 and R5. The band characteristic of the remaining circuit configuration is indicated by a curve 68 (see FIG. 14). By adding one inductor Ls, the pass band width is increased, as indicated by arrows 112 and the side lobe suppression factor is also increased, as indicated by arrows 113. Particularly, the pass band width is large at frequencies higher than the center frequency, and is increased by approximately 15 MHz. The band characteristic with the inductor Ls added to the conventional filter 1 is indicated by curve 114. In this case, a sufficient side lobe suppression factor is not obtained. Hence, two resonators R2 and R4 are further added to the conventional filter 1 with the inductor Ls added thereto. As indicated by arrows 115, the side lobe suppression factor is improved by approximately 5 dB without reducing the band characteristic, and a band characteristic curve 111 can be obtained. It can be seen from comparison between the curves 111 and 68 that the insertion loss is also improved, as indicated by arrows 116. It is possible to use more than two resonators R2 and more than two resonators R4. Further, as indicated by the two-dot chained line in FIG. 23, inductors can be provided in the parallel arms 62–64.

Figure 25:
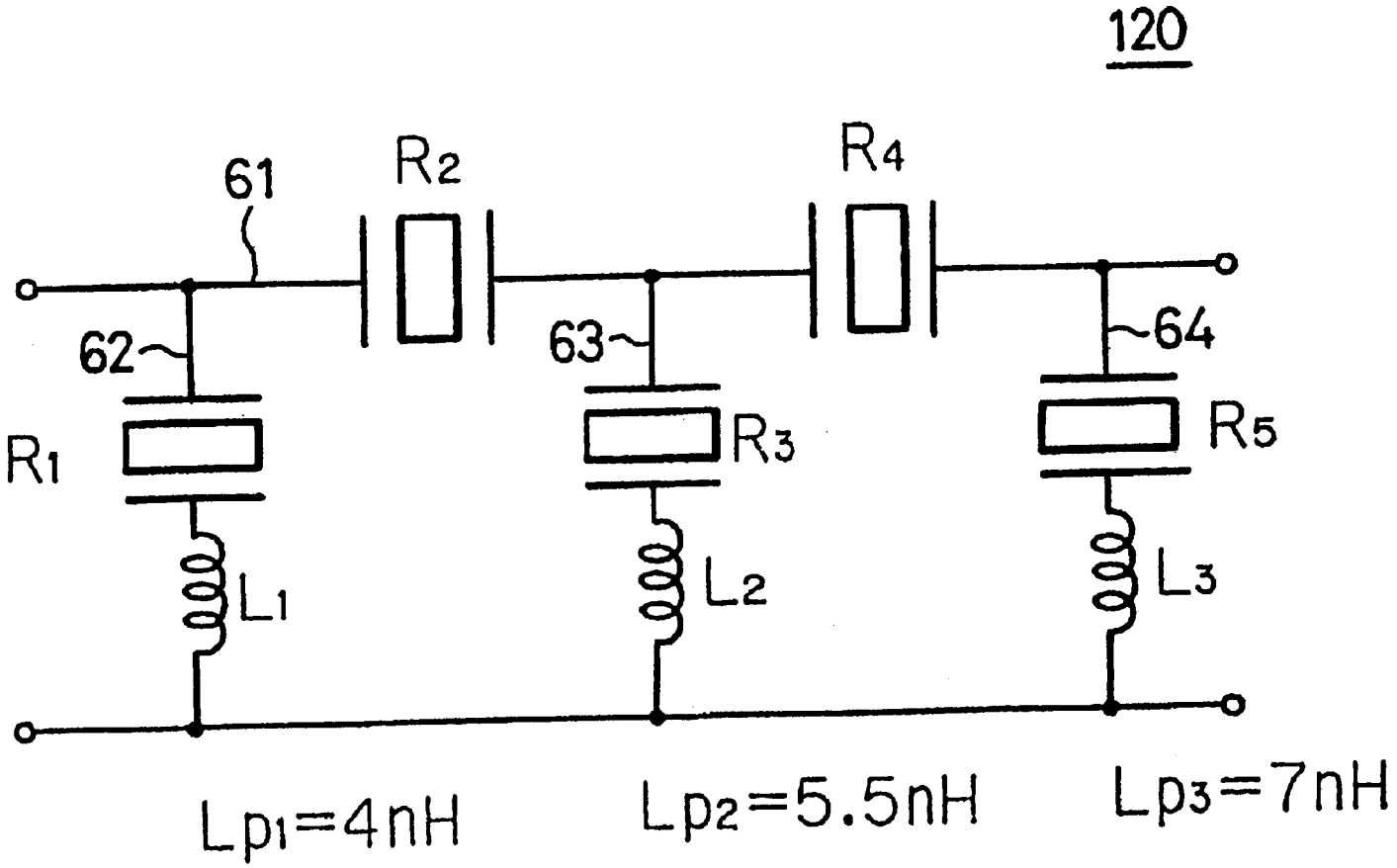
FIG. 25 is a circuit diagram of a SAW filter according to a fifth embodiment of the present invention.

A description will now be given of a fifth embodiment of the present invention with reference to FIG. 25, in which parts that are the same as parts shown in the previously described figures are given the same reference numbers. A SAW filter 120 shown in FIG. 25 comprises five resonators R1–R5, and three inductors L1–L3. The inductor L1 in the parallel arm 62 has an inductance Lp1 of 4 nH, and the inductor L2 in the parallel arm 63 has an inductance Lp2 of 5.5 nH. Further, the inductor L3 in the parallel arm 64 has an inductance Lp3 of 7 nH.

Figure 26:
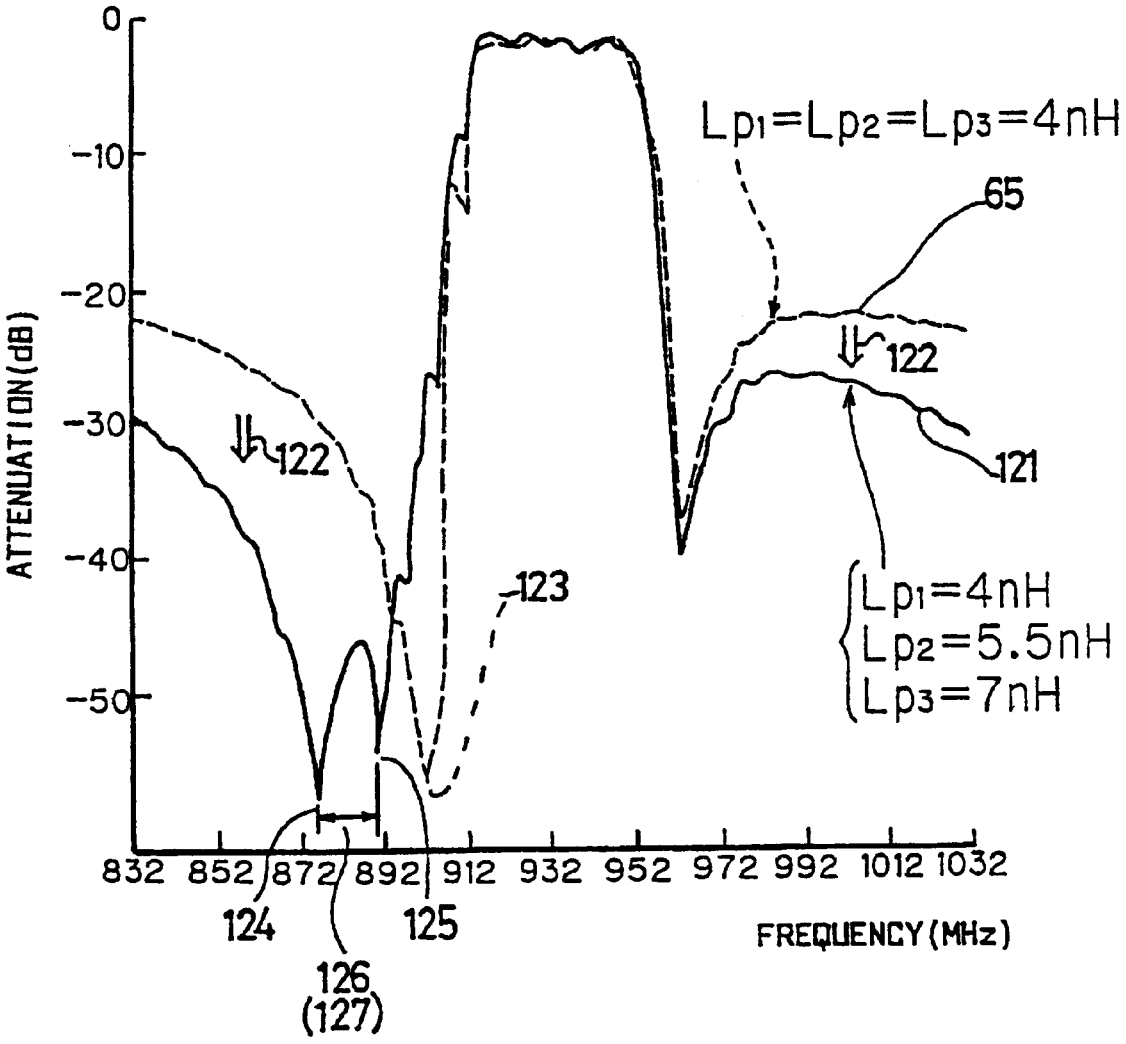
FIG. 26 is a diagram showing a band characteristic of the filter shown in FIG. 25.

By making the inductors L1, L2 and L3 have different inductance values, the filter 120 has a band characteristic indicated by a curve 121 shown in FIG. 26. Let us compare the characteristic curve 121 with the characteristic curve 65 (FIG. 15) of the filter 60 shown in FIG. 13 in which all the inductance values are the same as each other. It can be seen from the above that the filter 120 has an improved side lobe characteristic without reducing the pass band width, as compared to the filter 60. The characteristic curve 65 has an attenuation pole 123 located around a frequency of 902 MHz, while the characteristic curve 121 has two attenuation poles 124 and 125 respectively located around 875 MHz and 892 MHz. A frequency band 126 between the poles 124 and 125 functions as a blocking range 127.

A description will now be given of a sixth embodiment of the present invention with reference to FIG. 27, in which parts that are the same as parts shown in the previously described figures are given the same reference numbers. A SAW filter 130 shown in FIG. 27 comprises two SAW resonators R2 and R4 provided in the series arm 61, and three SAW resonators R1B, R3B and R5B respectively provided in the parallel arms 62, 63 and 64.

Figure 28:
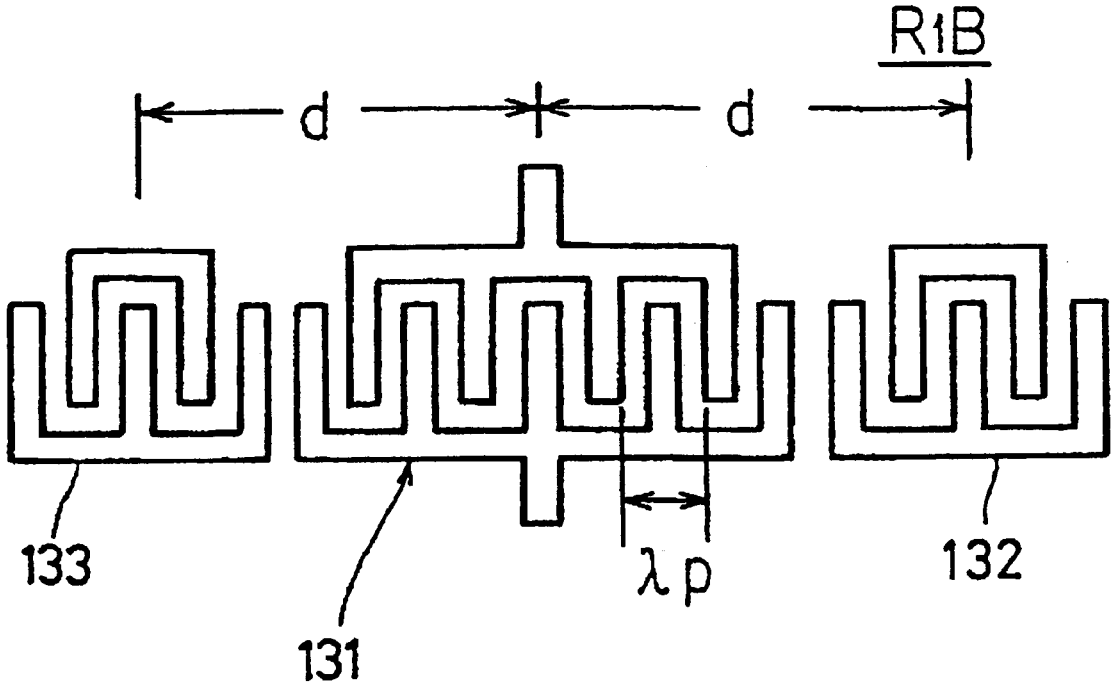
FIG. 28 is a diagram showing a first one-terminal-pair SAW resonator shown in FIG. 27.

As shown in FIG. 28, the resonator R1B has an exciting interdigital electrode 131, and reflectors 132 and 133 respectively disposed on both sides of the electrode 131. The reflectors 132 and 133 are positioned so that $\beta=0.4$ in which $\beta$ is obtained from the following equation:

$$d=(n+\beta)\cdot\lambda$$

where d is the distance between the center of the electrode 131 and each of the reflectors 132 and 133, n is an arbitrary integer, $\beta$ is a real number equal to or less than 1, and $\lambda$ is the period of the interdigital electrode 131 corresponding to its resonance frequency.

The number of finger pairs of each of the reflectors 132 and 133 is 50. The resonators respectively equipped with the reflectors are indicated by the symbol "*" shown in FIG. 27. The resonators R3B and R5B respectively provided in the parallel arms 63 and 64 respectively have two reflectors in the same manner as the resonators R1B.

Figure 27:
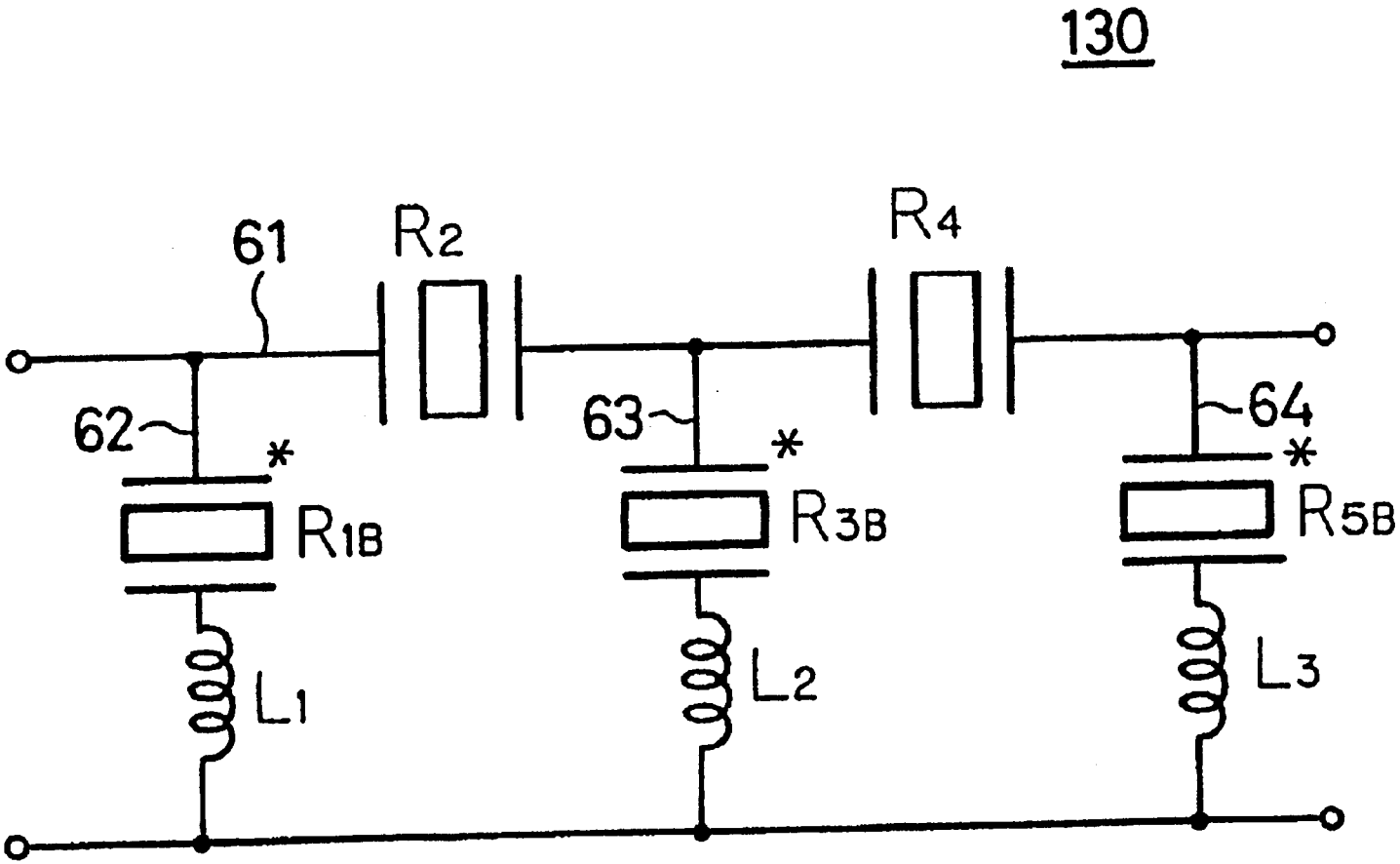
FIG. 27 is a circuit diagram of a SAW filter according to a sixth embodiment of the present invention.
Figure 29:
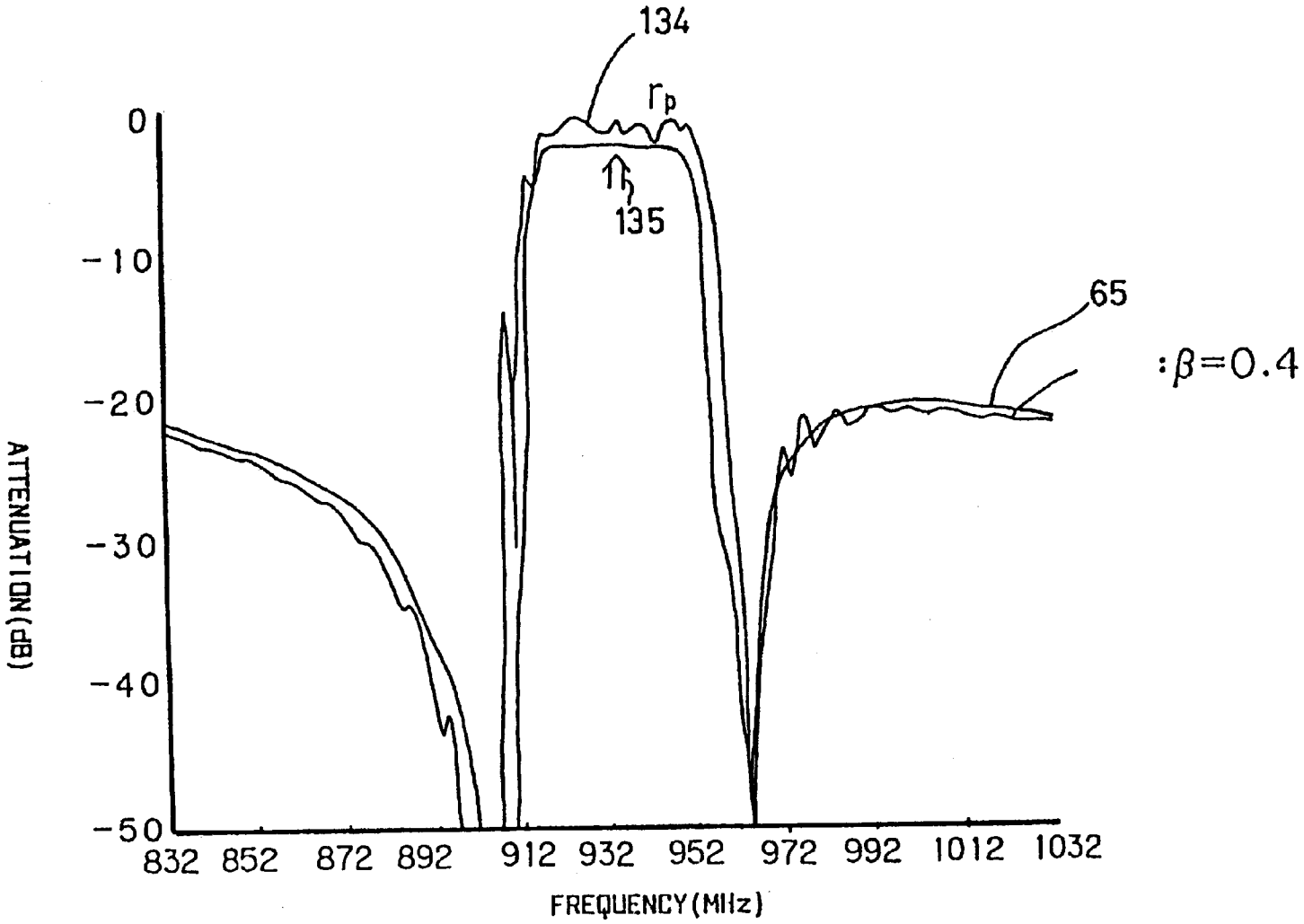
FIG. 29 is a diagram showing a band characteristic of the filter shown in FIG. 27.

The filter 130 shown in FIG. 27 has a band characteristic indicated by a curve 134 shown in FIG. 29. As compared to the characteristic curve 65 of the filter 60 (FIG. 13), the insertion loss in the filter 130 is improved, as indicated by an arrow 135. A ripple $r_p$ arises from the arrangement of the reflectors 132 and 133.

Figure 30:
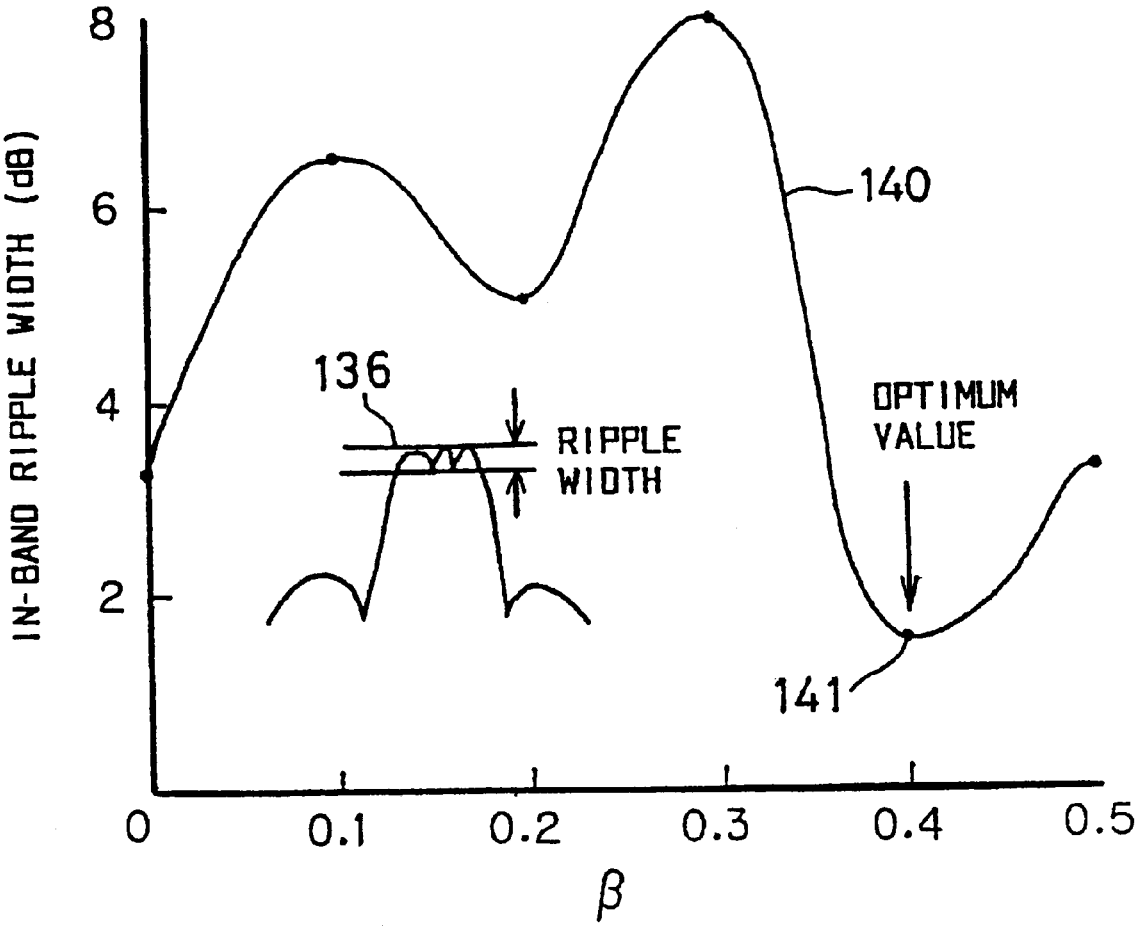
FIG. 30 is a diagram showing the influence of the reflector setting position on the width of a ripple.

A description will now be given of the reason why the reflectors 132 and 133 are arranged in the above-mentioned manner. The influence of the ripple $r_p$ observed when $\beta$ is changed from 0 to 0.5 is illustrated by a curve 140 shown in FIG. 30. The smallest ripple width can be obtained at a point 141 at which $\beta$ is 0.4.

Figure 31:
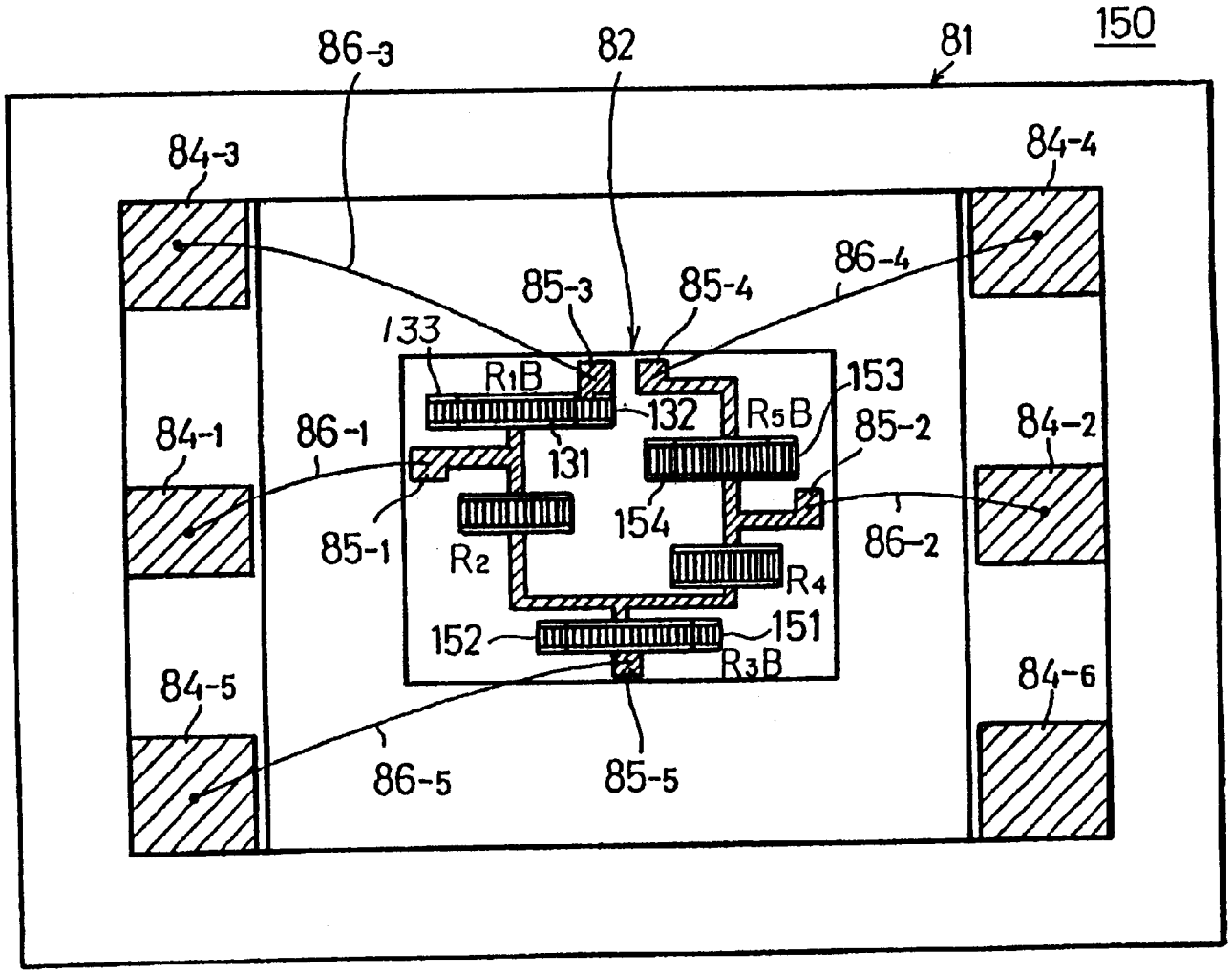
FIG. 31 is a plan view of the structure of the SAW filter shown in FIG. 27 with a lid removed therefrom.

FIG. 31 shown a SAW filter device 150 functioning as the filter 130 shown in FIG. 27. In FIG. 31, parts that are the same as parts shown in the previously described figures are given the same reference numbers as previously. The filter device 150 comprises reflectors 132, 133, 151, 152, 153 and 154.

Variations of the one-terminal-pair SAW resonators R1B, R3B and R5B will now be described.

Figure 32:
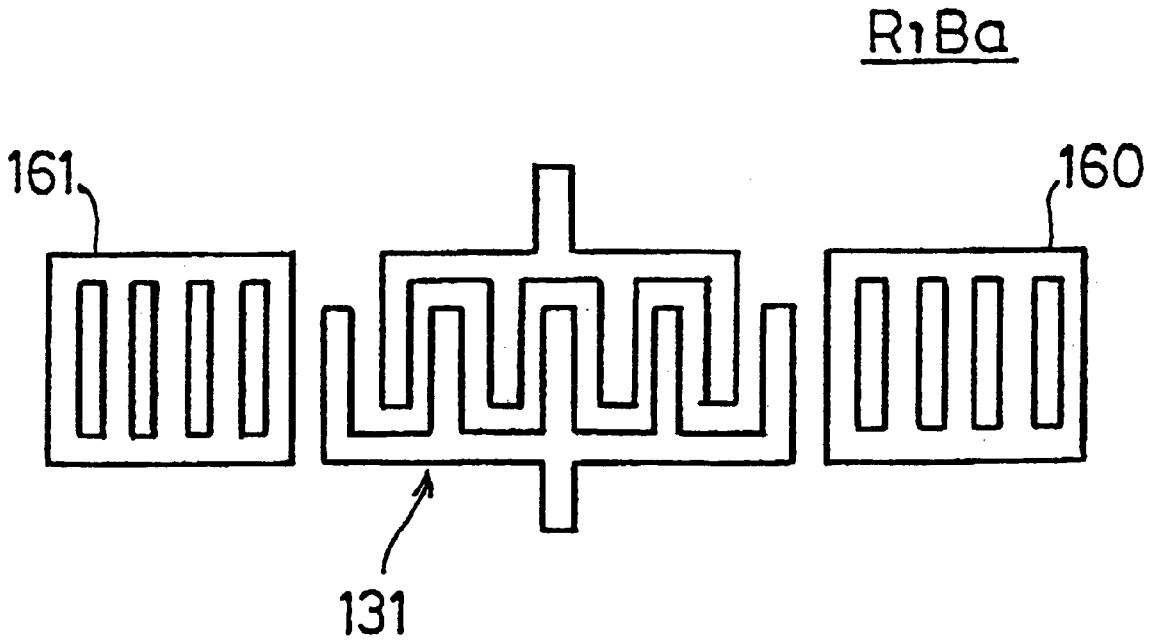
FIG. 32 is a diagram showing a variation of the first one-terminal-pair SAW resonator shown in FIG. 27.

FIG. 32 shows a first variation R1Ba, which comprises interdigital electrodes 160 and 161 respectively arranged on both sides of the exciting interdigital electrode 131. Each of the interdigital electrodes 160 and 161, which functions as a reflector, is an electrode in which the electric load thereof is of a short-circuit type.

Figure 33:
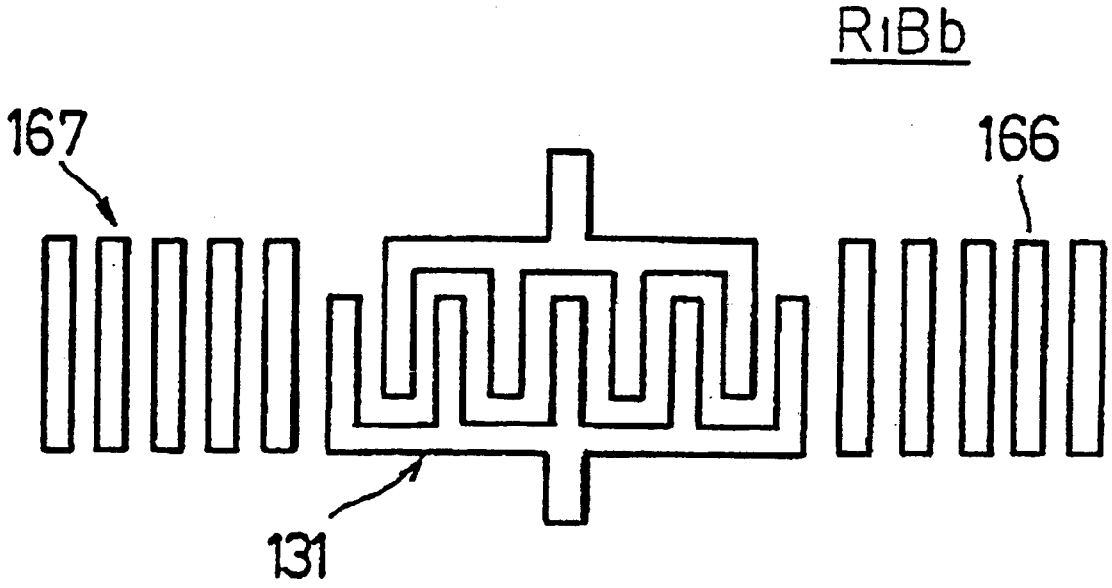
FIG. 33 is a diagram showing another variation of the first one-terminal-pair SAW resonator shown in FIG. 27.

FIG. 33 shows a second variation R1Bb, which comprises strip array type electrodes 167 and 166 respectively arranged on both sides of the electrode 131.

Figure 34:
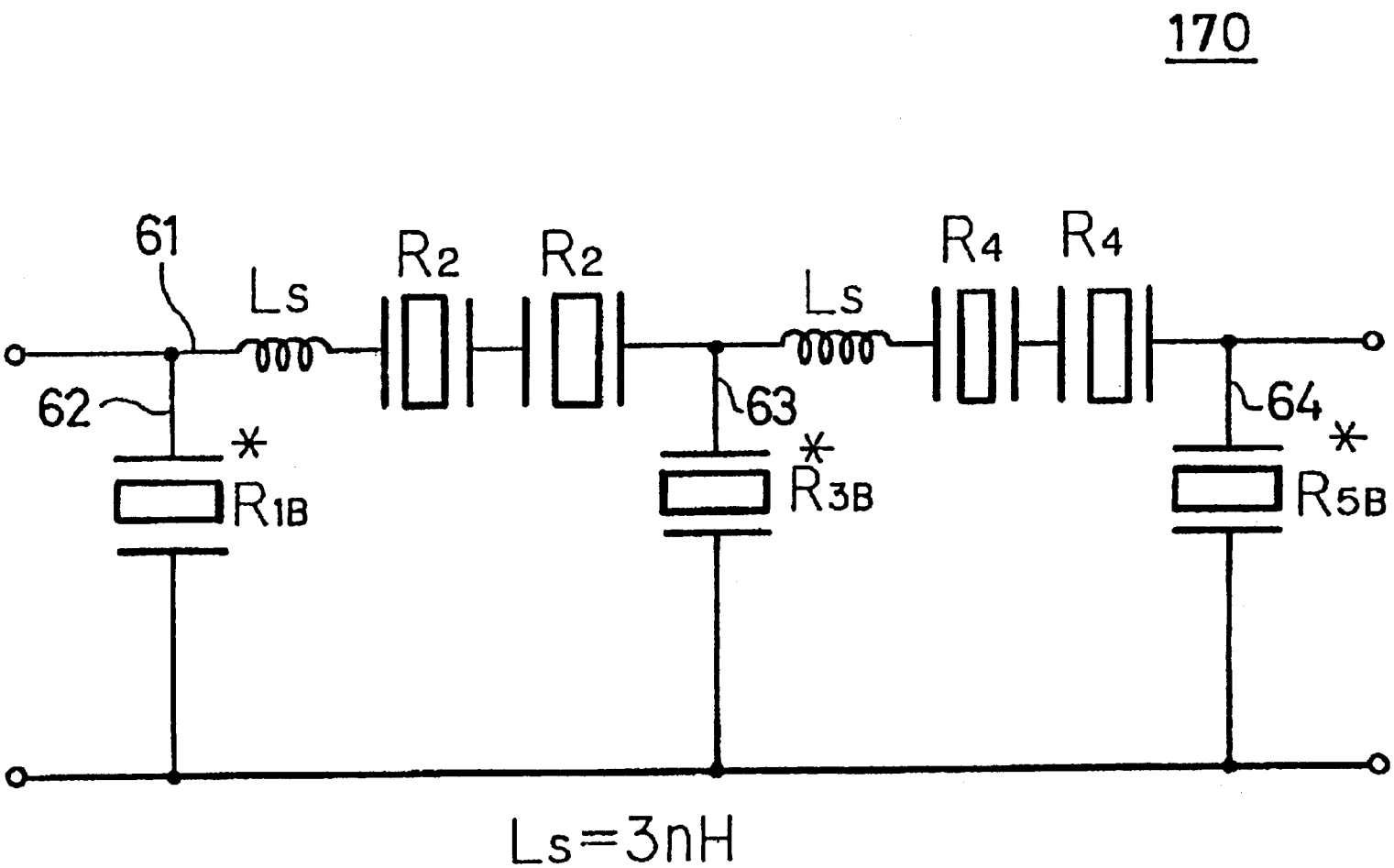
FIG. 34 is a circuit diagram of a SAW filter according to a seventh embodiment of the present invention.

A description will now be given of a seventh embodiment of the present invention with reference to FIG. 34, in which parts that are the same as parts shown in the previously described figures are given the same reference numbers. A SAW filter 170 shown in FIG. 34 comprises two SAW resonators R2 and two resonators R4 respectively provided in the series arm 61, and three SAW resonators R1B, R3B and R5B respectively provided in the parallel arms 62,63 and 64. Two inductors Ls are provided in the series arm 61, as shown in FIG. 34.

Figure 23:
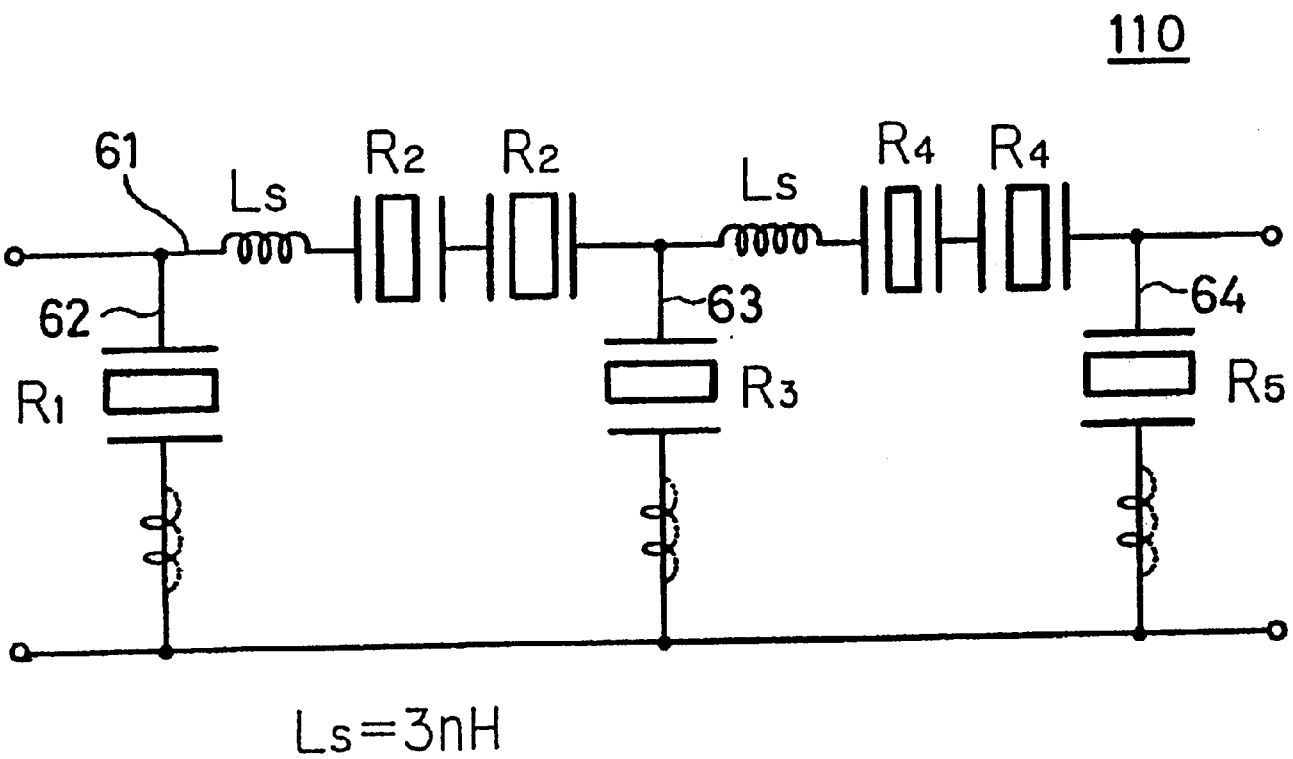
FIG. 23 is a diagram of a SAW filter according to a fourth embodiment of the present invention.
Figure 24:
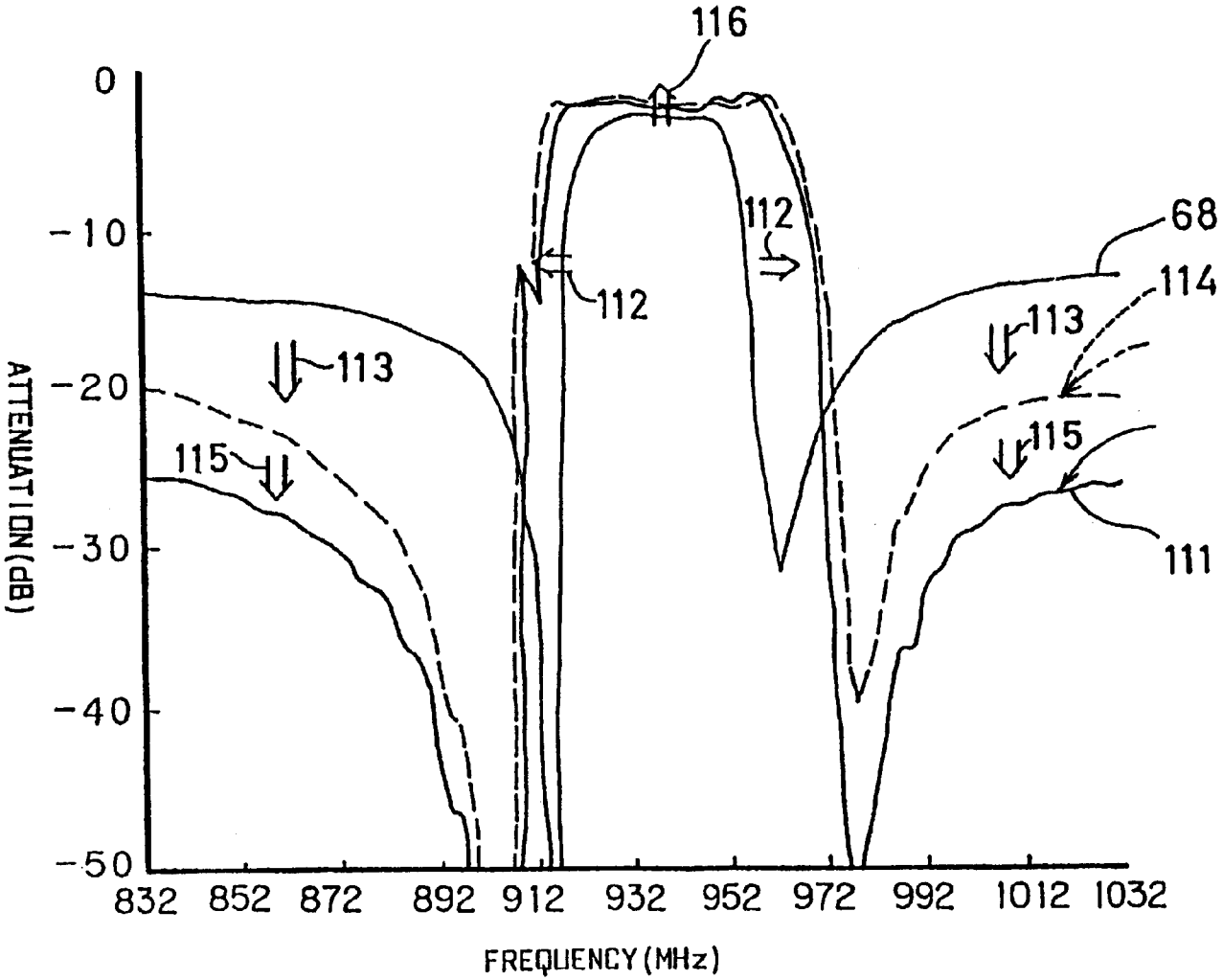
FIG. 24 is a diagram showing a band characteristic of the filter shown in FIG. 23.

The filter 170 is obtained by replacing the resonators R1, R3 and R5 shown in FIG. 23 with the resonators R1B, R3B and R5B shown in FIG. 28. As has been described previously, the reflectors 132 and 133 shown in FIG. 28 are positioned so that the condition $\beta=0.4$ is satisfied. The filter 170 has a loss of the pass band smaller than that of the filter 110 shown in FIG. 23, and a suppressed ripple.

A description will now be given of an eighth embodiment of the present invention, which is intended to eliminate the ripple $r_p$ shown in FIG. 29. First of all, a means for effectively eliminating the ripple $r_p$ arising from the reflectors will be described.

The inventors simulated the relationship between the frequencies at which the ripple $r_p$ is observed and the electrode thickness. In the simulation, the effects resulting from increasing the film thickness of the electrode are replaced by increasing the ratio between the acoustic impedance ($Z_m$) obtained under the electrode and the acoustic impedance ($Z_o$) of the free surface. As described in the aforementioned Ikata document, an increase in the electrode thickness increases the weight thereof. Hence, it is possible to consider that an increase in the electrode thickness is proportional to an increase in a discontinuous quantity of the acoustic impedance. With the above in mind, the following equation was prepared:

$$Q=Z_o/Z_m=V_o/V_m=1+k^2/2+\alpha(t) \quad (9)$$

where $V_o$ and $V_m$ respectively denote sound velocities on the free surface and under the electrode $k^2$ is the electromechanical coupling coefficient, and t is the film thickness of the electrode. Then $\alpha(t)$ was changed as a parameter proportional to the film thickness t.

From the equation (9), the center frequency $f_o$ of the filter is written as follows:

$$f_o=2f_o'/(1+Q) \quad (10).$$

Figure 35:
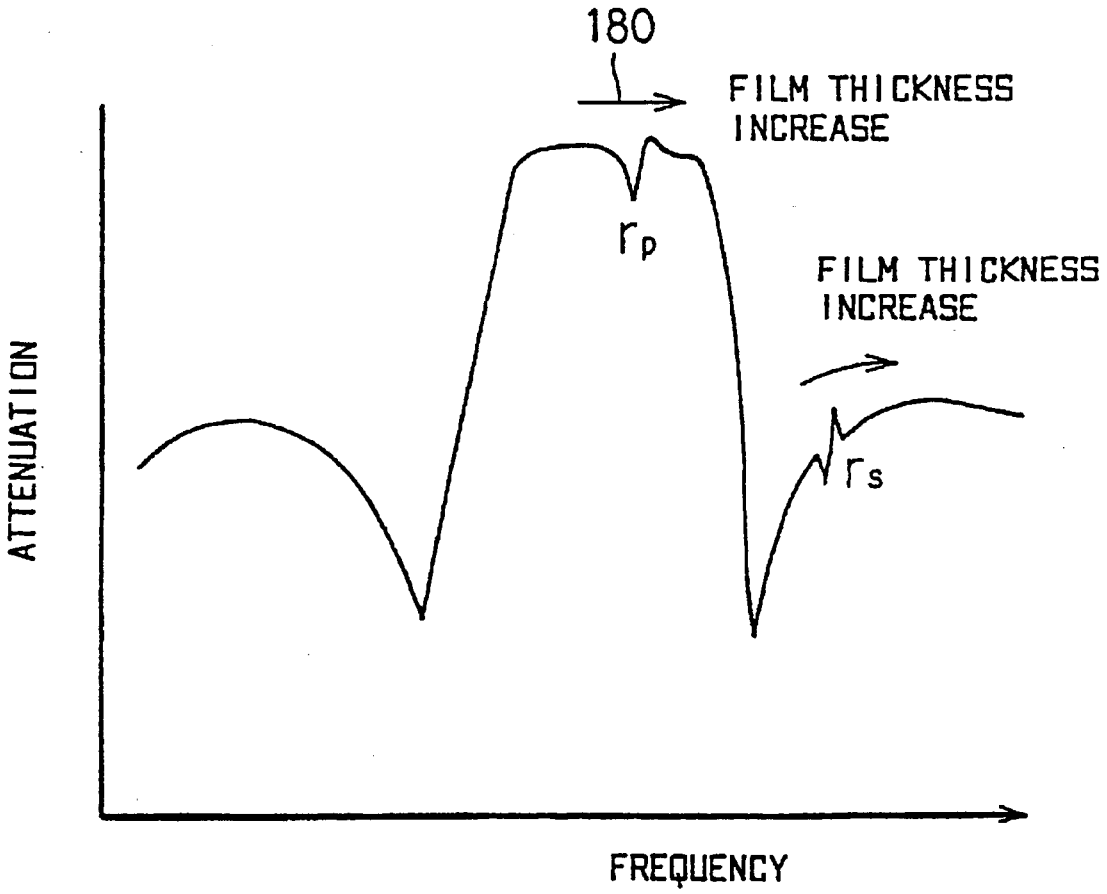
FIG. 35 is a diagram showing the relation between the film thickness of the electrode and the ripple occurrence position.

The equation (10) is consistent with the well-known experimental result in which, as the film thickness increases, the center frequency decreases from the center frequency $f_o'$ obtained when there is no discontinuity of the acoustic impedance. The results of the simulation show that, as $\alpha(t)$ increases, that is, the film thickness increases, the frequency position at which the ripple $r_p$ appears shifts toward the high-frequency range of the pass band, as indicated by an arrow 180 shown in FIG. 35, and finally drops into the attenuation pole on the high-frequency side of the pass band. It will be noted that a ripple $r_s$ shown in FIG. 35 is caused by the reflectors of the resonators provided in the series arm.

Figure 36:
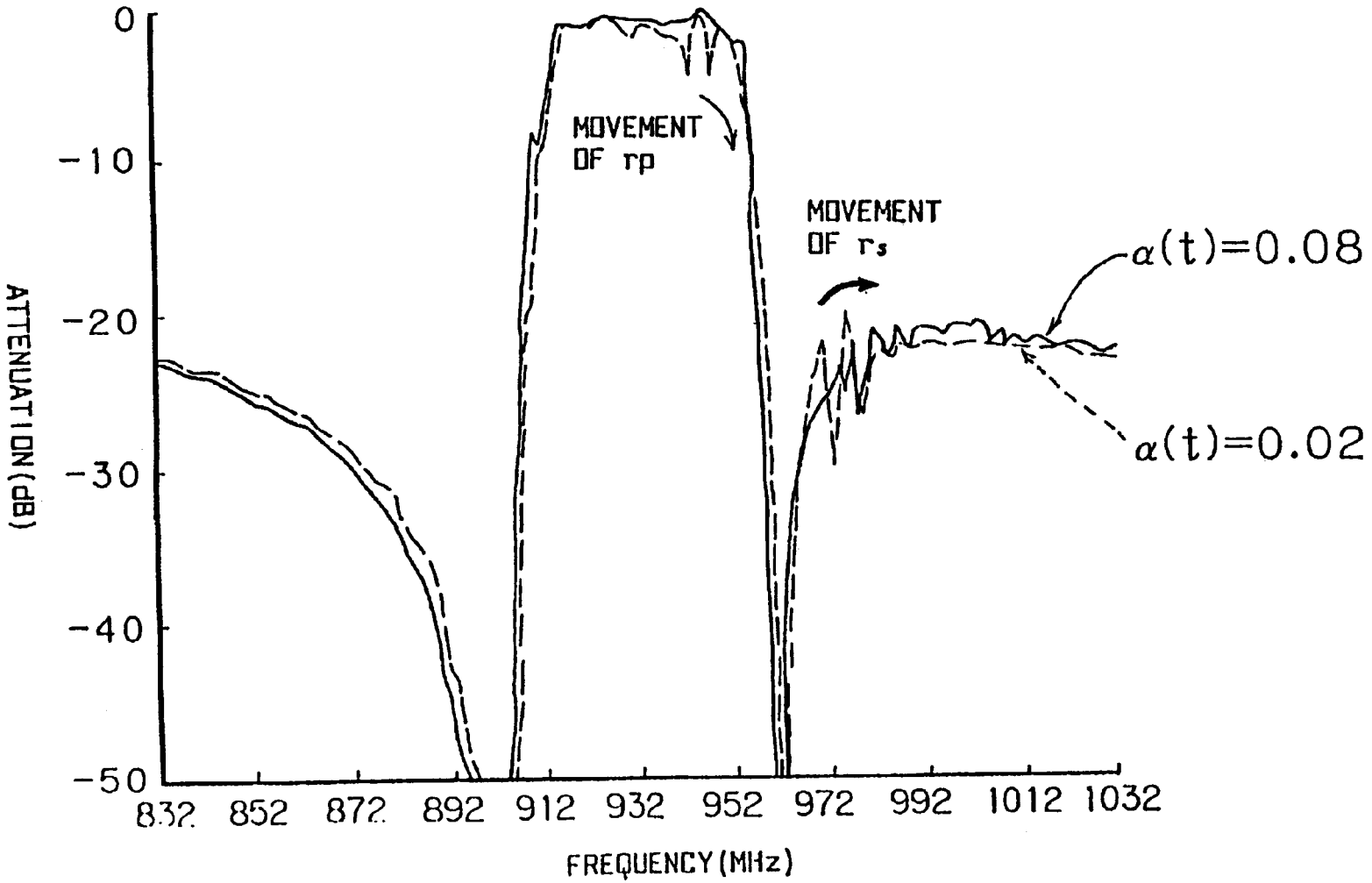
FIG. 36 is a diagram showing a state in which a ripple arising from reflectors of a parallel-arm resonator has been dropped into a high-frequency attenuation pole.

FIG. 36 shows an attenuation quantity vs. frequency characteristic obtained when $\alpha(t)=0.08$. A ripple resulting from the reflectors of the resonators in the parallel arms is located in the attenuation pole on the high-frequency side of the pass band. That is, there is no ripple in the pass band. In addition, the graph of FIG. 36 shows that the insertion loss is very small. In FIG. 36, the resonance frequencies of the resonators in the parallel and series arms are calibrated so that they are located at the frequency position which is 15 MHz higher than the original frequency position in order to obtain a center frequency of 932 MHz, because the center frequency of the pass band decreases according to the equation (10).

The inventors fabricated chips and measured the band characteristic thereof in order to study the relation to the actual film thickness.

Figure 37A:
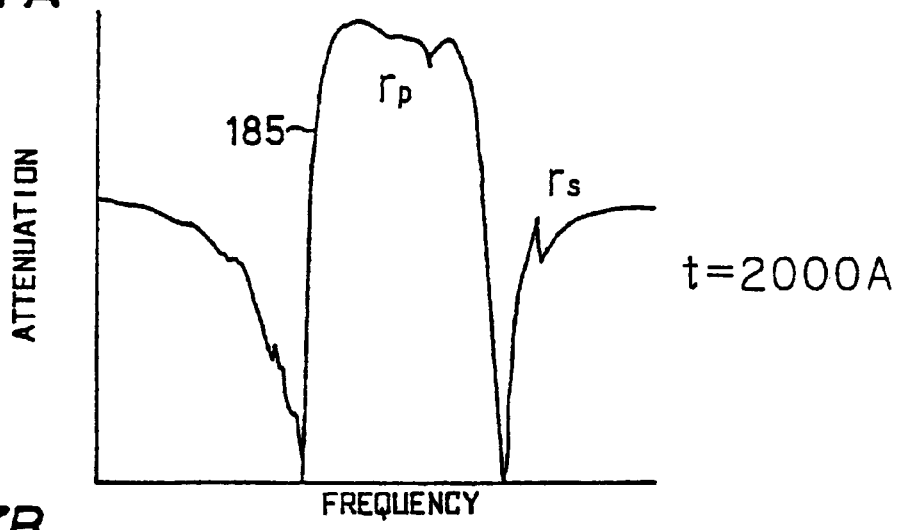
FIGS. 37A, 37B and 37C are diagrams showing a film thickness' dependence on the pass band characteristic of a resonator-type filter.
Figure 37B:
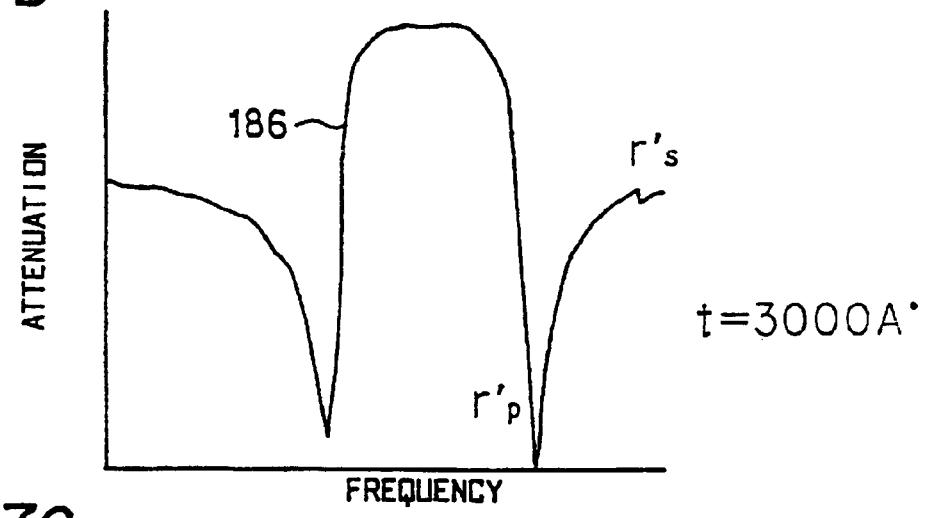
Figure 37C:
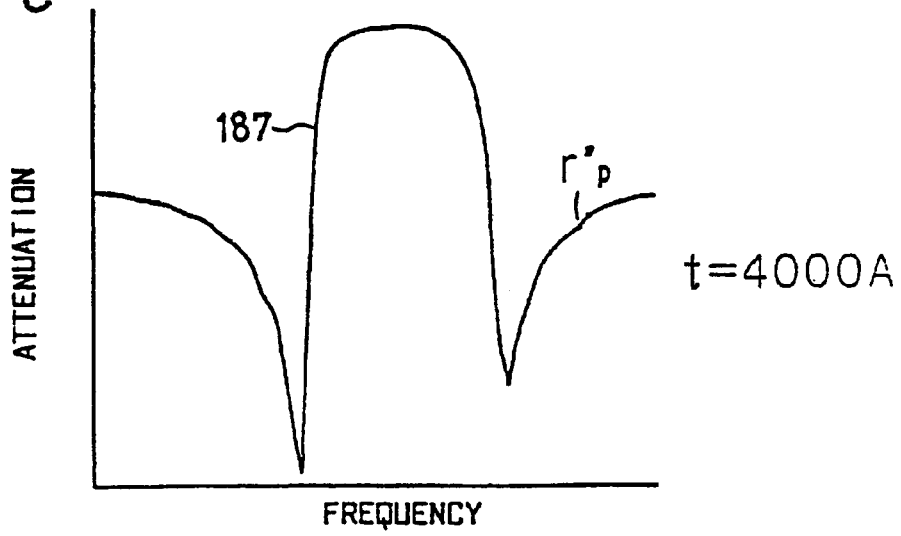

FIGS. 37A, 37B and 37C respectively show band characteristic curves 185, 186 and 187 for film thicknesses of 2000 Å, 3000 Å and 4000 Å. In practice, the center frequency is varied by changing the film thickness. The graphs of FIGS. 37A, 37B and 37C have been calibrated by changing the period of the interdigital electrode.

A ripple $r_p$ resulting from the resonators in the parallel arms is superimposed on the characteristic curve 185 for a film thicknesses of 2000Å. As the film thickness increases, the ripple $r_p$ shifts to higher frequencies. The experimental results shown in FIGS. 37A, 37B and 37C are consistent with the aforementioned results of the simulation.

However, an insertion loss arising from a bulk wave, which cannot be calculated by simulation, and a resistance loss appear as the film thickness increases (see Ebata et al., "SURFACE ACOUSTIC WAVE RESONATOR ON $LiTaO_3$ SUBSTRATE AND ITS APPLICATION TO OSCILLATORS FOR USE IN VTR", Journal of the Institute of Electronics and Communication Engineers of Japan, vol. J66-C, No.1, pp.23–pp.30, 1988). Further, the correlation between the above insertion loss and the resistance loss is also a very important factor.

Figure 38A:
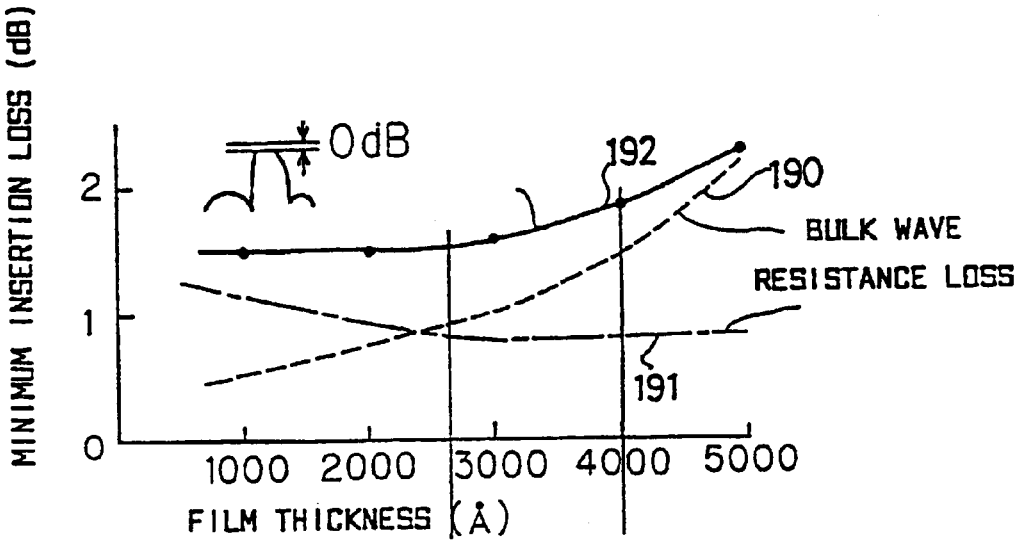
FIGS. 38A and 38B are diagrams showing the results of an experiment concerning the film thickness' dependence on the insertion loss and the ripple occurrence position.

FIG. 38A shows a curve 190 of the insertion loss resulting from the bulk wave, and a resistance loss curve 191. A curve 192 shows an experimental characteristic curve. The insertion loss is approximately equal to the resistance loss when the film thickness is 2500Å. Then, the total loss mainly resulting from the insertion loss starts to increase when the film thickness is approximately 3500Å.

Figure 38B:
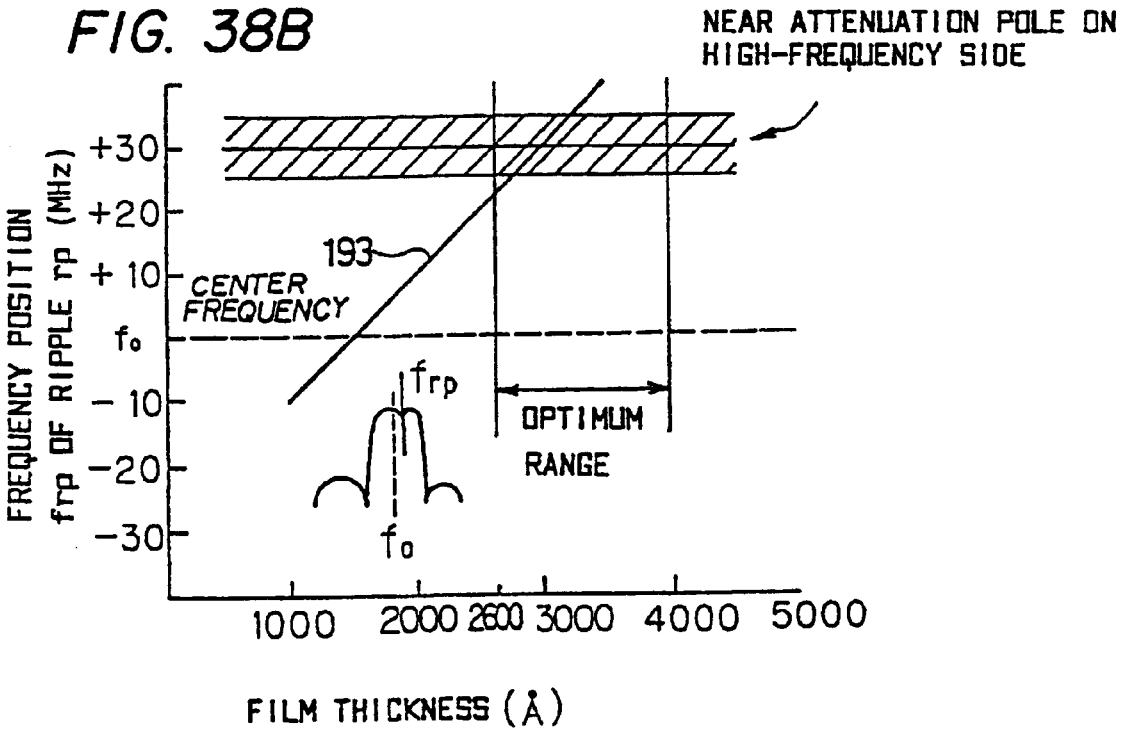

A curve 193 shown in FIG. 38B indicates the frequency position $f_{rp}$ of the ripple $r_p$ as a function of the identical film thickness of the exciting electrode 131 and the reflectors 132 and 133 shown in FIG. 28. It is concluded, based on the graphs in FIGS. 38A and 38B, that the optimum film thickness that results in no ripple and little insertion loss is between 2600Å and 4000Å. The above optimum film thickness can be normalized by the period $\lambda_p$ (4.4 $\mu$m at 932 MHz, see FIG. 28) of the resonators in the parallel arm substantially determined by the center frequency of the filter. The normalized optimum film thickness is between 0.6 and 0.09.

The eighth embodiment of the present invention is based on the results of the above consideration by the inventors.

Figure 39:
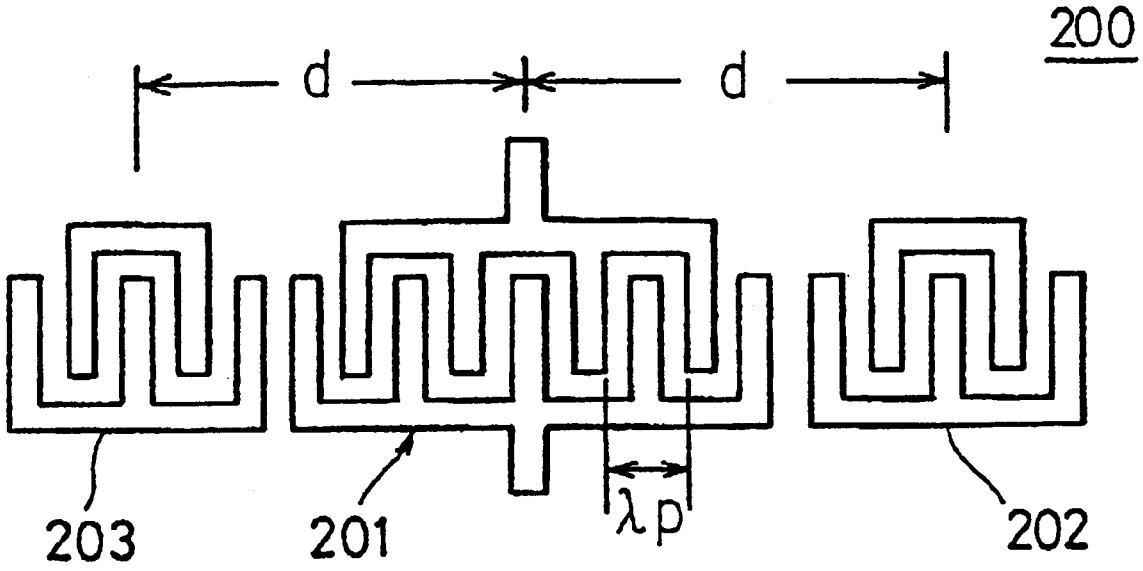
FIG. 39 is a diagram of a first one-terminal-pair SAW resonator according to an eighth embodiment of the present invention.
Figure 40:
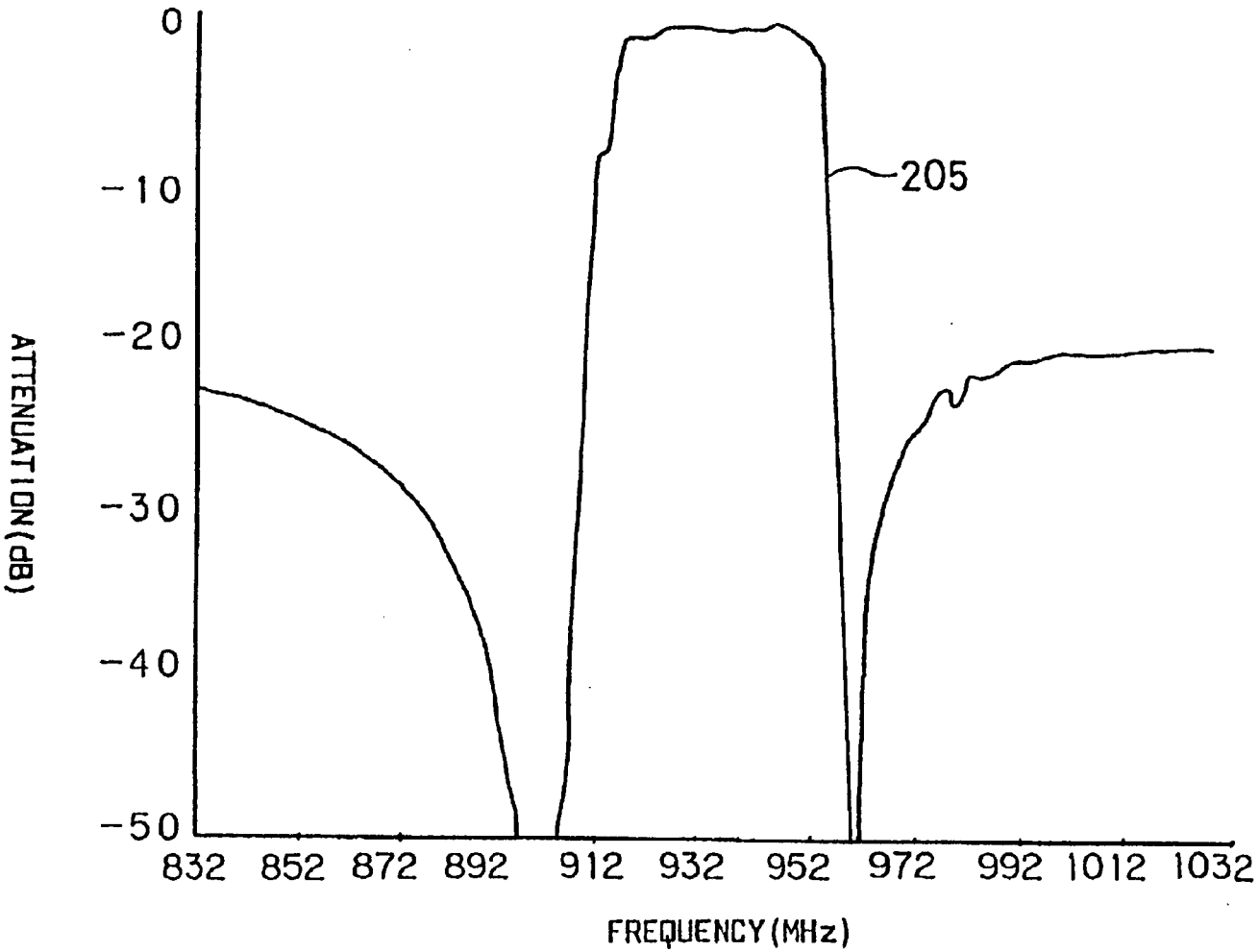
FIG. 40 is a diagram showing a band characteristic of the SAW filter shown in FIG. 39.

FIG. 39 shows a first one-terminal-pair SAW resonator 200 used in the SAW filter according to the eighth embodiment. The resonator 200 comprises an exciting electrode 201, and two reflectors 202 and 203 respectively located on both sides of the electrode 201. The electrode 201 and the reflectors 202 and 203 are made of aluminum (Al) or a mixture of alloy of Al and a few percentage of other metal by weight. The film thickness $t_1$ of each of the electrodes and the reflectors 202 and 203 is equal to 0.06–0.09 times the electrode period $\lambda_p$. A SAW filter, in which the resonator 200 is applied to each of the resonators R1B, R3B and R5B shown in FIGS. 27 and FIG. 34, has a band characteristic indicated by a curve 205 shown in FIG. 40. It can be seen from FIG. 40 that there is no ripple in the pass band. Use of an Al alloy improves the breakdown power performance, as compared to use of Al, Cu or Ti can be mixed with Al.

Figure 41:
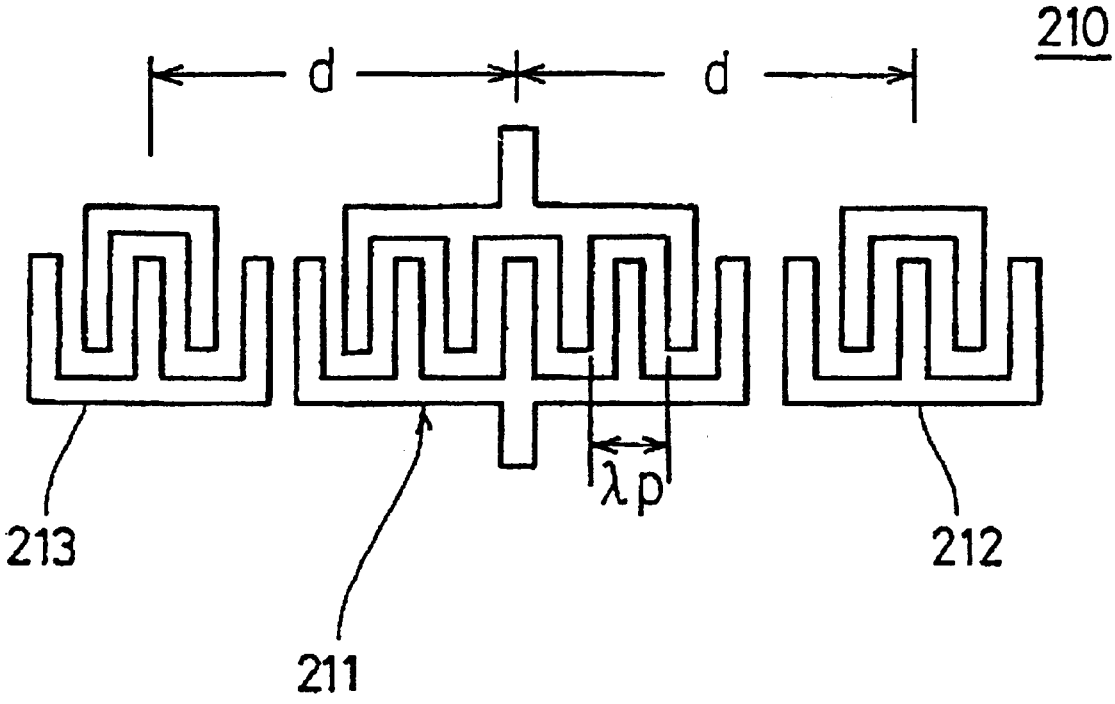
FIG. 41 is a diagram showing a variation of the first one-terminal-pair SAW resonator used in the eighth embodiment of the present invention.

FIG. 21 shows a variation 210 of the SAW resonator 200. The resonator 210 shown in FIG. 41 comprises an exciting interdigital electrode 211, and two reflectors 212 and 213 respectively located on both sides of the electrode 211. The electrode 211 and the reflectors 212 and 213 are made of Au. The optimum film thickness of the electrode 211 and the reflectors 212 and 213 is determined, taking into account the above-mentioned phenomenon caused due to the influence of an increase in the weights of the electrode 211 and the reflectors 212 and 213. Since the ratio of the density of Al to that of Au is 2.7/18.9, equal to 0.143, the optimum film thickness $t_2$ is determined by multiplying the optimum film thickness $t_1$ by 0.143, and is equal to 0.0086–0.013 times the electrode period $\lambda_p$. A SAW filter obtained by applying the resonator 210 to each of the resonators R1B, R3B and R5B has a band characteristic similar to the characteristic shown in FIG. 40, and does not have any ripple in the pass band.

Figure 42:
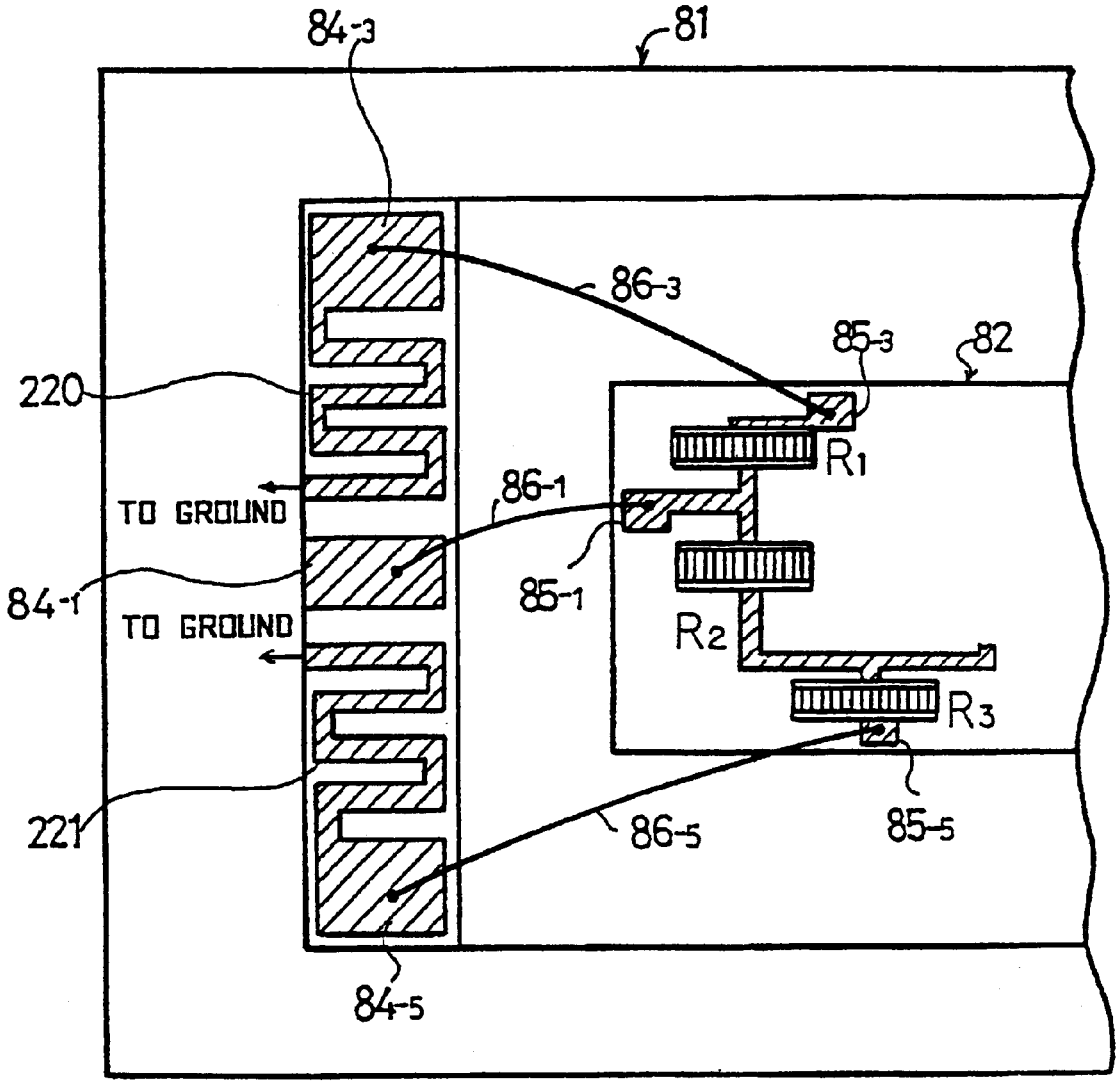
FIG. 42 is a plan view of a structure which realizes inductors used in the filter shown in FIG. 13.

A description will now be given of the structure of the inductors L1, L2 and L3 shown in FIG. 13 according to a ninth embodiment of the present invention, with reference to FIG. 42, in which parts that are the same as parts shown in FIG. 16 are given the same reference numbers. As shown in FIG. 42, zigzag microstrip lines 220 and 221 are formed on the ceramic package 81 and are connected to the terminals $\mathbf{84}_{-3}$ and $\mathbf{84}_{-5}$. Ends of the microstrip lines 220 and 221 are connected to the ground. The pattern width of each of the microstrip lines 220 and 221 is 100 $\mu$m, and the distance between the microstrip lines 220 and 221 and the ground is 0.5 mm. When the dielectric constant of the ceramic package 81 is equal to 9, the inductance values of the microstrip lines 220 and 221 are equal to 2 nH.

Figure 43:
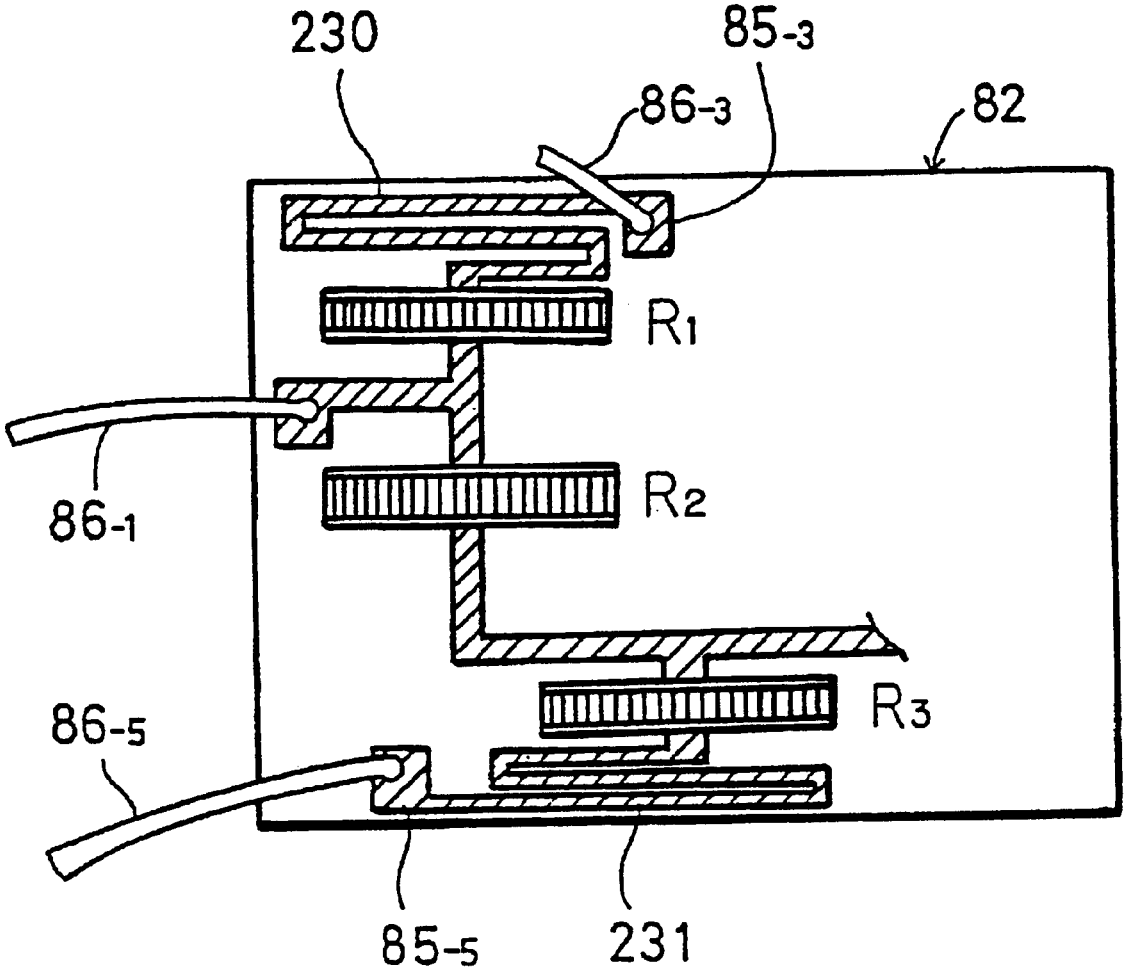
FIG. 43 is a diagram of another structure which realizes inductors used in the filter shown in FIG. 13.

A description will now be given, with reference to FIG. 43, of a tenth embodiment of the present invention which is another structure of the inductors L1, L2 and L3. In FIG. 43, parts that are the same as parts shown in FIG. 16 are given the same reference numbers as previously. Two zigzag microstrip lines 230 and 231 respectively connected to the resonators R1 and R2 are formed on the filter chip 82. Terminals $\mathbf{85}_{-3}$ and $\mathbf{85}_{-5}$ are connected to ends of the microstrip lines 230 and 231. Each of the microstrip lines 230 and 231 is 3000Å thick, 60 $\mu$m wide and 2 mm in length. When the dielectric constant of the filter chip ($LiTaO_3$) 82 is equal to 44, the inductance of the microstrip lines 230 and 231 are equal to 2.2 nH.

It is possible to form inductors by suitably combining the bonding wire $\mathbf{86}_{-3}$, the microstrip line 220 on the ceramic package 81 and the microstrip line 230 on the filter chip 82.

Figure 44:
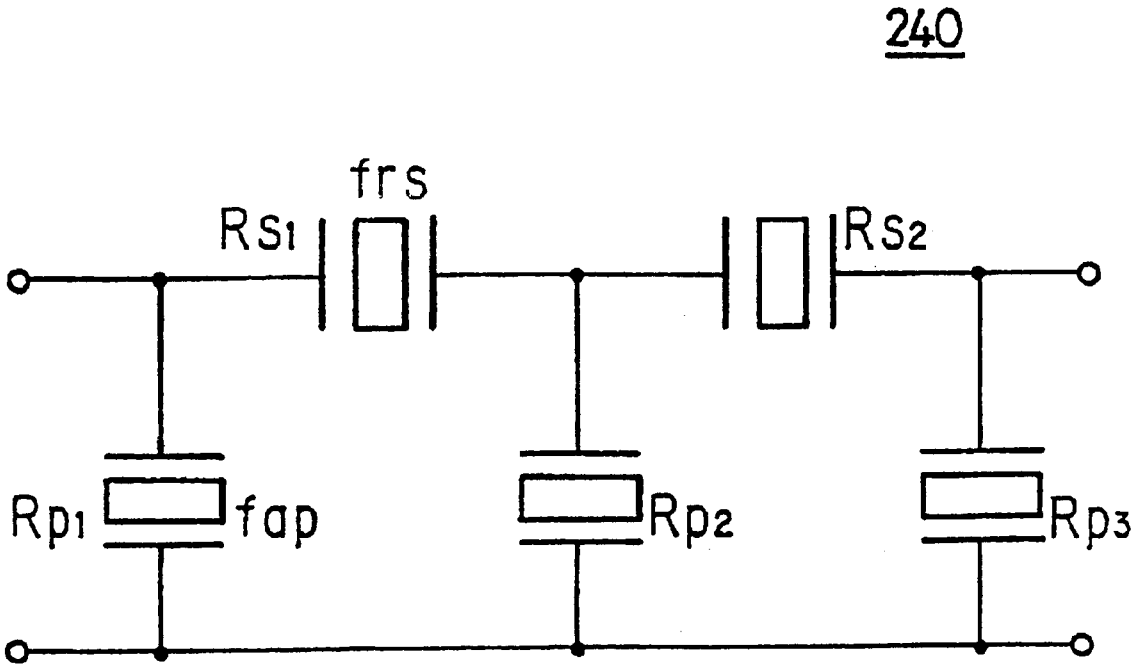
FIG. 44 is a circuit diagram of a SAW filter according to an eleventh embodiment of the present invention.

A description will now be given, with reference to FIG. 44, of a SAW filter 240 according to an eleventh embodiment of the present invention. The eleventh embodiment of the present invention is configured as follows. First, the resonance frequency $f_{rs}$ of the resonators in the series arm is made higher than the antiresonance frequency $f_{ap}$ of the resonators in the parallel arms in order to increase the pass band width. Second, $\Delta f \equiv f_{rs} - f_{ap}$ is selected so that the pass band does not have an extremely large loss.

Figures 46A, 46B:
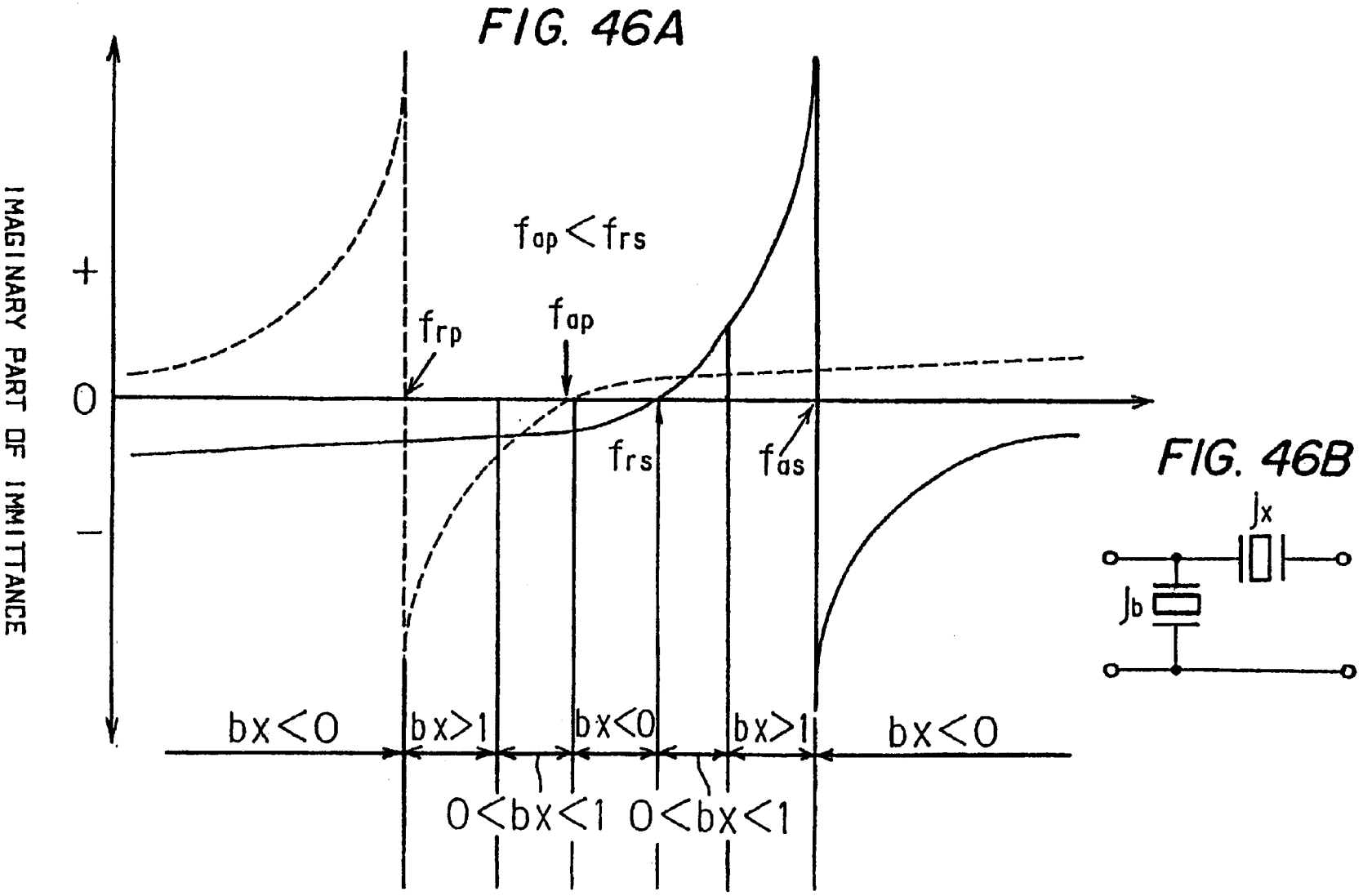
FIGS. 46A and 46B are diagrams showing an immittance characteristic of a SAW resonator in which the resonance frequency is higher than the antiresonance frequency.

The previously described embodiments of the present invention require that $f_{ap}=f_{rs}$. However, as long as this condition is maintained, the pass band cannot be increased. In order to increase the pass band, the present inventors considered a condition $f_{ap}<f_{rs}$, as shown in FIGS. 46A and 46B. It is apparent from FIGS. 46A and 46B that bx<O within a range $f_{ap}<f<f_{rs}$ and hence this frequency range is changed to an attenuation band according to the aforementioned theory. However, in practice, the product bx can be maintained at a very small value by limiting $\Delta f=(f_{rs}-f_{ap})$, and the above frequency range can practically function as a pass band without any substantial attenuation.

Figure 47A:
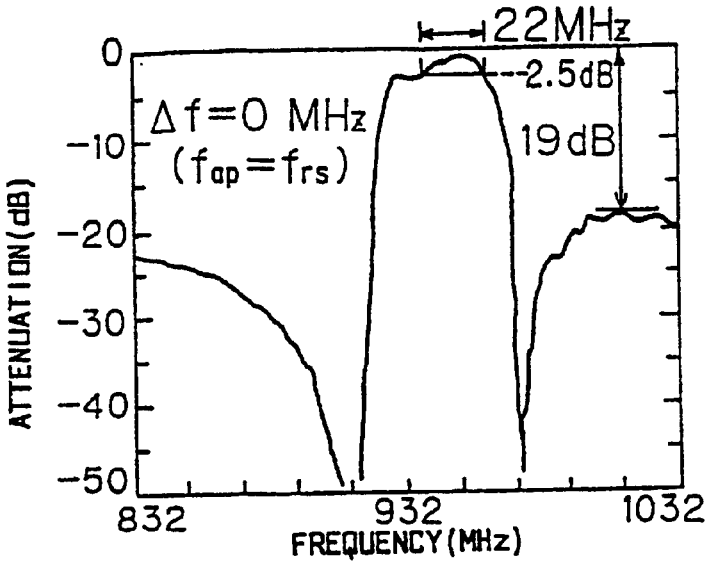
FIGS. 47A, 47B and 47C are diagrams showing variations in the band characteristic of the ladder-type filter observed when the difference between the resonance frequency and the antiresonance frequency increases from zero.
Figure 47B:
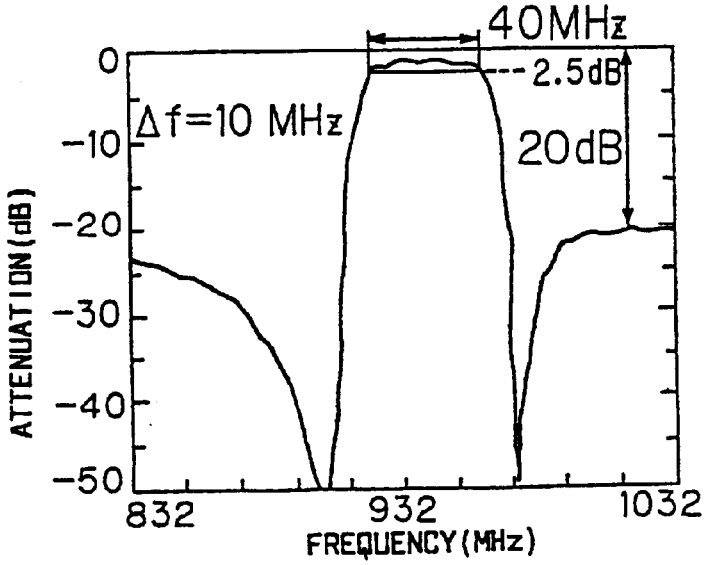
Figure 47C:
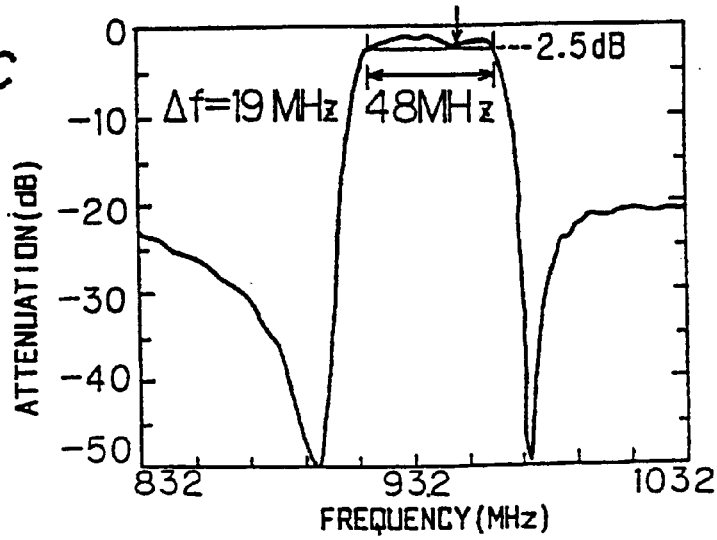

FIGS. 47A, 47B and 47C show band characteristics of a ladder-type filter obtained when the $\Delta f=(f_{rs}-f_{ap})$ increases from zero. The filter used in the experiment has a piezoelectric substrate made of $LiTaO_3$ having an electromechanical coupling coefficient of 0.05, and an Al interdigital electrode having a film thickness of 3000Å. The structure of the electrode is one of two basic units connected so as to form a ladder-type structure, as shown in FIG. 44. Each of the basic units comprises a first resonator in the parallel arm and a second resonator in the series arm. In order to form the input and output parts of the filter in symmetry to each other, a third resonator is provided in another parallel arm of the final stage. A plurality of basic units are cascaded so as to form a ladder-type structure in order to increase the side lobe suppression factor to a practical value.

However, the insertion loss increases as the number of basic units to be cascaded increases. Hence, it is preferable to determine the number of basic units to be cascaded, taking into account an actual filter specification. The filter being considered is intended to realize a loss equal to or less than 2 dB and a side lobe suppression factor equal to or higher than 20 dB. The interdigital electrode of each of the resonators in the parallel and series arms is designed to have an aperture length of 180 $\mu$m and 50 finger pairs. The ratio P(=Cop/Cos) obtained when Cop and COS are electrostatic capacitances of parallel-arm and series-arm, respectively, is 1 because the electrodes of all the resonators have identical specifications.

FIG. 47A shows a band characteristic when Δf=0. FIG. 47B shows a band characteristic when Δf=10 MHz. The band characteristic shown in FIG. 47B is improved so that the pass band width (in which a loss equal to or less than 2.5 dB is ensured) is increased to 40 MHz, while the band characteristic shown in FIG. 47A has a pass band width of 22 MHz. It can be seen from FIGS. 47A and 47B that the pass band width is improved particularly for low frequencies. Further, the band characteristic shown in FIG. 47B has an improved side lobe suppression factor. More particularly, the side lobe suppression factor is improved to 20 dB from 19 dB.

There is a limit regarding improvement due to increase in Δf. FIG. 47C shows a band characteristic when Δf=19 MHz. The pass band width slightly deteriorates at high frequencies, and this deterioration is approximately equal to 2.5 dB, which will increase the ripple in the pass band. In FIG. 47C, a ripple amounting to approximately 1.0 dB, which is the allowable ripple limit, is observed. When Δf is further increased, the insertion loss and the in-band ripple increase. Hence, an increase of Δf=19 MHz is the limit.

Figure 48A:
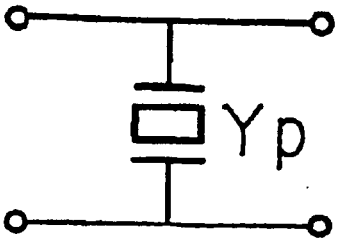
FIGS. 48A and 48B are diagrams showing how to measure the characteristics of the SAW resonator.
Figure 48B:
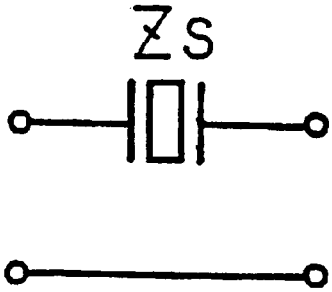

The product bx obtained when Δf=19 MHz was examined. In the experiment, a SAW resonator provided in a parallel arm shown in FIG. 44 and a SAW resonator provided in a series arm shown therein were separately fabricated. The admittance of the resonator in the parallel arm was measured by means of a circuit configuration shown in FIG. 48A, and the impedance of the resonator in the series arm was measured by means of a circuit configuration shown in FIG. 48B. The measurement of admittance and impedance was carried out by measuring S21 by means of a network analyzer. The measured values of S21 were inserted into equations shown in FIGS. 48A and 48B, and the impedance $Z_p$ and the admittance $Y_p$ were calculated.

Figure 49:
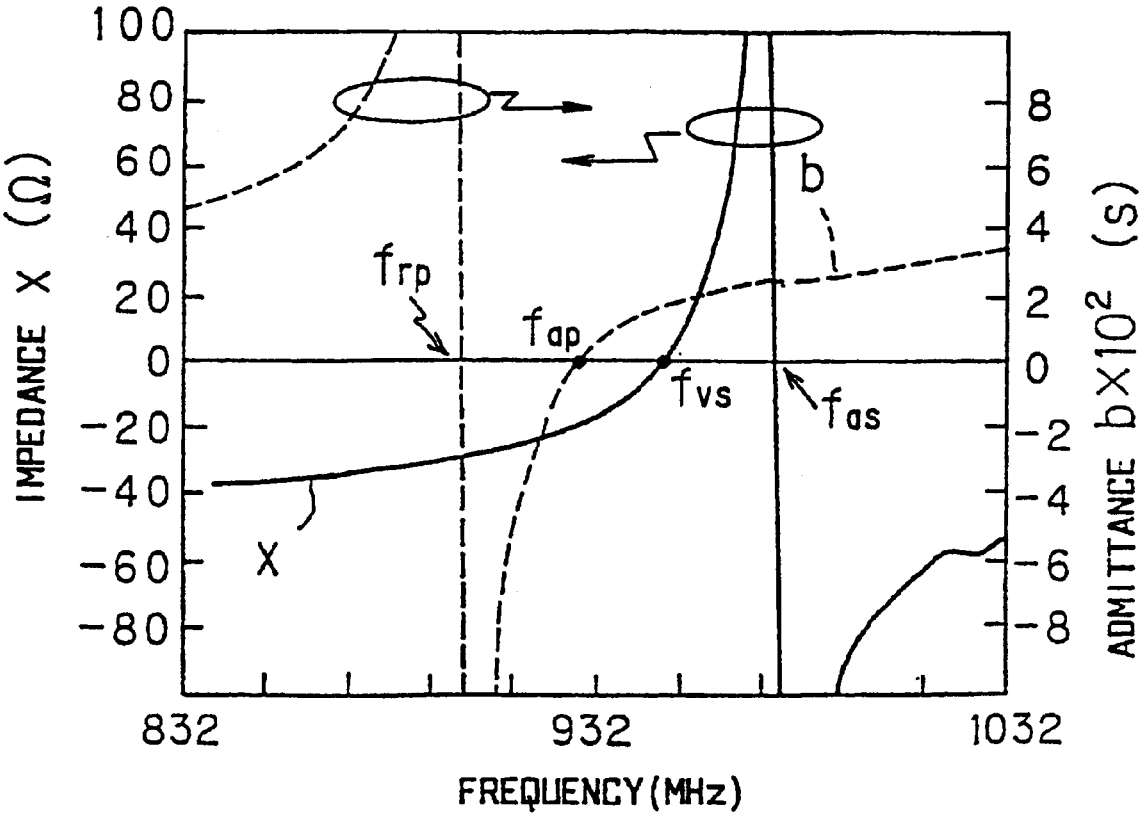
FIG. 49 is a graph showing admittance and immittance characteristics of SAW resonators in the series arm and the parallel arm.
Figure 50:
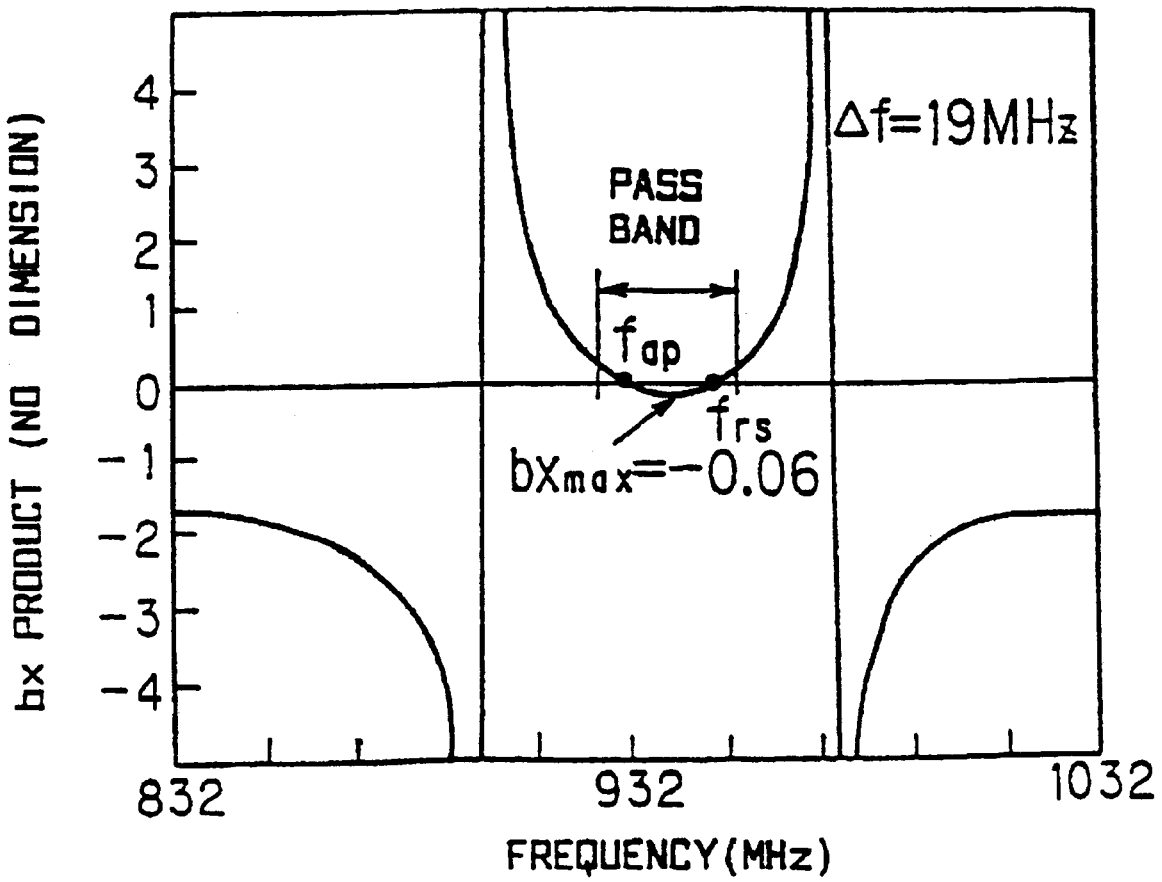
FIG. 50 is a diagram showing the frequency' dependence on the product of bx.

A frequency characteristic shown in FIG. 49 was obtained, which shows the imaginary part of the admittance or impedance, that is, the value of b or x. The frequency dependence of the product bx is as shown in FIG. 50. It can be seen from FIG. 50 that the product bx is negative and is a small value within $f_{ap}<f<f_{rs}$. The maximum absolute value $|bx_{max}|$ of the product bx is given when:

$$f=\sqrt{f_{ap}\cdot f_{rs}}$$

and was equal to 0.06 for the embodiment being considered. That is, when value $|bx_{max}|$ is equal to or smaller than 0.06, the deterioration of the insertion loss can be reduced and the in-band ripple can be suppressed to 1 dB or less. If Δf>19 MHz, the value of $|bx_{max}|$ increases, and both the insertion loss and the in-band ripple will increase to 1 dB or greater. This value is not practical. As a result, the value of $|bx_{max}|$ is a an upper-limit indicator of characteristic deterioration, and determines the allowable value of Δf.

Figure 51:
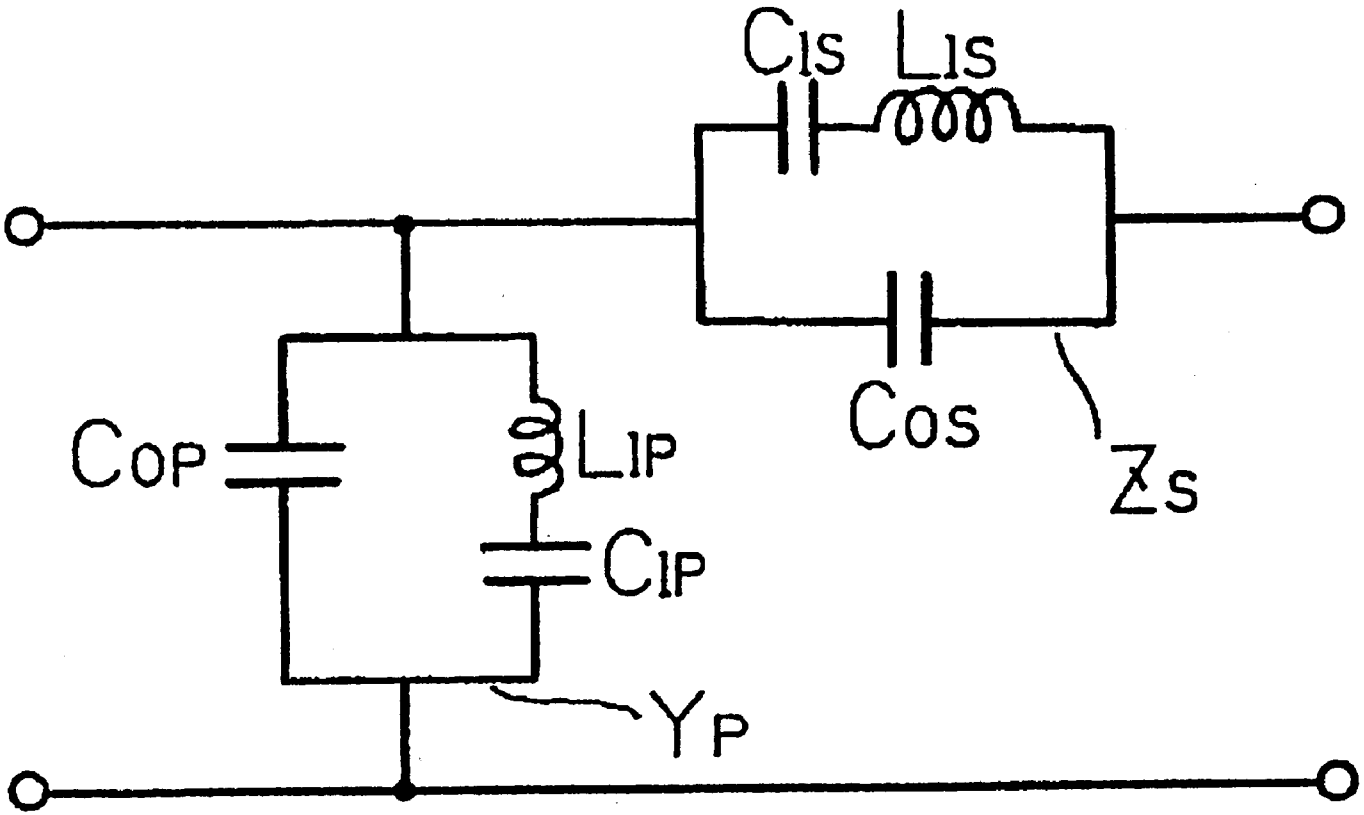
FIG. 51 is diagram showing an equivalent circuit in which a part of the circuit shown in FIG. 44 is expressed by means of L and C.

The above consideration will be generalized. FIG. 51 is an equivalent circuit diagram of a ladder-type filter obtained by approximating the SAW resonators by the double resonance circuits of LC. The impedance $Z_s$ of the SAW resonator in the series arm and the admittance $Y_p$ of the SAW resonator in the parallel arm are expressed as follows:

$$Z_p = jx \tag{11}$$
$$= [-j(\omega_{rs}^2 - \omega^2)]/[C_{os}(\omega_{as}^2 - \omega^2)]$$
$$Y_p = jb \tag{12}$$
$$[ = [-jC_{op}^2(\omega_{ap} - \omega^2)]/(\omega_{as}^2 - \omega^2)]$$
$$= [-jCop(\omega_{ap}^2 - \omega^2)]/\omega_{rp}^2 - \omega^2)$$

where $\omega_{rs}$, $\omega_{as}$, $\omega_{rp}$, $\omega_{ap}$ are respectively the resonance and antiresonance frequencies of the series-arm resonator and the resonance and antiresonance frequencies of the parallel-arm resonator, and τ is the capacitance ratio (inherent in the substrate). The above resonance and antiresonance frequencies as well as the capacitance ratio are written as follows:

$$\omega_{rs} = 2\pi f_{rs} = 1/\sqrt{C_{1s}L_{1s}}$$
$$\omega_{as} = 2\pi f_{as} = \omega_{rs}\sqrt{1+1/\tau}$$
$$\omega_{rp} = 2\pi f_{rp} = 1/\sqrt{C_{1p}L_{1p}}$$
$$\omega_{ap} = 2\pi f_{ap} = \omega_{rp}\sqrt{1+1/\tau}$$
$$\tau = C_{os}/C_{1s} = C_{op}/C_{1p}.$$

The product bx is calculated from the equations (11) and (12) as follows:

$$bx=-[C_{0p}\cdot(\omega_{ap}^2-\omega^2)\cdot(\omega_{rs}-\omega^2)]/[C_{0s}\cdot(\omega_{rp}^2-\omega^2)\cdot(\omega_{as}^2-\omega^2)] \tag{13}$$

The angular frequency ω which makes the product bx have a pole is obtained from δ(bx)/δω=0, and is expressed as $$=\sqrt{\omega_{ap}\cdot\omega_{rs}}. \tag{14}$$

The value obtained by inserting the above into the equation (13) is the maximum value of the product bx in the pass band. That is, $$bx_{max}=-[C_{0p}\cdot(1+1/\tau)]/[C_{0s}\cdot\{1+1/(\tau\cdot\Delta\omega/\omega_{rs})\}^2] \tag{15}$$

where $$\Delta\omega=\omega_{rs}-\omega_{ap}=2\pi\cdot\Delta f \tag{16}.$$

Figure 52:
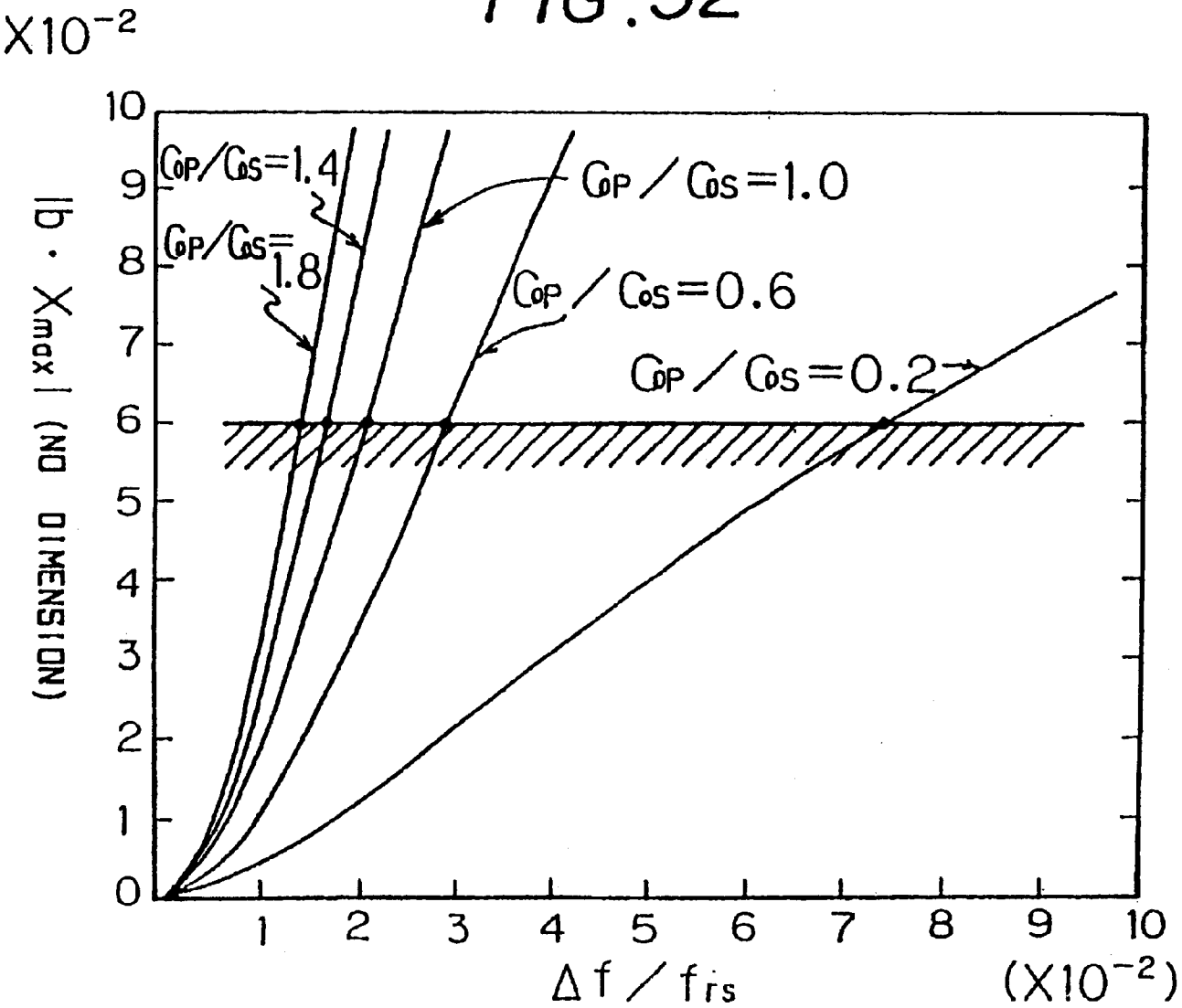
FIG. 52 is a diagram showing the relation between $|bx_{max}|$ and $\Delta f/f_{rs}$.

FIG. 52 shows a relation between $bx_{max}$ and $\Delta f/f_{rs}$ obtained by plotting the equation (15) as a parameter $P=C_{0p}/C_{0s}$. The hatched area shown in FIG. 52 corresponds to the condition such that the allowable value of the product bx is equal to or smaller than 0.06 obtained by the experiment. Hence, the allowable value a of $\Delta f/f_{rs}$ dependent on $P=C_{0p}/C_{0s}$ can be determined, and is written as follows, by inserting $|bx_{max}|=0.06$ into the equation (15):

$$\alpha = 1/\left[\sqrt{P(\tau^2+\tau)/0.06} - \tau\right]. \quad (17)$$

The capacitance ratio $\tau$ depends on the substrate material, and is approximately 15 for 36° Y-cut X-propagation $LiTaO_3$ according to the experiment. Hence, the equation (17) can be rewritten as follows:

$$\alpha = 6.67\times10^{-2}/\left(4.22\sqrt{P} - 1\right). \quad (18)$$

When P=1, then $\alpha$=0.02, and $\Delta f$=19 MHz for the embodiment shown in FIG. 47 having $f_{rs}$ of 948 MHz. That is, the equation (18) stands.

An increase in $\Delta f$ is effective for a piezoelectric substrate material having a small capacitance ratio $\tau$, that is a substrate material having a large electromechanical coupling coefficient. The equation (17) is obtained for such a substrate material.

The capacitance ratio $\tau$ is proportional to the reciprocal of the electromechanical coupling coefficient $k^2$. The value of the ratio $\tau$ for 64° Y-cut X-propagation $LiNbO_3$ ($k^2$=0.11) and the value of the ratio $\tau$ for 41° Y-cut X-propagation $LiNbO_3$ are respectively 6.8 and 4.4. The above values are obtained using the $\tau$ value of 36° Y-cut X-propagation $LiTaO_3$ and $k^2$=0.05 (see K. Yamanouchi et al., "Applications for Piezoelectric Leaky Surface Wave", 1990 ULTRASONIC SYMPOSIUM Proceedings, pp.11–pp.18, 1990).

FIG. 53 shows the relation between the capacitance ratio $\tau$ and the electromechanical coupling coefficient $k^2$, which is obtained using the values of $k^2$ and $\tau$ of 36° Y-cut X-propagation $LiTaO_3$ and using such a relation that $k^2$ is proportional to the reciprocal of $\tau$.

From the relation shown in FIG. 53, the values of the capacitance ratios $\tau$ of 64° and 41° Y-cut X-propagation $LiNbO_3$ substrates can be obtained and are equal to 6.8 and 4.4, respectively.

The structure of the embodiment shown in FIGS. 44 and 46 will now be described. The SAW filter 240 comprises a 36° Y-cut X-propagation $LiTaO_3$ substrate 241, and has dimensions of 1.5 mm×2 mm×0.5 mm. From the input side of the filter 240, a parallel-arm resonator Rp1, a series-arm resonator Rs1, a parallel-arm resonator Rp2, a series-arm resonator Rs2, and a parallel-arm resonator Rp3 are arranged in that order. Each of the resonators has reflectors (short-circuit type) 242 respectively provided on both sides of the electrode having an aperture length of 180 $\mu$m and 50 finger pairs. Each of the reflectors 242 has 50 finger pairs.

The parallel-arm resonators are the same as the series-arm resonators except for the periods of the interdigital electrodes. The period $\lambda_p$ of the electrode of each parallel-arm resonator is 4.39 $\mu$m (the ratio between the pattern width and the gap is 1:1 and hence the pattern width is approximately 1.1 $\mu$m (=$\lambda_p$/4)), and the period of the electrode of each series-arm resonator is 4.16 $\mu$m (the pattern width is 1.04 $\mu$m (=$\lambda_s$/4)).

The respective periods are selected using the following equations so that the resonance frequencies ($f_{rp}$, $f_{rs}$) of the respective resonators are equal to the respective predetermined values ($f_{rp}$=893 MHz, $f_{rs}$=942 MHz):

$$\lambda_s \neq V_m/f_{rs}$$

$$\lambda_p \neq V_m/f_{rp}$$

where $V_m$ is the sound velocity of the surface wave propagating in the 36° Y-cut X-propagation $LiTaO_3$ crystal for an electrode thickness of 3000 Å, and is experimentally 3920 m/s.

Figure 45:
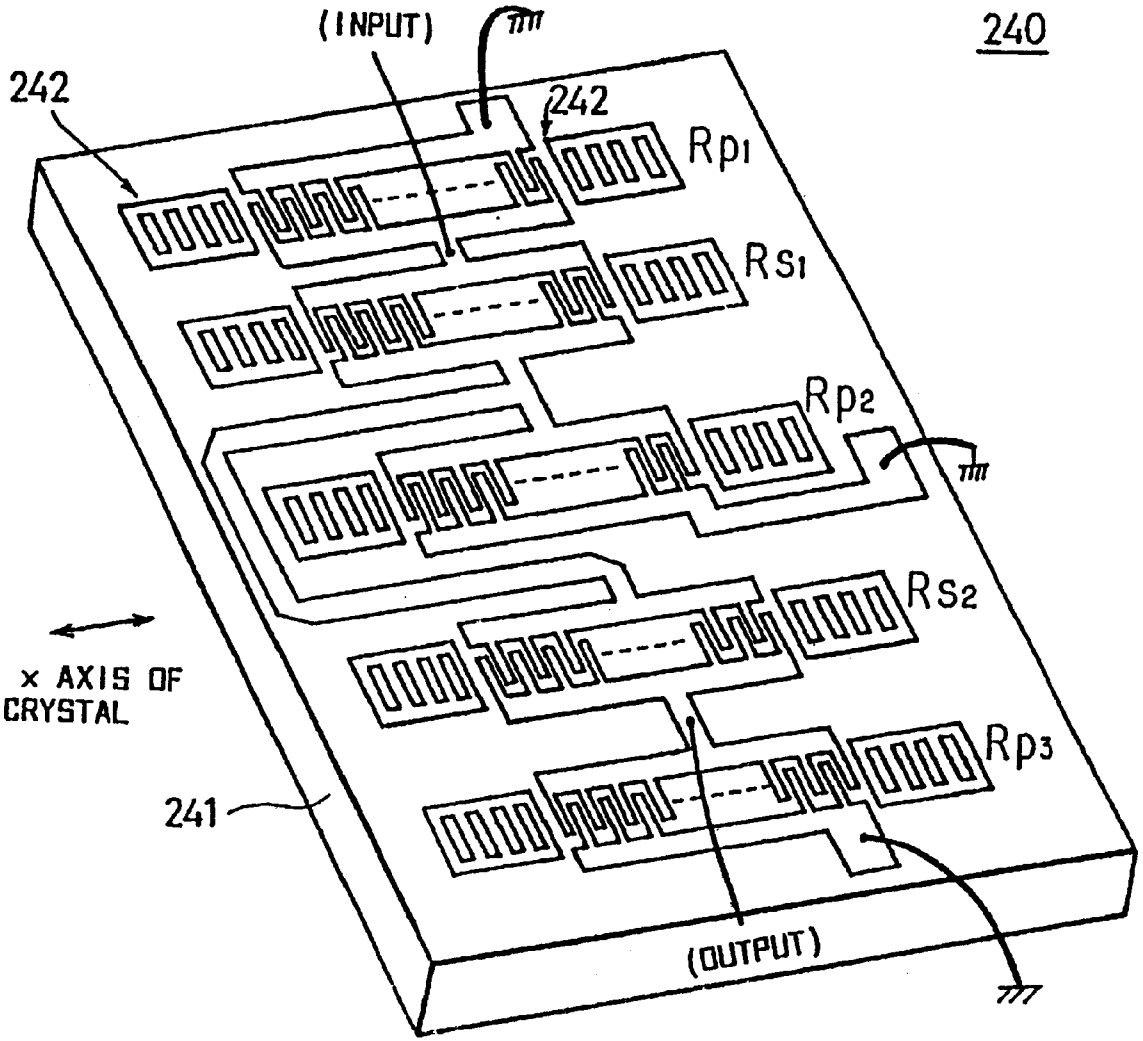
FIG. 45 is a perspective view of the SAW filter shown in FIG. 44.

The SAW filter 240 having the above structure has a band-pass characteristic having a broad pass band and a low loss, as shown in FIG. 47C, in which $\Delta f$=19 MHz. When only the pattern width $\lambda_p$ in FIG. 45 is changed to 4.35 $\mu$m, then $\Delta f$ becomes 10 MHz, and the characteristic shown in FIG. 47B is obtained. The electrode is made of an Al-Cu alloy and is 3000 Å thick, and is arranged so that the surface wave is propagated in the X direction of the piezoelectric substrate 241.

A description will now be given of piezoelectric substrates other than 36° Y-cut X-propagation $LiTaO_3$. The capacitance ratio $\tau$ of 64° Y-cut X-propagation $LiNbO_3$ is 6.8, and an equation corresponding to the equation (17) is written as follows:

$$\alpha = 1.47\times10^{-1}/\left(4.37\sqrt{P} - 1\right). \quad (19)$$

The capacitance ratio $\tau$ of 41° Y-cut X-propagation $LiNbO_3$ is 4.4, and an equation corresponding to the equation (17) is written as follows:

$$\alpha = 2.273\times10^{-1}/\left(4.52\sqrt{P} - 1\right). \quad (20)$$

As the $\tau$ value decreases, that is, the electromechanical coupling coefficient increases, $\alpha$ increases, and the characteristic deteriorates little even if $\Delta f$ increases.

A description will now be given of a twelfth embodiment of the present invention with reference to FIGS. 54 through 57. A SAW filter 250 according to the twelfth embodiment of the present invention is a ladder-type SAW filter having a plurality of basic units (unit sections), each having a SAW resonator in the parallel arm and a SAW resonator in the series arm, and establishes image impedance matching between adjacent unit sections in order to reduce a loss at each connection node. With the above arrangement, it becomes possible to reduce the insertion loss in the pass band.

Figure 58A:
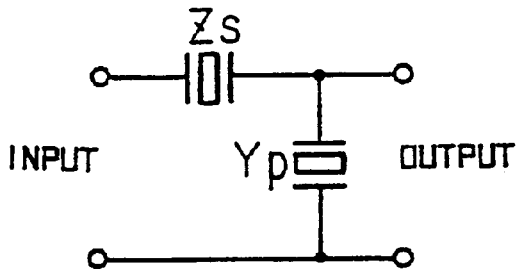
FIGS. 58A and 58B are circuit diagrams of unit sections.
Figure 58B:
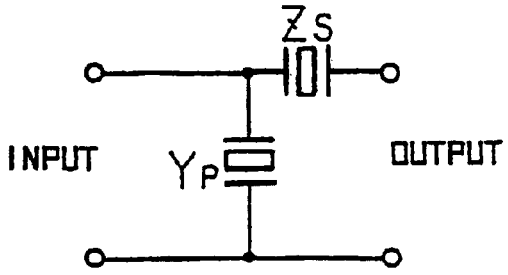

The twelfth embodiment of the present invention was made with the following consideration. As shown in FIGS. 58A and 58B, a band-pass characteristic can be obtained by means of at least one parallel-arm resonator and at least one series-arm resonator. The ladder-type connection comprising one parallel-arm resonator and one series-arm resonator is the unit section of the filter.

Figure 59A:
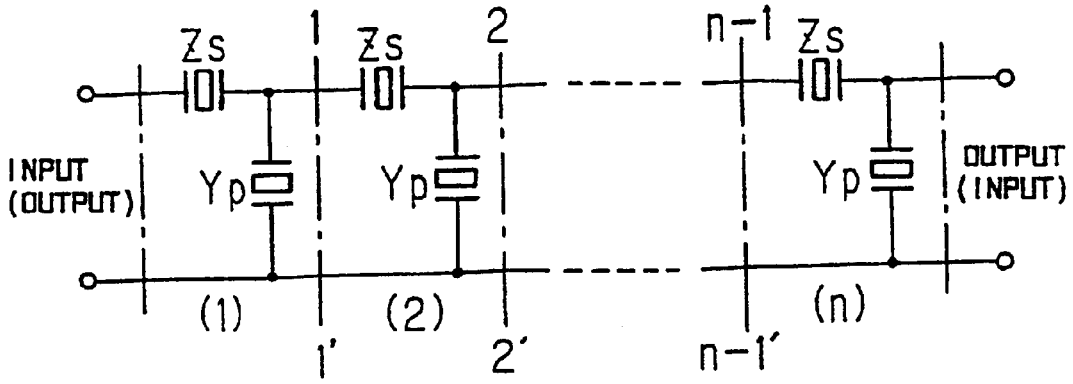
FIGS. 59A, 59B and 59C are circuit diagrams showing multi-connections of unit sections.
Figure 59B:
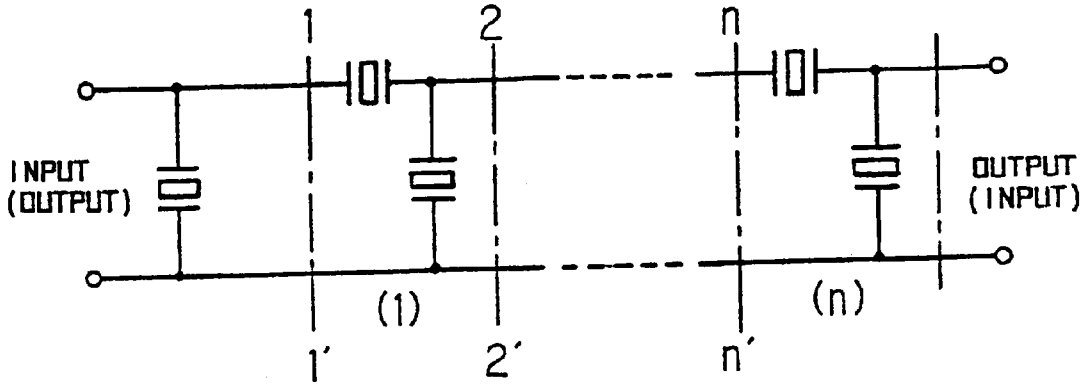
Figure 59C:
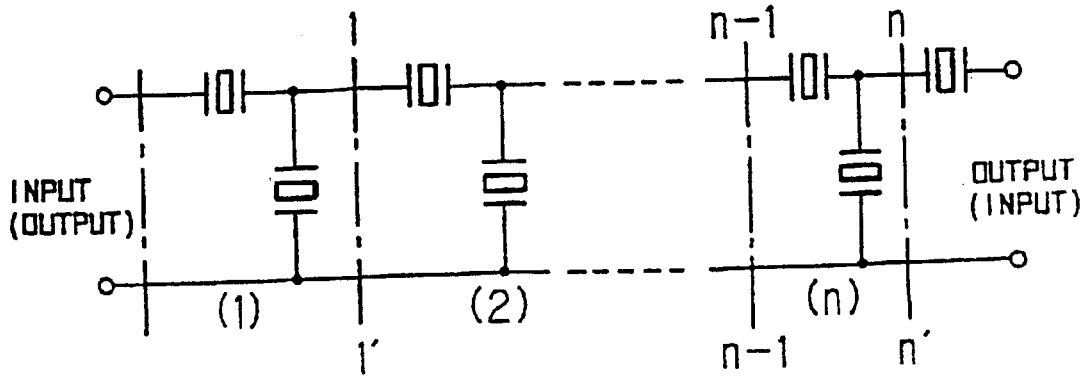

It is desirable that the resonance frequency of the series-arm resonator be equal to or higher than the antiresonance frequency of the parallel-arm resonator. Two unit sections respectively shown in FIGS. 58A and 58B are available. The series arm of the unit section shown in FIG. 58A series as the input terminal, and the series arm of the unit section shown in FIG. 58B serves as the output terminal. A multi-stage connection comprising a plurality of unit sections is categorized into one of three types shown in FIGS. 59A, 59B and 59C. FIG. 59A shows an arrangement in which either the input or the output is a series arm and the other is a parallel arm (asymmetrical type). FIG. 59B shows an arrangement in which both the input and the output are parallel arms (symmetrical type). FIG. 59C shows an arrangement in which both the input and output are series arms (symmetrical type).

The insertion loss of the multi-stage connection having n unit sections in n times that of the unit section, and the side lobe suppresion factor thereof is also n times that of the unit section. Generally, the insertion loss increases, while the side lobe suppression is improved. Particularly when the insertion loss is approximately zero, the multi-stage connection is an effective means. However, the insertion loss will be larger than n times that of the unit section unless the impedance matching between the adjacent unit section is good. If the impedance matching is poor, power is reflected at the interfaces between adjacent unit sections (each of the interfaces 1-1'-n-n'). The reflection of power increases the insertion loss. When the power reflection occurring at an interface between adjacent unit sections is denoted by Γ, the loss is expressed as n10log(Γ). Hence, it is important to suppress increase in the insertion loss by establishing an impedance match between adjacent unit sections and suppressing power reflection at each interface between two adjacent unit sections.

Figure 60:
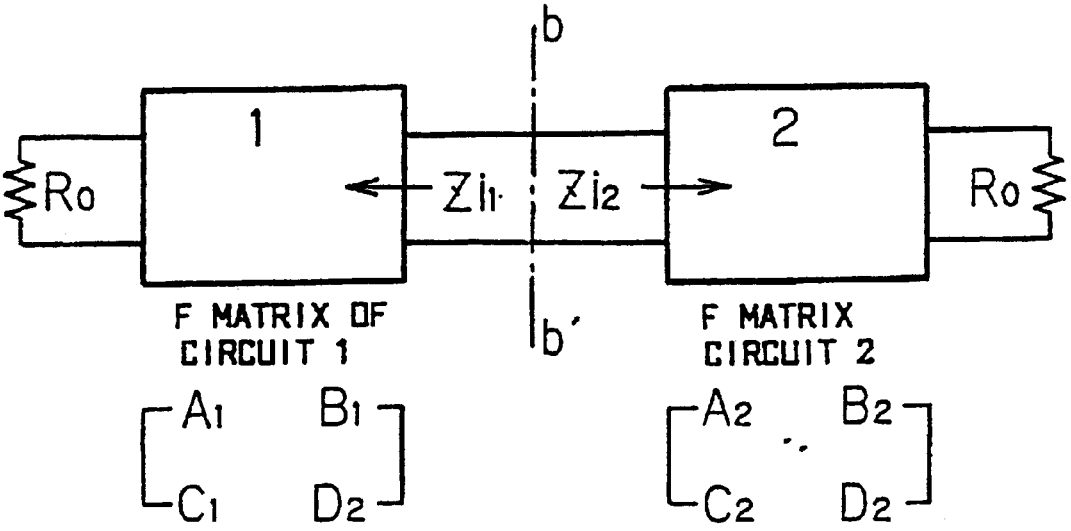
FIG. 60 is a diagram showing a connection of two four-terminal circuits and an interface therebetween.

A description will now be given of a method for matching the impedances of adjacent unit sections. As shown in FIG. 60, when two circuits 1 and 2, each having four different terminal constants (four parameters A, B, C and D of an F matrix), are connected to each other so that the impedance matching therebetween is established, the circuits are designed so that image impedances obtained by viewing the circuits 1 and 2 from an interface b-b' are equal to each other. An image impedance $Z_{i1}$ obtained by viewing the circuit 1 from the interface b-b' can be expressed as follows, using four terminal constants $A_1$, $B_1$, $C_1$ and $D_1$ of the circuit 1:

$$Z_{f1} = \sqrt{D_1B_1/C_1A_1}\,. \tag{21}$$

Similarly, an image impedance $Z_{i2}$ obtained by viewing the circuit 2 from the interface b-b' can be expressed as follows:

$$Z_{f2} = \sqrt{A_2B_2/C_2D_2}\,. \tag{22}$$

The image impedances $Z_{i1}$ and $Z_{i2}$ are determined regardless of a load resistance (pure resistance) $R_o$.

When the equations (21) and (22) are equal to each other, the following impedance matching condition can be obtained:

$$D_1B_1/C_1A_1=A_2B_2/C_2D_2 \tag{23}$$

Figure 61A:
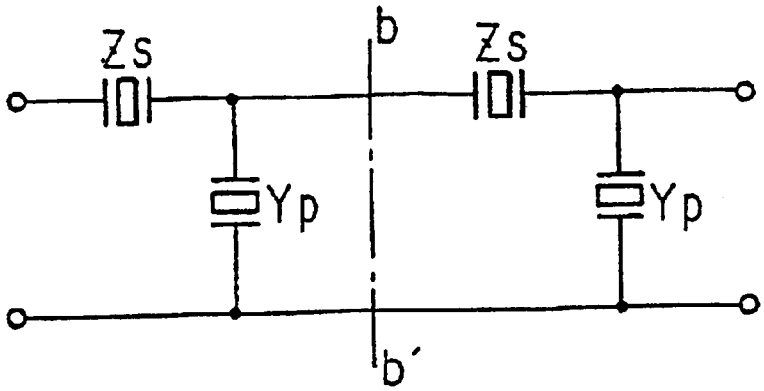
FIGS. 61A, 61B and 61C are circuit diagrams showing unit section connecting ways.

FIG. 61A shows a connection having poor impedance matching, and the condition of the equation (23) is not satisfied. The reflection factor Γ obtained by viewing the right circuit from the interface b-b' is expressed as follows:

$$\Gamma=(Z_sY_p)/(2+Z_sY_p) \tag{24}$$

The values of the $Z_s$ and $Y_p$ of a practical element are not equal to zero, and hence the reflection factor Γ thereof is not zero.

Figure 61B:
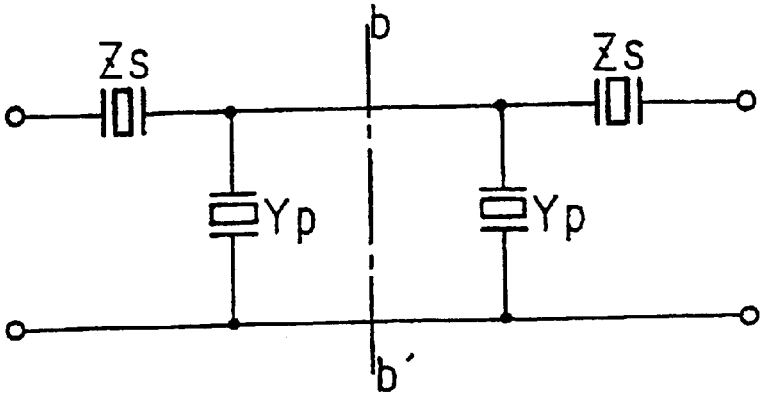

In a connection shown in FIG. 61B, an image impedance $Z_{i1}$ obtained by viewing the left circuit from the interface b-b' is obtained as follows, using the equation (21):

$$Z_{f1} = \sqrt{Z_s/Y_p(1+Z_sY_p)}\,. \tag{25}$$

An image impedance $Z_{i2}$ obtained by viewing the right circuit from the interface b-b' can be obtained using the equation (22). It will be noted that $Z_{i2}=Z_{i1}$. Hence, the impedance matching is established, and the reflection factor Γ at the interface b-b' is zero. The above holds true for a connection shown in FIG. 61C.

Figure 61C:
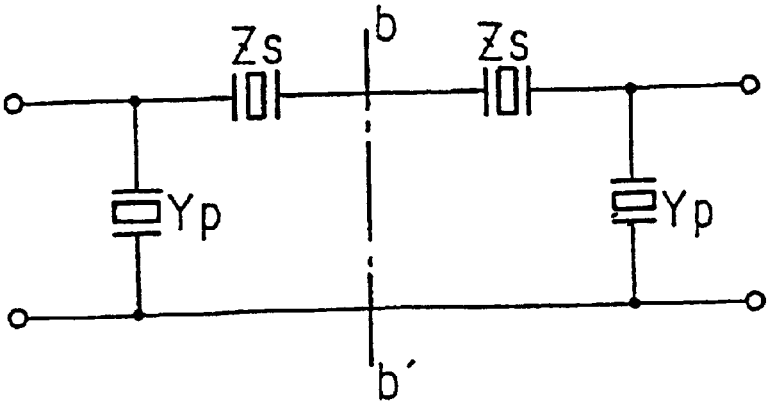
Figure 62:
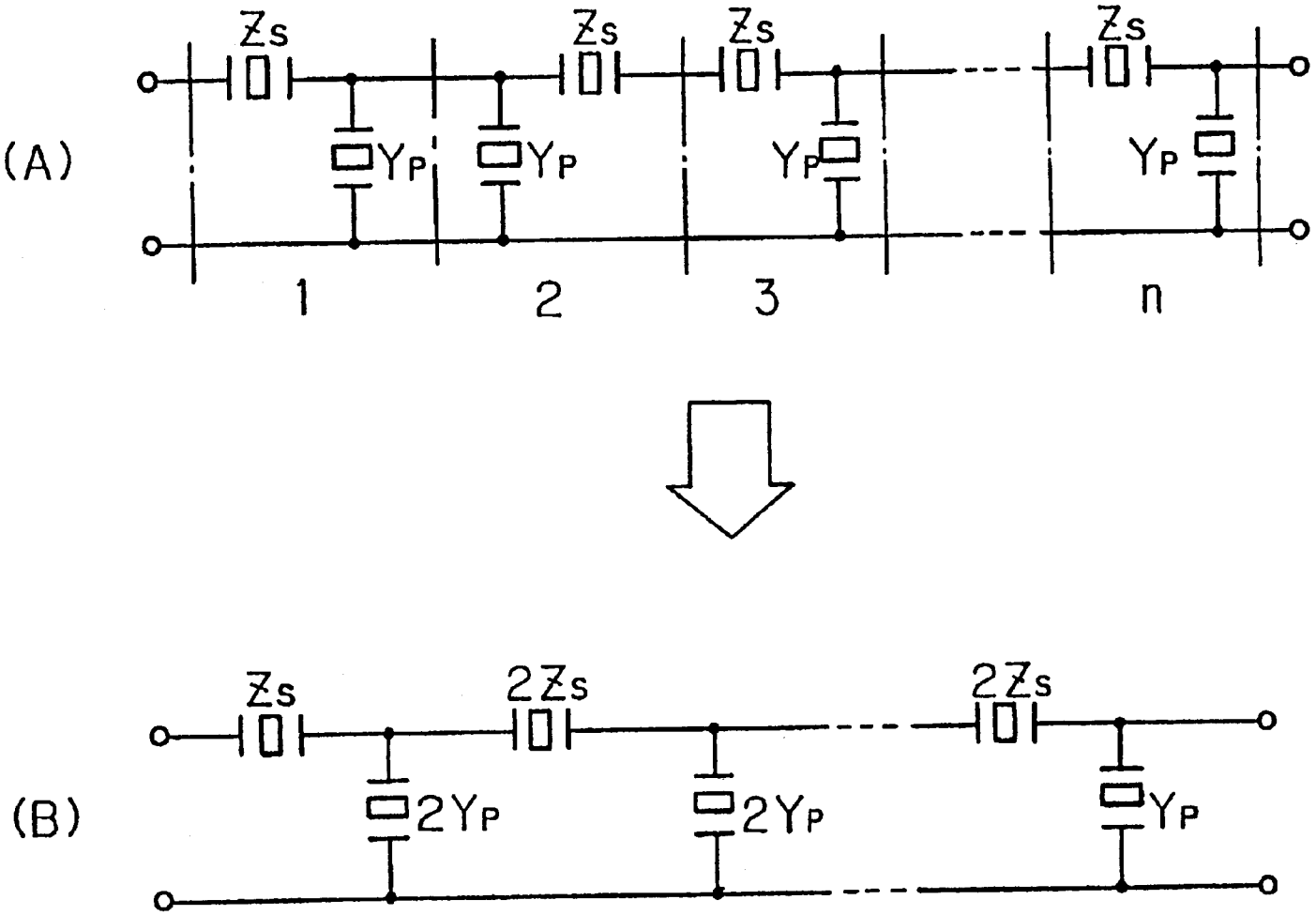
FIG. 62 is a diagram showing how n unit sections are cascaded.

A description will now be given of a method for cascading a plurality of unit sections in the manner shown in FIG. 61B or 61C. FIG. 62-(A) shows a circuit comprising n unit sections (n>2), in which the connection method shown in FIG. 61B and the connection method shown in FIG. 61C are alternatively employed. It will be seen from the above description that there is no reflection at each interface.

The circuit shown in (A) of FIG. 62 can be modified, as shown in (B) of FIG. 62, in which two resonators respectively in adjacent parallel nodes are integrated and two adjacent resonators in the series arm are also integrated. The series-arm resonator closest to the input of the filter has an impedance value half that of the resonators located inside the above series-arm resonator. Similarly, the parallel-arm resonator closest to the output of the filter has an admittance value half that of the resonators located inside the above parallel-arm resonator.

Figure 63A:
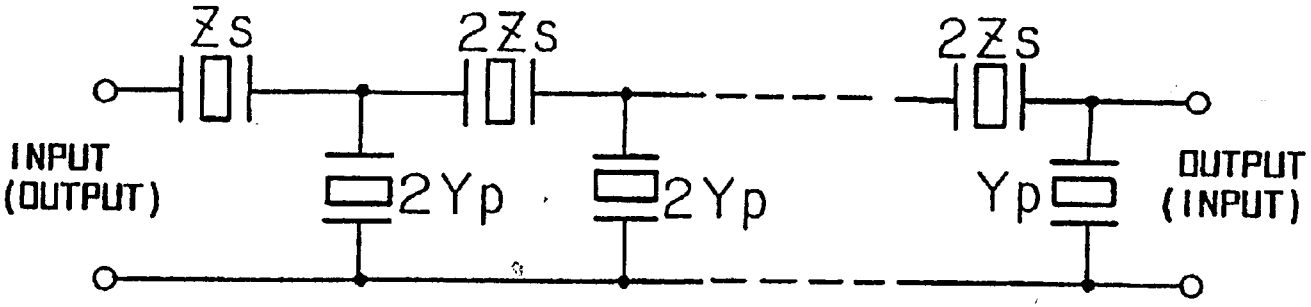
FIGS. 63A, 63B and 63C are circuit diagrams showing how ladder-type circuits are configured using the unit sections.
Figure 63B:
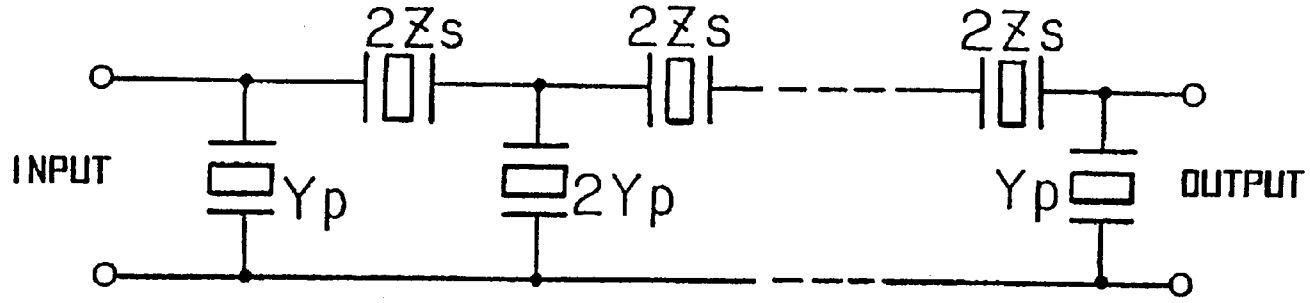
Figure 63C:
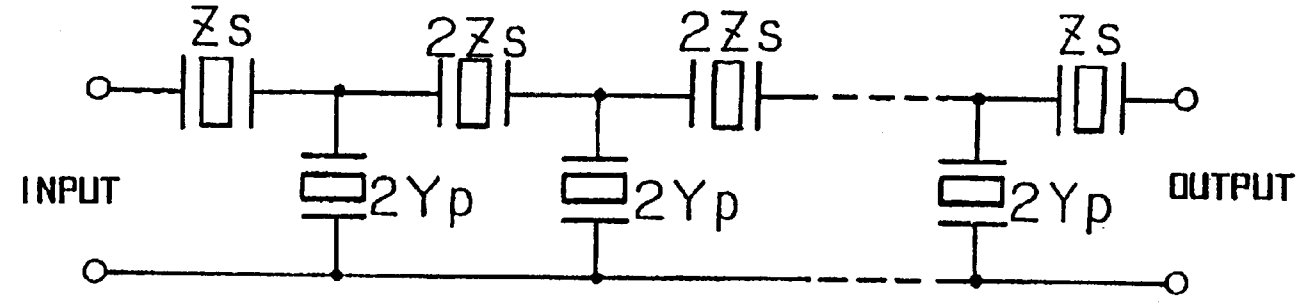

FIGS. 63A, 63B and 63C show configurations obtained by applying the above modifying method shown in FIG. 62 to the configurations shown in FIGS. 59A, 59B and 59C, respectively. More particularly, FIG. 63A shows an impedance matching method corresponding to the matching method shown in FIG. 59A, in which either the input or output of the filter is the series arm and the other is the parallel arm. In the configuration shown in FIG. 63A, the impedance of the series-arm resonator located at one end of the filter is half that of each inner series-arm resonator, and the admittance of the parallel-arm resonator located at the other end of the filter is half that of each inner parallel-arm resonator.

FIG. 63B shows an impedance matching method corresponding to the matching method shown in FIG. 59B. In the configuration shown in FIG. 63B, each of two parallel-arm resonators located at respective ends thereof has an admittance value half that of the inner parallel-arm resonator.

FIG. 63C shows an impedance matching method corresponding to the matching method shown in FIG. 59C. In the configuration shown in FIG. 63C, each of the two series-arm resonators located at respective ends thereof has an impedance value half that of the inner series-arm resonators.

Figure 54:
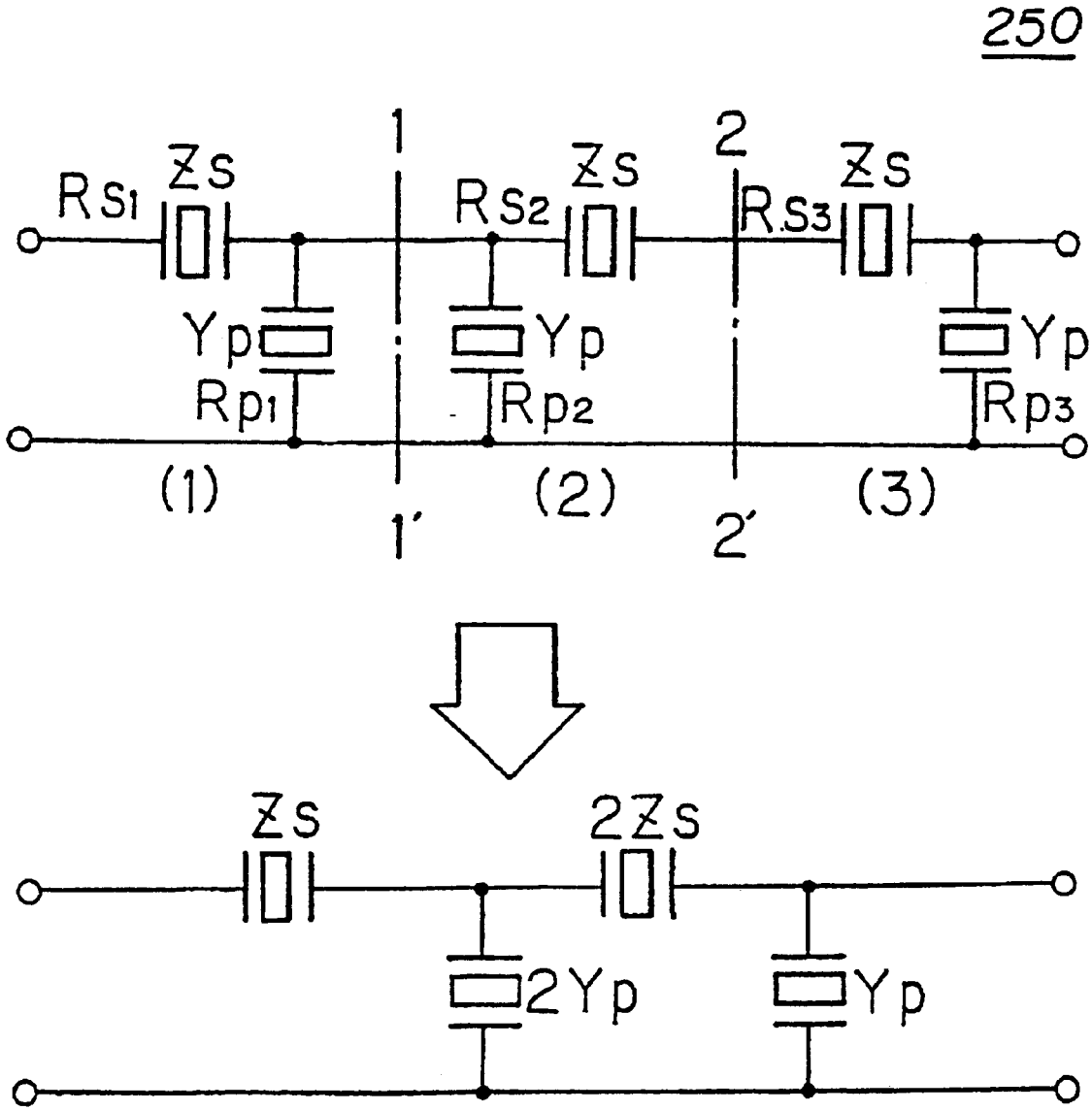
FIG. 54 is a circuit diagram of a SAW filter according to a twelfth embodiment of the present invention.
Figure 55:
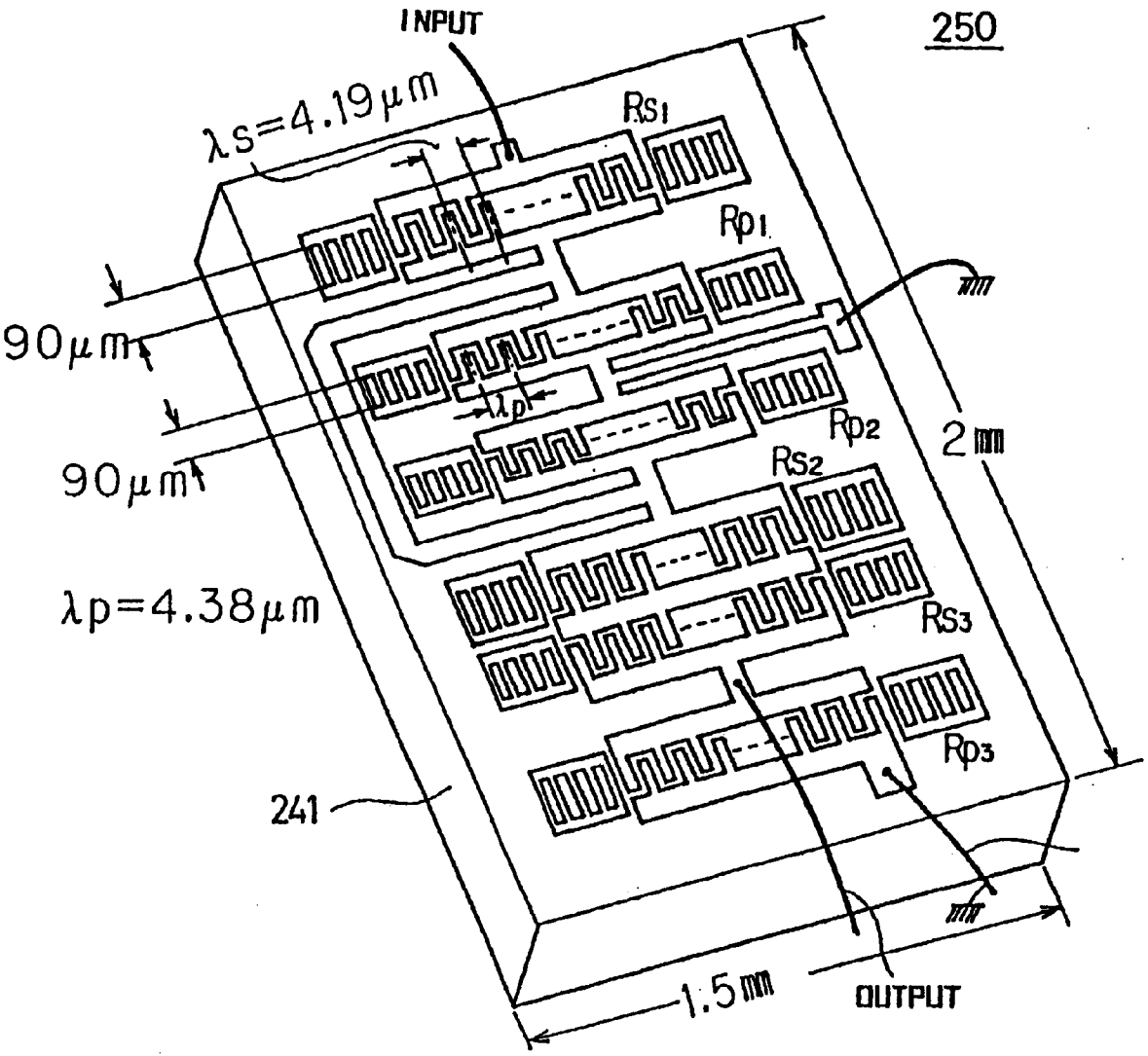
FIG. 55 is a perspective view of the SAW filter shown in FIG. 54.

A further description will now be given of the twelfth embodiment of the present invention based on the above-mentioned concept. The SAW filter 250 according to the twelfth embodiment has the equivalent circuit shown in FIG. 54, and the practical structure shown in FIG. 55. As shown in FIG. 54, it has three series-arm resonators Rs1, Rs2 and Rs3, and three parallel-arm resonators Rp1, Rp2 and Rp3. Each of the six resonators has an identical aperture length (90 μm), and an identical number of finger pairs (100). Each of the resonators has two short-circuit-type reflectors respectively located on two opposite sides of the interdigital electrode in order to increase Q. Each of the reflectors has approximately 100 finger pairs. The series-arm resonators Rs1, Rs2 and Rs3 have an identical finger period ($\lambda_s$) of 4.19 μm. The parallel-arm resonators Rp1, Rp2 and Rp3 have an identical finger period $\lambda_p$ of 4.38 μm, which is different from the value of $\lambda_s$.

FIG. 64 shows a [conventional] *comparative example of the* SAW filter [related to the SAW filter] 250 according to the twelfth embodiment of the present invention *as a related art*. In each of the filters shown in FIGS. 54 and 64, the design specification of each series-arm SAW resonator indicated by impedance $Z_s$ is such that the aperture length is 90 μm and the number of finger pairs is 100. The design specification of each parallel-arm SAW resonator indicated by admittance $Y_p$ is the same as the above design specification. The piezoelectric substrate crystal is made of 36° Y-cut X-propagation $LiTaO_3$. On the crystal substrate, an interdigital pattern for each SAW resonator formed with an Al alloy pattern having a thickness of 3000 Å is provided.

Figure 56:
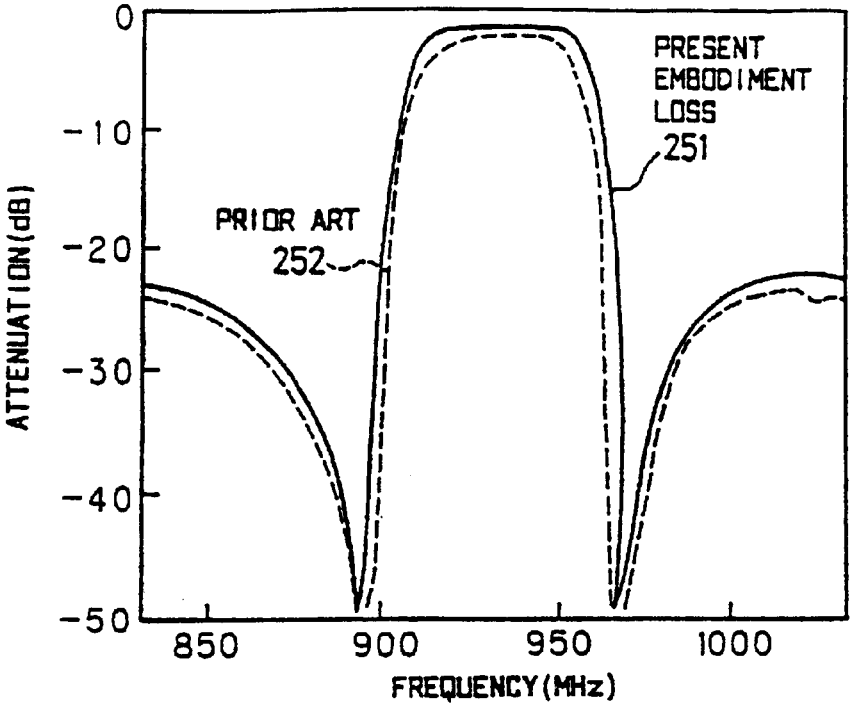
FIG. 56 is a diagram showing a filter characteristic of the SAW resonator shown in FIG. 53.

Curve 251 of the solid line shown in FIG. 56 indicates the characteristic of the filter 250. Curve 252 of the broken line shown in FIG. 56 indicates the characteristic of the filter shown in FIG. 64. It can be seen from FIG. 56 that the filter 250 has an insertion loss less than that of the filter shown in FIG. 64, and particularly the insertion loss at both ends of the pass band in the filter 250 is greatly improved.

Figure 57:
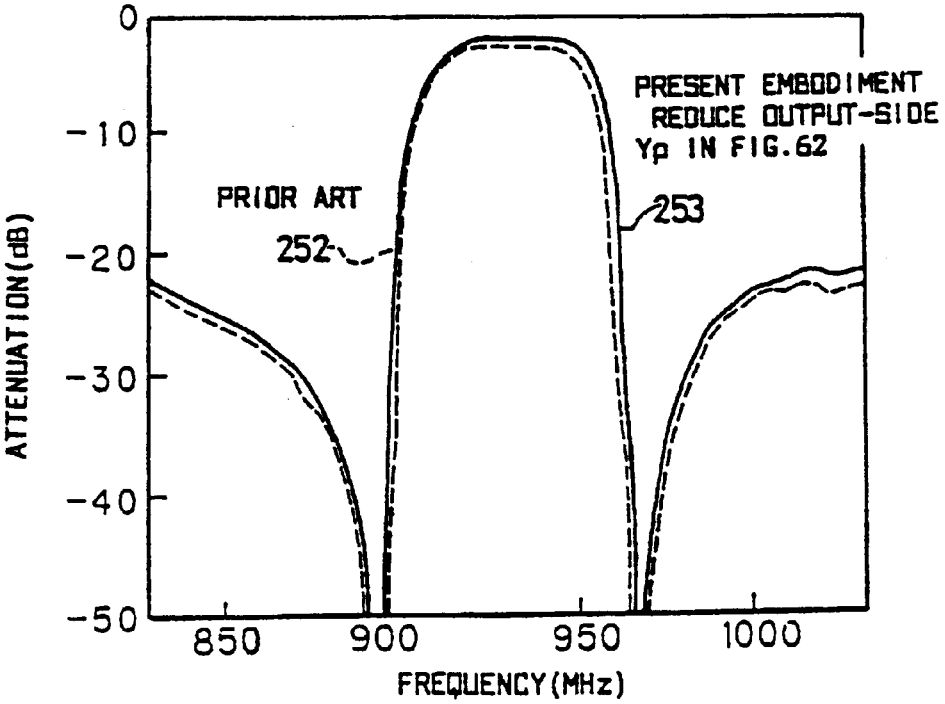
FIG. 57 is a diagram showing a characteristic obtained when an output-side admittance of the filter shown in FIG. 64 is reduced.

Curve 253 shown in FIG. 57 shows a band characteristic of the [conventional] *comparative* filter shown in FIG. 64, in which the number of finger pairs of only the parallel-arm resonator indicated by admittance $Y_p$ is reduced from 100 to 80 to thereby reduce the value of the admittance $Y_p$. It can be seen from FIG. 57 that the insertion loss in the pass band is improved. It may be said that the insertion loss can be somewhat improved even by reducing the admittance of the resonator at the end of the filter by a quantity less than ½. The above holds true for impedance.

The embodiment based on the basic structure shown in FIG. 63A has been described. A variation in which a number of unit sections are provided at the center of the filter has the same advantages as the above embodiment.

Figure 65:
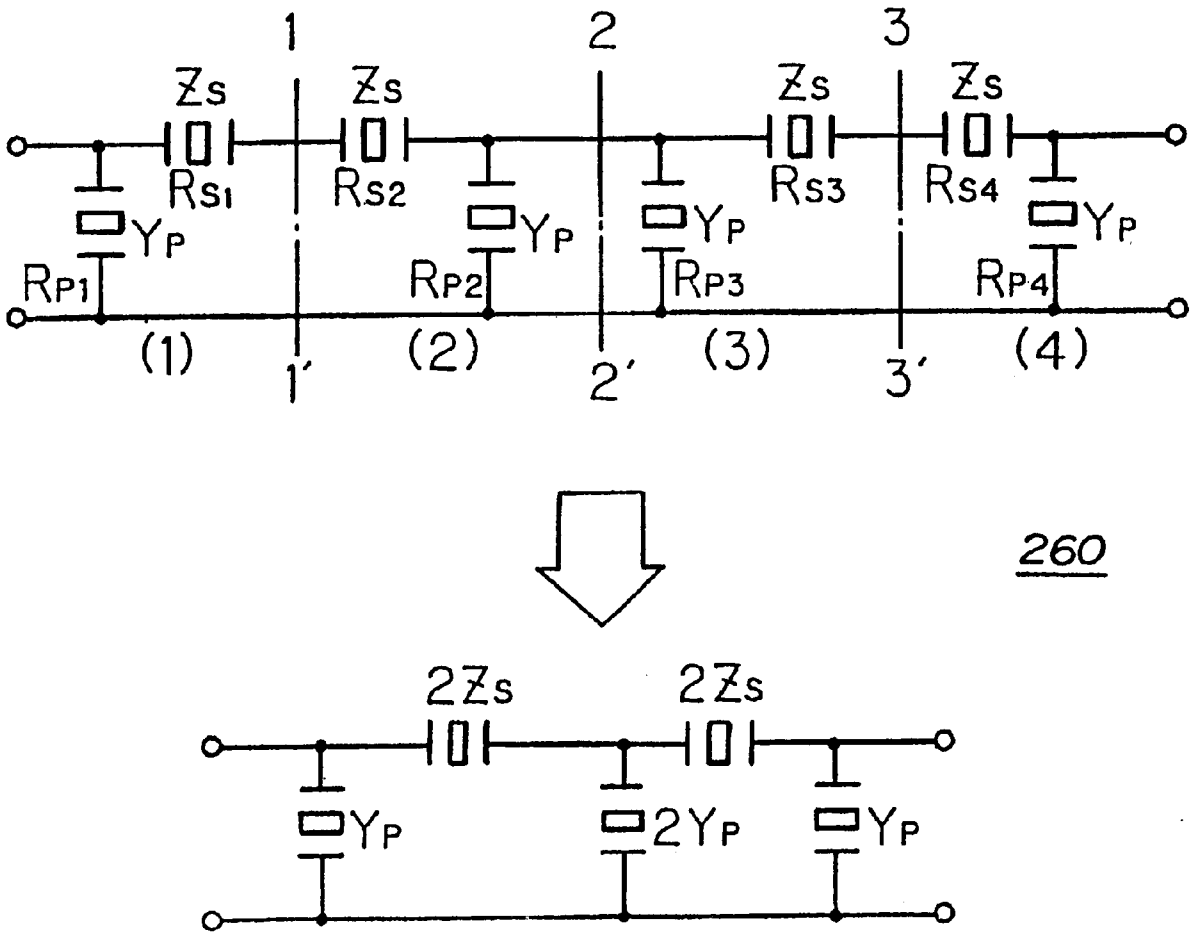
FIG. 65 is a circuit diagram of a SAW filter according to a thirteenth embodiment of the present invention.

A description will now be given, with reference to FIG. 65, of a SAW filter 260 according to a thirteenth embodiment of the present invention. The SAW filter 260 is based on the basic structure shown in FIG. 63B, and has the same insertion loss improvement as shown by the curve 251 in FIG. 56.

Figure 66:
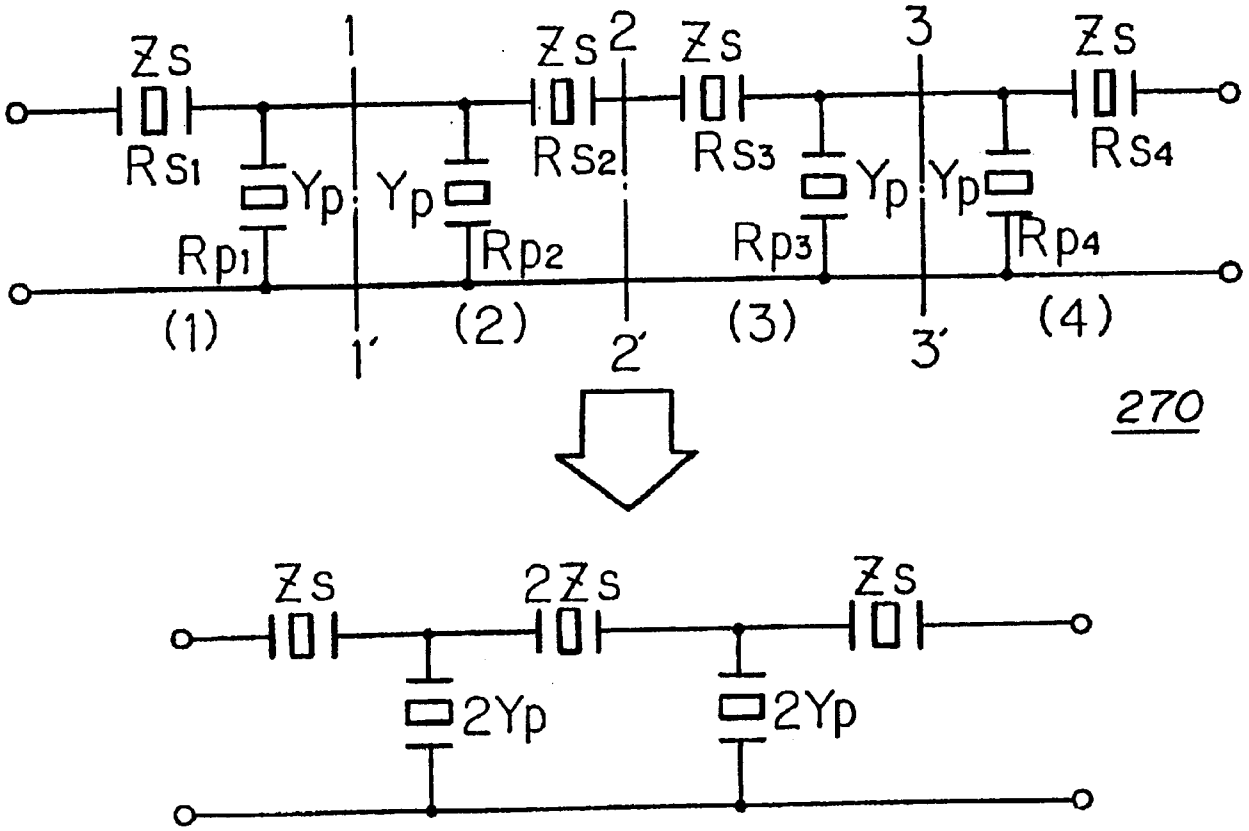
FIG. 66 is a circuit diagram of a SAW filter according to a fourteenth embodiment of the present invention.

FIG. 66 shows a SAW filter 270 according to a fourteenth embodiment of the present invention. The filter 270 is based on the basic structure shown in FIG. 63C. The filter 270 has the same insertion loss improvement as shown by the curve 251 in FIG. 56.

Figure 67:
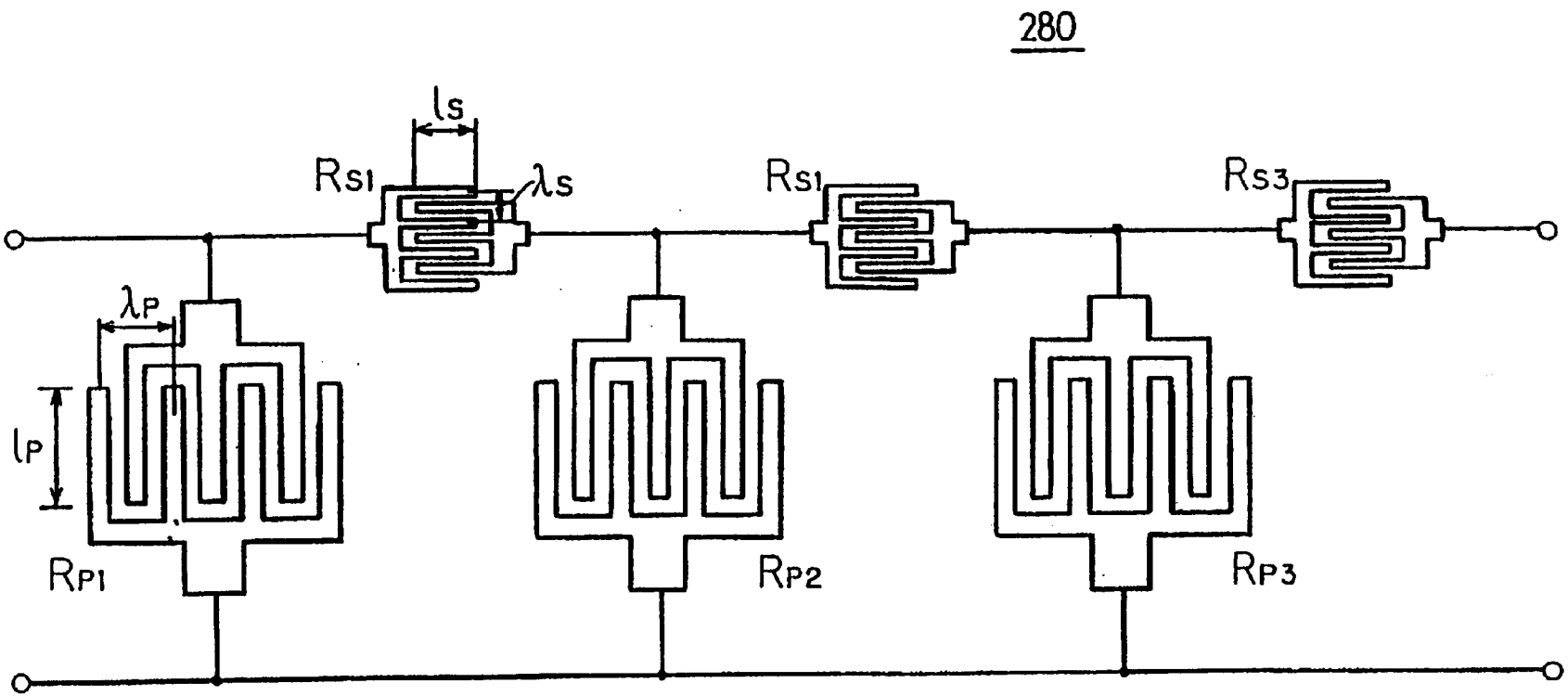
FIG. 67 is a diagram showing a SAW filter according to a fifteenth embodiment of the present invention.
Figure 68:
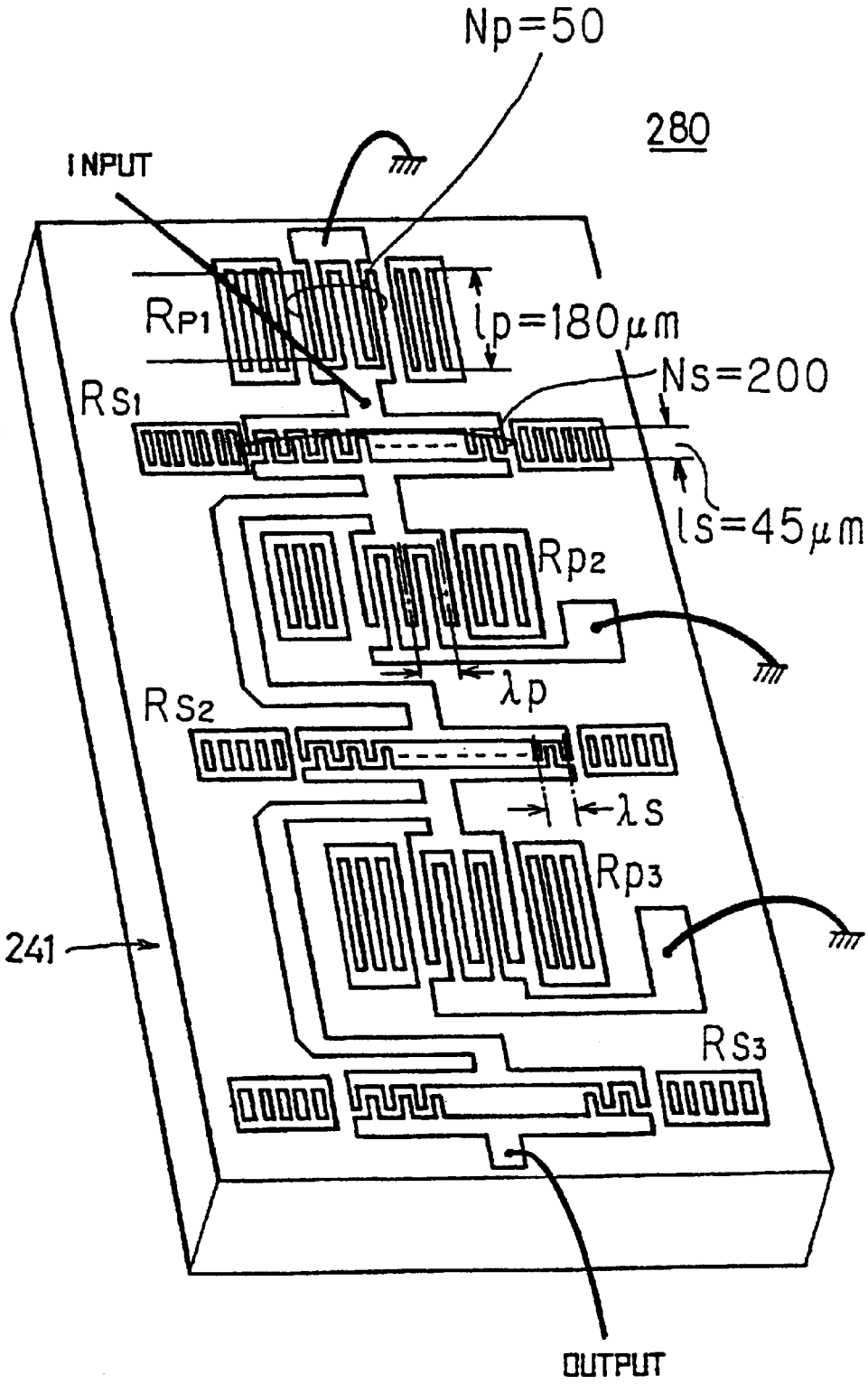
FIG. 68 is a perspective view of the SAW filter shown in FIG. 67.

FIGS. 67 and 68 show a SAW filter 280 according to a fifteenth embodiment of the present invention. The present embodiment is based on such a consideration that the insertion loss depends on a resistance component, and a conductance component of the interdigital electrode. With the above in mind, the fifteenth embodiment is intended to reduce the resistance component of each series-arm resonator and reduce the conductance component of each parallel-arm resonator and to thereby reduce the total insertion loss of a filter in which resonators make a ladder-type connection.

Referring to FIG. 67, SAW resonators $R_{s1}$, $R_{s2}$ and $R_{s3}$ are provided in the series arm, and SAW resonators $R_{p1}$, $R_{p2}$ and $R_{p3}$ are provided in the respective parallel arms. The resonance frequency $f_{rs}$ of each of the resonators in the series arm is different from the resonance frequency $f_{rp}$ of each of the resonators in the parallel arms.

It will now be assumed that the admittance of each parallel-arm resonator is expressed as follows:

$$Y_p=g+j\cdot b \tag{26}$$

where g denotes a conductance component, and b denotes a susceptance. Further, it will be assumed that the impedance of each series-arm resonator is expressed as follows:

$$Z_s=r+j\cdot x \tag{27}$$

where r denotes a resistance component, and x denotes a reactance component.

Figure 71A:
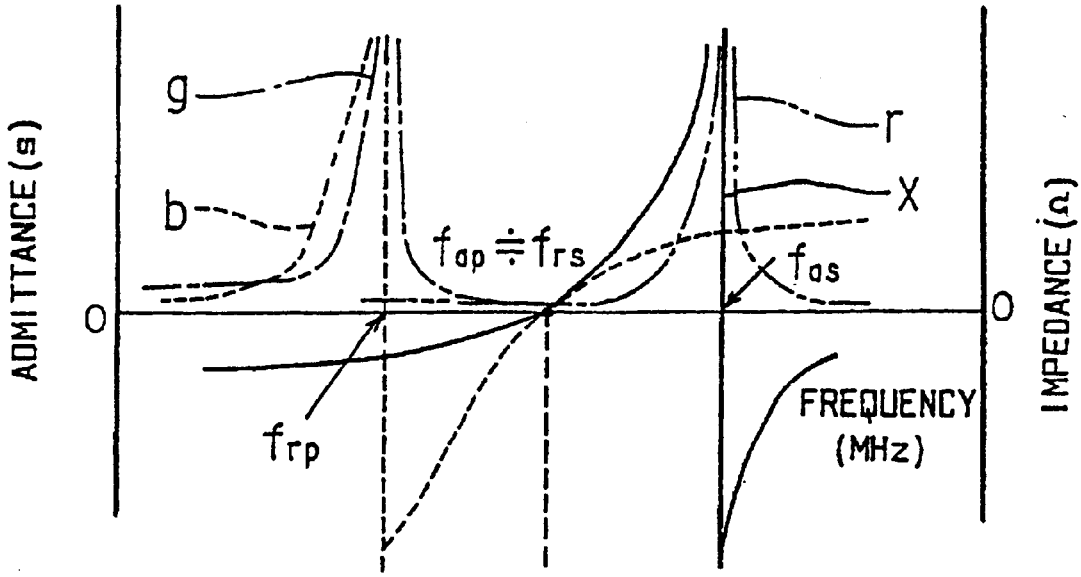
FIGS. 71A and 71B are diagrams showing a frequency characteristic of the admittance of the parallel-arm resonator and a frequency characteristic of the impedance of the series-arm resonator.
Figure 71B:
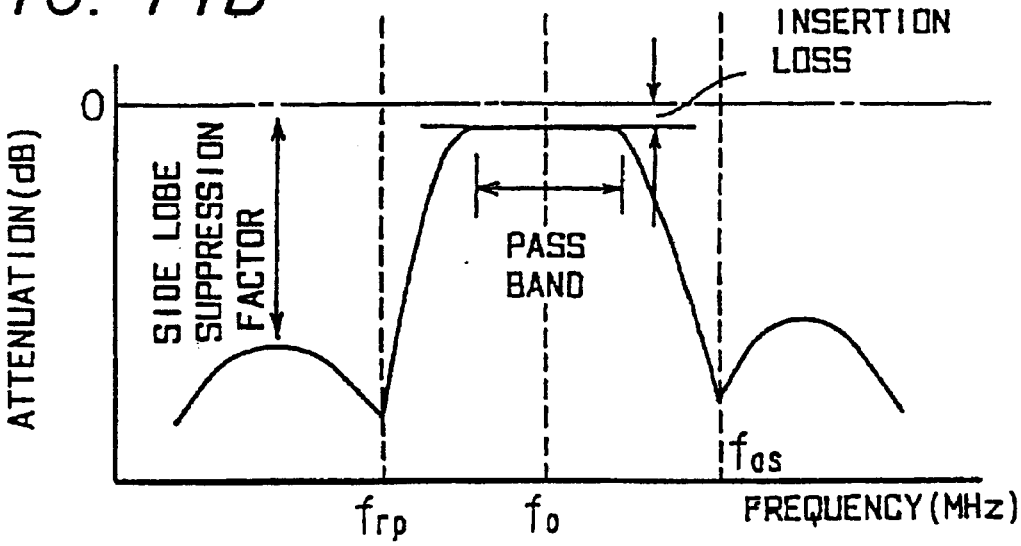

Under the above assumptions, the frequency characteristics of g, b, r and x are as shown in FIG. 71. The susceptance component b (indicated by the dot chained line) of the admittance $Y_p$ of the parallel-arm resonator has the largest value at the resonance frequency $f_{rp}$, at which the sign thereof changes from + to −. Further, the susceptance component b becomes zero at the antiresonance frequency $f_{ap}$, at which the sign thereof changes from − to +. The conductance component g (one-dot chain line) has the largest value is at the resonance frequency $f_{rp}$ and rapidly decreases and approaches zero. The value of the conductance component g assumes only the plus sign.

The reactance component x (indicated by the solid line in FIG. 71) of the impedance $Z_s$ of the series-arm resonator becomes zero at the resonance frequency $f_{rs}$, and the largest value at the antiresonance frequency $f_{as}$. Further, the sign of the reactance component x changes from + to −, and approaches zero from the minus side in a range higher than $f_{as}$. The resistance component r gradually increases from zero to the largest value at the antiresonance frequency $f_{as}$, and then gradually decreases. The resistance component r assumes only the plus sign.

In order to obtain a filter characteristic, the antiresonance frequency $f_{ap}$ of the parallel-arm resonator is equal to or slightly smaller than the resonance frequency $f_{rs}$ of the series-arm resonator.

A graph depicted in the lower portion of FIG. 71 shows the band characteristic of the filter circuit. The pass band is formed around $f_{ap}\approx f_{rs}$, and the other frequency range serves as an attenuation range. It can also be seen from FIG. 71 that b and x are respectively zero around the center frequency of the pass band. Hence, the pass band characteristic of the filter is determined by only r and g, and the following is obtained:

$$S21=100/(100+r+50r\cdot g+2500\ g) \tag{28}$$

Since r>0 and g>0, S21 becomes smaller than 1 as both r and g increase, and the insertion loss written as 20log¦S21¦ also increases. Hence, the insertion loss decreases as both r and g are closer to zero.

A description will now be given of a consideration concerning which part of the interdigital electrode is related to the resistance component r and the conductance component g. The above consideration takes into account a resistance $r_1$ inserted in the equivalent circuit shown in FIG. 5B. The resistance $r_1$ is the sum of the electric resistance component of the interdigital electrode and an acoustic resistance component corresponding to an energy loss encountered while bulk waves generated from ends of the fingers are propagated inside the substrate. The resistance component resulting from emission of bulk waves is little dependent on the shape of the interdigital electrodes, and $r_1$ is hence proportional to the electric resistance [$r_1$] of the interdigital electrode. Particularly, $r=r_1$ around the center frequency of x=0.

The conductance component g of the admittance of the parallel-arm resonator is proportional to the conductance $1/r_1$ of the electric resistance of the interdigital electrode.

The following equation is known:

$$r=l_s\cdot\rho_o/(N_s\cdot W\cdot t) \tag{29}$$

where $\rho_o$ denotes the resistivity of the fingers of the interdigital electrodes, W denotes the width of each finger, t denotes the film thickness of each finger, $l_s$ denotes the aperture length of the series-arm resonator, and $N_s$ denotes the number of finger pairs.

The conductance component g is obtained as follows if the same substrate and the same metallic film as those used in the series-arm resonator are employed:

$$g=N_p\cdot W\cdot t/(l_p\cdot\rho_o) \tag{30}$$

where $l_p$ denotes the aperture length of the parallel-arm resonator, and the $N_p$ denotes the number of finger pairs. It will be noted that $\rho_o$, W and t in the parallel-arm resonator are almost the same as those in the series-arm resonator.

Hence, an increase in the insertion loss in the equation (28) is expressed as follows:

$$r+50r\cdot g+2500g=l_s\cdot\rho_o/(N_s\cdot W\cdot t)+50\cdot(l_s/l_p)\cdot(N_p/N_s)+2500\cdot N_p\cdot W\cdot t/(l_p\cdot\rho_o). \quad (31)$$

It can be seen from equation (31) that the insertion loss of the series-arm resonator becomes smaller as the aperture length $l_s$ decreases and the number $N_s$ of finger pairs increases, and that the insertion loss of the parallel-arm resonator becomes smaller as the aperture length $l_p$ increases and the number $N_p$ of finger pairs decreases. Particularly, the insertion loss can be effectively reduced when $l_s/l_p<1$ and $N_p/N_s<1$, that is, when the aperture length of the series-arm resonator is smaller than that of the parallel-arm resonator, and the number of finger pairs of the series-arm resonator is larger than the number of finger pairs of the parallel-arm resonator.

The reason for the above will now be described. In equation (31), $r=r_s$ ($r_s$: electric resistance of the series-arm resonator), and $g=1/r_p$ ($r_p$: electric resistance of the parallel-arm resonator), and therefore the following expression can be obtained:

$$r+50r\cdot g+2500g=r_s+50(r_s/r_p)+2500(l/r_p).$$

Hence, an increase in the insertion loss can be suppressed when $(r_s/r_p)<1$, that is, $r_s<r_p$.

If $l_s$ is too short, a loss resulting from diffraction of the surface wave takes place. If $l_p$ is too long, a decrease in Q of the parallel-arm resonator due to resistance increase appears, and the side lobe suppression factor is deteriorated. Hence, there is a limit on $l_s$ and $l_p$.

The equation (31) can be modified as follows:

$$r+50r\cdot g+2500g=l_s\cdot\rho_o/N_s\cdot W\cdot t)+50\cdot(l_s/l_p)\cdot(N_p/N_s)\cdot(t_p\cdot t_s)+2500\cdot N_s\cdot W\cdot t_s/(l_p\cdot\rho_o) \quad (32)$$

where $t_s$ denotes the film thickness of the metallic film forming the interdigital electrode of the series-arm resonator, and $t_p$ denotes the film thickness of the metallic film forming the interdigital electrode of the parallel-arm resonator. Hence, the insertion loss can be reduced when $t_p/t_s$.

It is possible to use resonators, each having two different metallic films having different resistivity values ($\rho_{os}$, $\rho_{op}$) and to arrange these resonators in the parallel and series arms, so that $\rho_{os}/\rho_{op}<1$ can be satisfied. However, this is not practical in terms of mass productivity.

A further description will be given, with reference to FIGS. 67 and 68, of the fifteenth embodiment based on the above concept. A piezoelectric substrate 241 is formed of 36° Y-cut X-propagation $LiTaO_3$, and an electrode is made of Al and 3000 Å thick.

Conventionally, in each of the parallel and series arms, $l_s=l_p=90$ μm and $N_p=N_s=100$. In the present embodiment, $l_s=45$ μm and $N_s=200$ in the series arm while $l_p=180$ μm and $N_p=50$ in the parallel arm. That is, $l_p>l_s$, and $N_s>N_p$. Further, $l_s/l_p=0.25$, and $N_p/N_s=0.25$. The electrostatic $C_o$ of the interdigital electrode based on the product of the number of finger pairs and the aperture length is kept constant.

Figure 69:
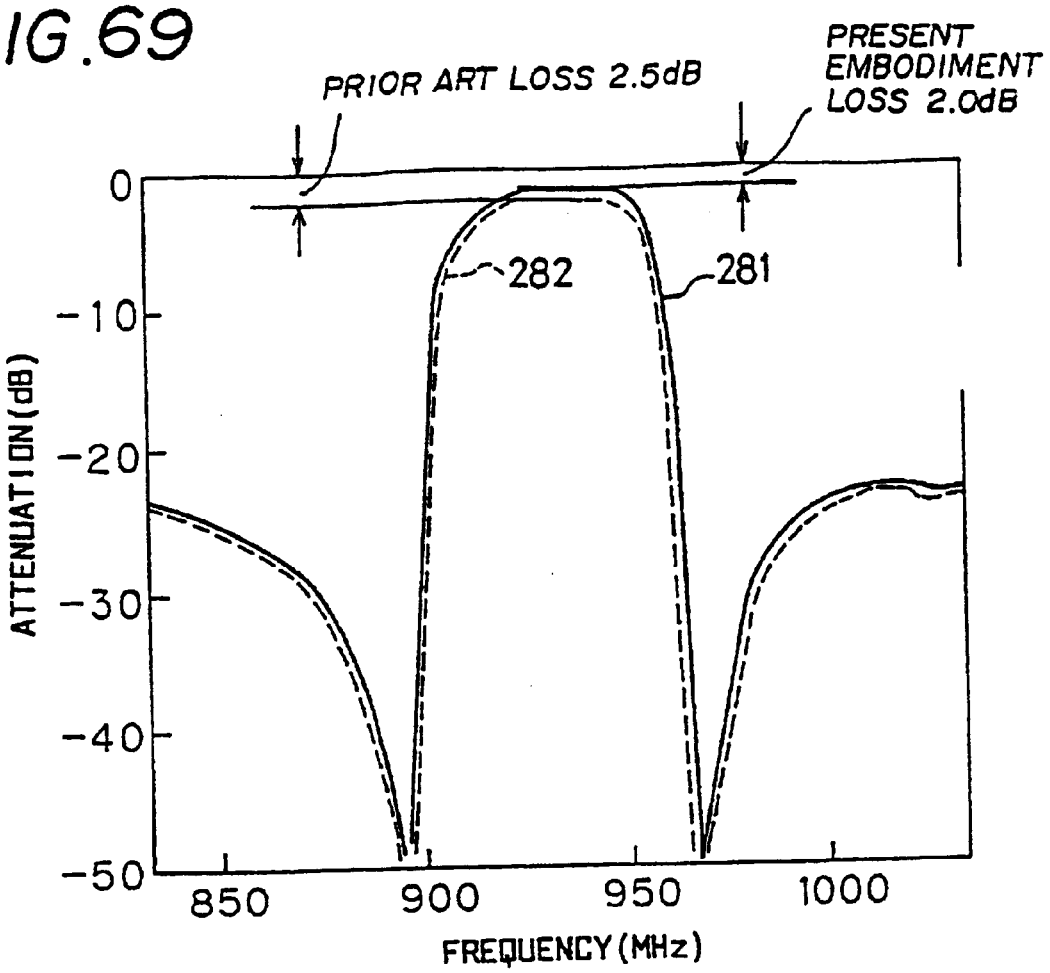
FIG. 69 is a diagram showing a filter characteristic of the filter shown in FIG. 68.
Figure 70:
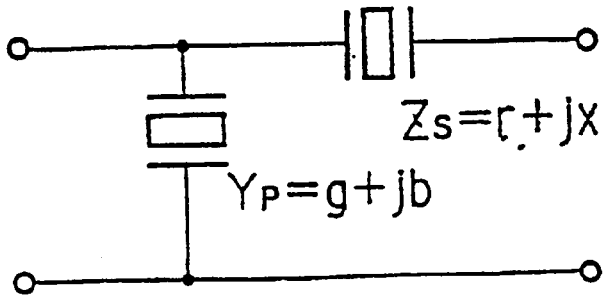
FIG. 70 is a circuit diagram of a ladder-type filter in which SAW resonators having different resonance frequencies are respectively provided in the parallel and series arms.

In FIG. 69, solid line 281 indicates the characteristic of the present embodiment, and broken line 282 indicates the characteristic of the conventional filter. The conventional filter has an insertion loss of 2.5 dB, while the present embodiment has an insertion loss of 2.0 dB. That is, the insertion loss is improved by 0.5 dB, in other words, 25%. Further, since an increased number of finger pairs of the series-arm resonator is used, the breakdown power performance is improved, and the applicable maximum power is improved by 20%.

In the present embodiment, a diffraction loss appears when $l_s$ is equal to or less than 30 μm, and the side lobe starts to deteriorate when $l_p$ is equal to or larger than 300 μm. Hence, the $l_s$ and $l_p$ are limited to the above values. It can be seen from the above that the insertion loss in the pass band is improved by decreasing the electric resistance of the series-arm and increasing the electric resistance of the parallel arm (decreasing the conductance). It is also possible to use a parallel-arm resonator having a film thickness larger than that of the series-arm resonator. Even with this structure, it is possible to reduce the insertion loss in the pass band.

A description will now be given, with reference to FIG. 72, of a wave filter according to a sixteenth embodiment of the present invention. The wave filter (branching filter) shown in FIG. 72 comprises two SAW filters F1 and F2 having input terminals connected to a pair of common signal terminals T0 via common nodes a and b. The SAW filter F1 has a pair of signal terminals T1, and the SAW FILTER F2 has a pair of signal terminals T2. A pair of signal lines $l_h$ and $l_c$ connects the nodes a and b to the SAW filter F1, and another pair of signal lines $l_h$ and $l_c$ connects the nodes a and b to the SAW filter F2.

The SAW filter F1 comprises a series-arm SAW resonator Rso, and a parallel-arm SAW resonator Rp, which resonators are configured as has been described previously. The resonator Rso is connected to the common node a, and hence serves as a resonator of the first stage of the SAW resonator F1. A plurality of pairs, each pair of series-arm resonator and parallel-arm resonator are cascaded in the SAW filter F1. The SAW filter F2 is configured in the same manner as the SAW filter F1.

The SAW filters F1 and F2 respectively have different band center frequencies. For example, the SAW filter F1 has a band center frequency $f_1$ of 887 MHz, and the SAW filter F2 has a band center frequency $f_2$ of 932 MHz. In this case, the frequency $f_1$ is lower than the frequency $f_2$.

Figure 72:
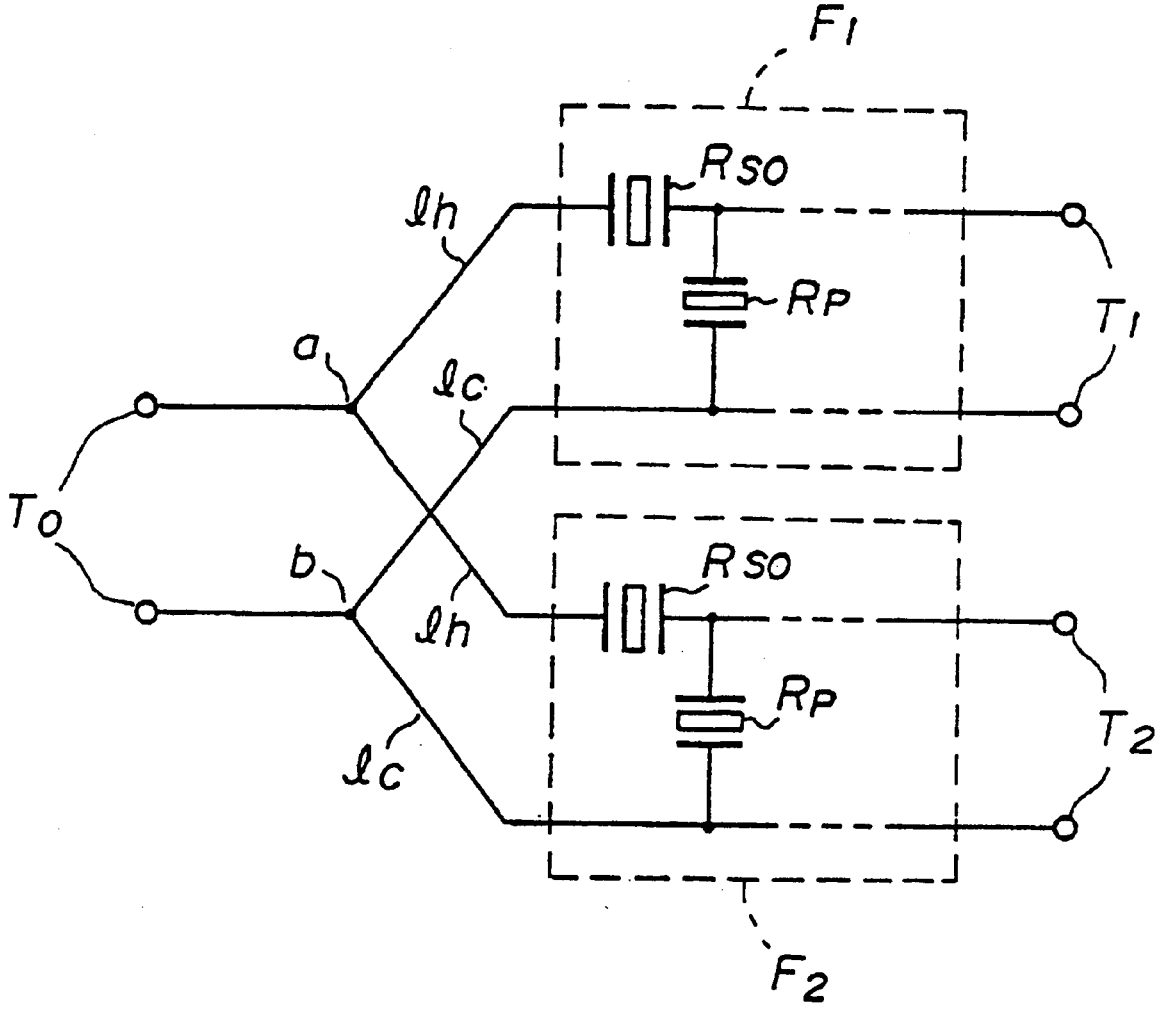
FIG. 72 is a circuit diagram of a wave filter according to a sixteenth embodiment of the present invention.
Figure 73:
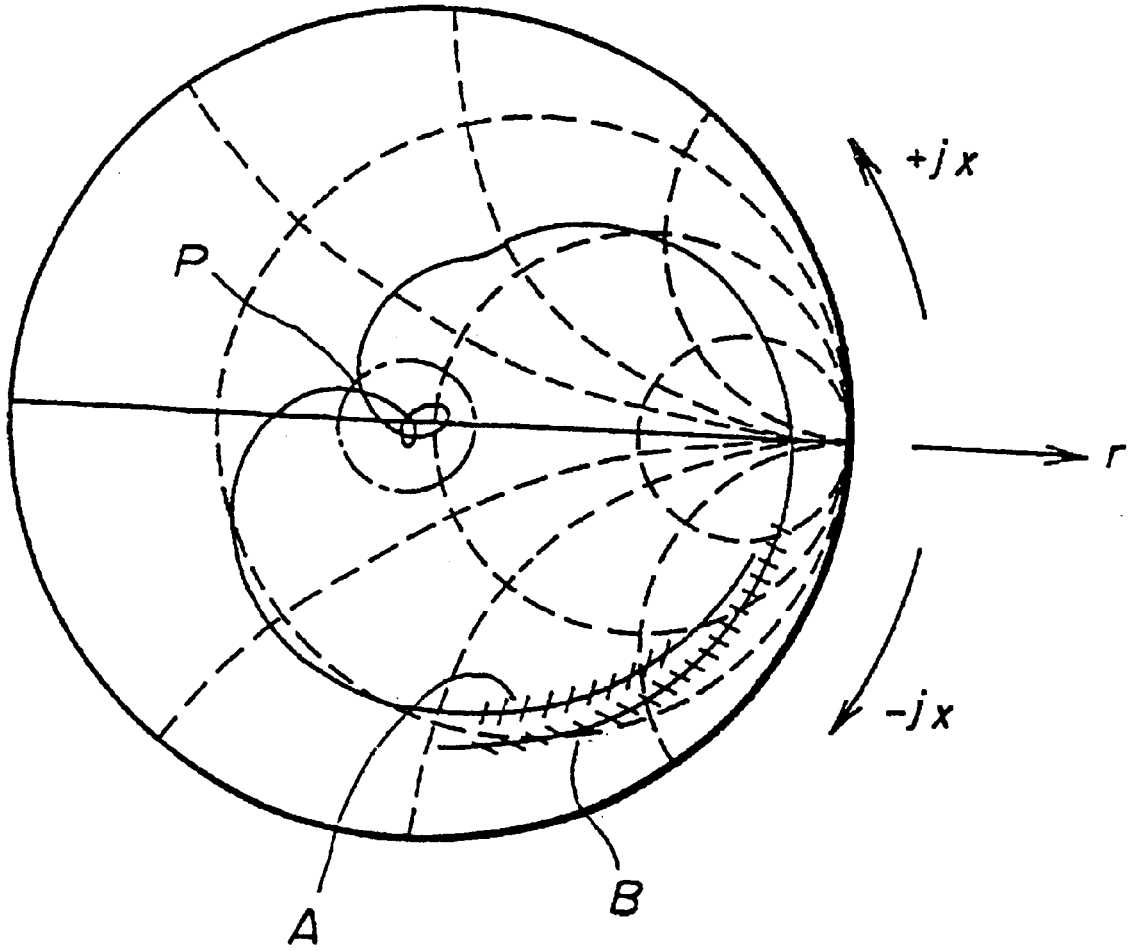
FIG. 73 is a Smith's chart of the wave filter shown in FIG. 72.

FIG. 73 is a Smith's chart of the wave filter shown in FIG. 72. In FIG. 72, P indicates the pass band of the wave filter, A indicates a low-frequency-side attenuation band, and B indicates a high-frequency-side attenuation band. It can be seen from FIG. 73 that the characteristic impedance of the circuit shown in FIG. 72 is equal to 50 Ω, while the impedances of the attenuation bands A and B are greater than 50 Ω. This means that the wave filter shown in FIG. 72 has the impedance characteristics of the respective band-pass filters.

Figure 74:
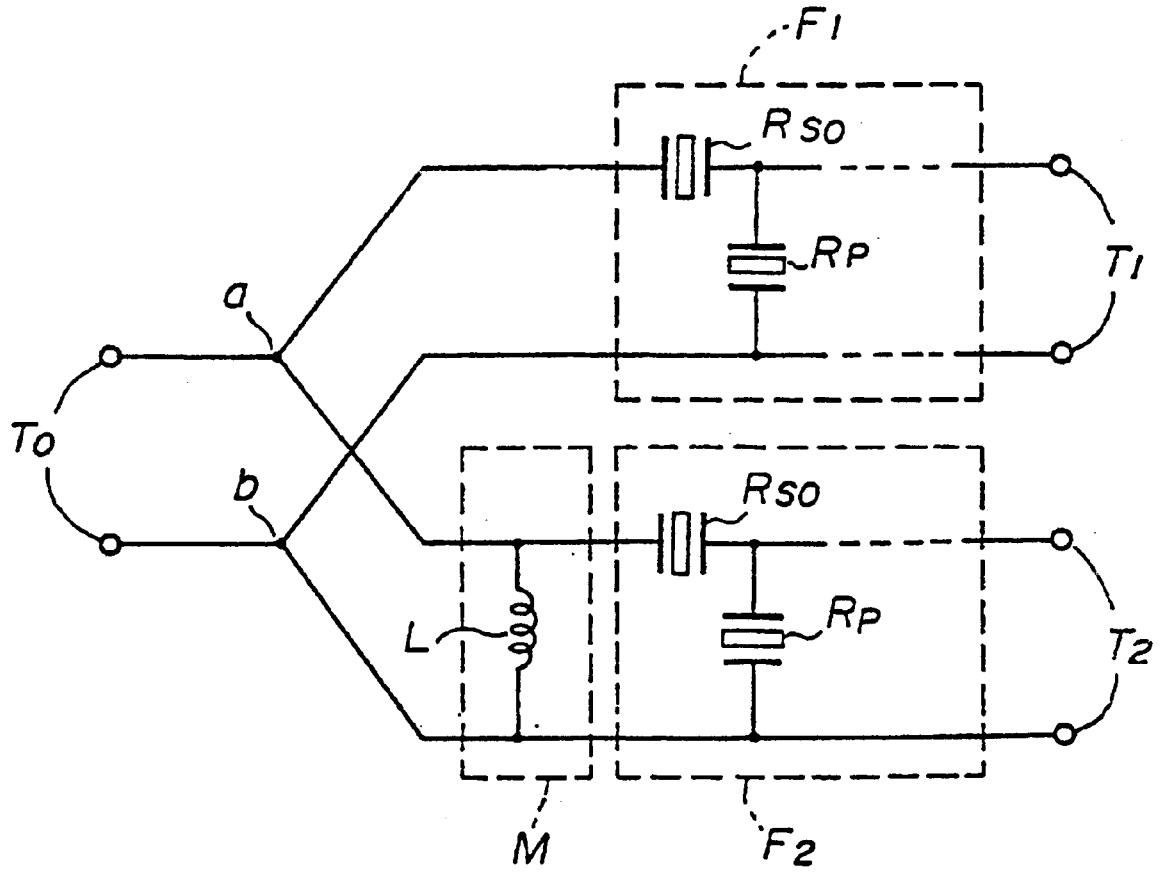
FIG. 74 is a circuit diagram of a wave filter according to a seventeenth embodiment of the present invention.

A description will now be given, with reference to FIGS. 74 and 75, of a wave filter according to a seventeenth embodiment of the present invention. In FIG. 74, parts that are the same as parts shown in the previously described figures are given the same reference symbols.

As has been described previously, the SAW filters F1 and F2 satisfy the condition $f_1<f_2$. If the SAW band-pass filters F1 and F2 have characteristics as shown in FIG. 75, the filter F1 is maintained in a high-impedance state within the pass band frequency band of the filter F2. In this case, there is no need to provide an impedance matching circuit M to the filter F1, and the same characteristic as the characteristic of the filter F2 alone can be obtained.

However, the filter F2 does not have a high impedance within the low-frequency attenuation band A thereof, and crosstalk may take place. Hence, it is necessary to increase the impedance within the low-frequency attenuation band A of the filter F2.

An impedance matching circuit M for increasing the impedance in the low-frequency attenuation band A thereof is connected between the nodes a and b and the filter F2. The impedance matching circuit M includes an inductor L, which is a high-impedance element for rotating the phase of signal. The inductor L has an inductance of, for example, 6 nH. The inductor L can be formed with, for example a metallic strip line made of, for example, gold, tungsten, or copper, and formed on a glass-epoxy or ceramic substrate. The strip line formed on the glass-epoxy substrate has a width of 0.5 mm and a length of 11 mm, and the strip line formed on the ceramic substrate has a width of 0.2 mm and a length of 6 mm.

Figure 75:
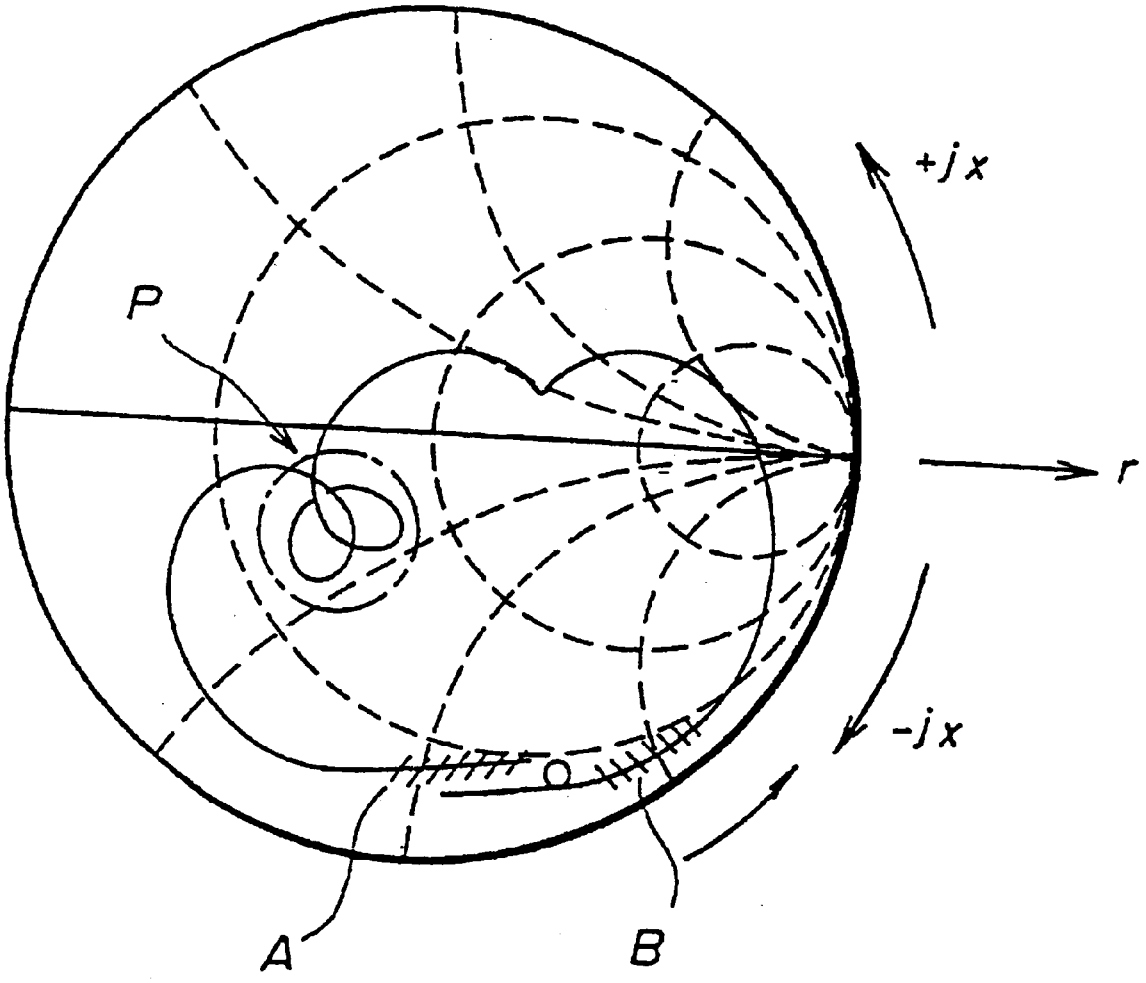
FIG. 75 is a Smith's chart of the wave filter shown in FIG. 74.

As shown in FIG. 75, the impedance matching circuit M provided for the filter F2 rotates the phase in the direction indicated by the arrow, and the impedance of the filter F2 in the low-frequency attenuation band A can be increased.

Figure 76:
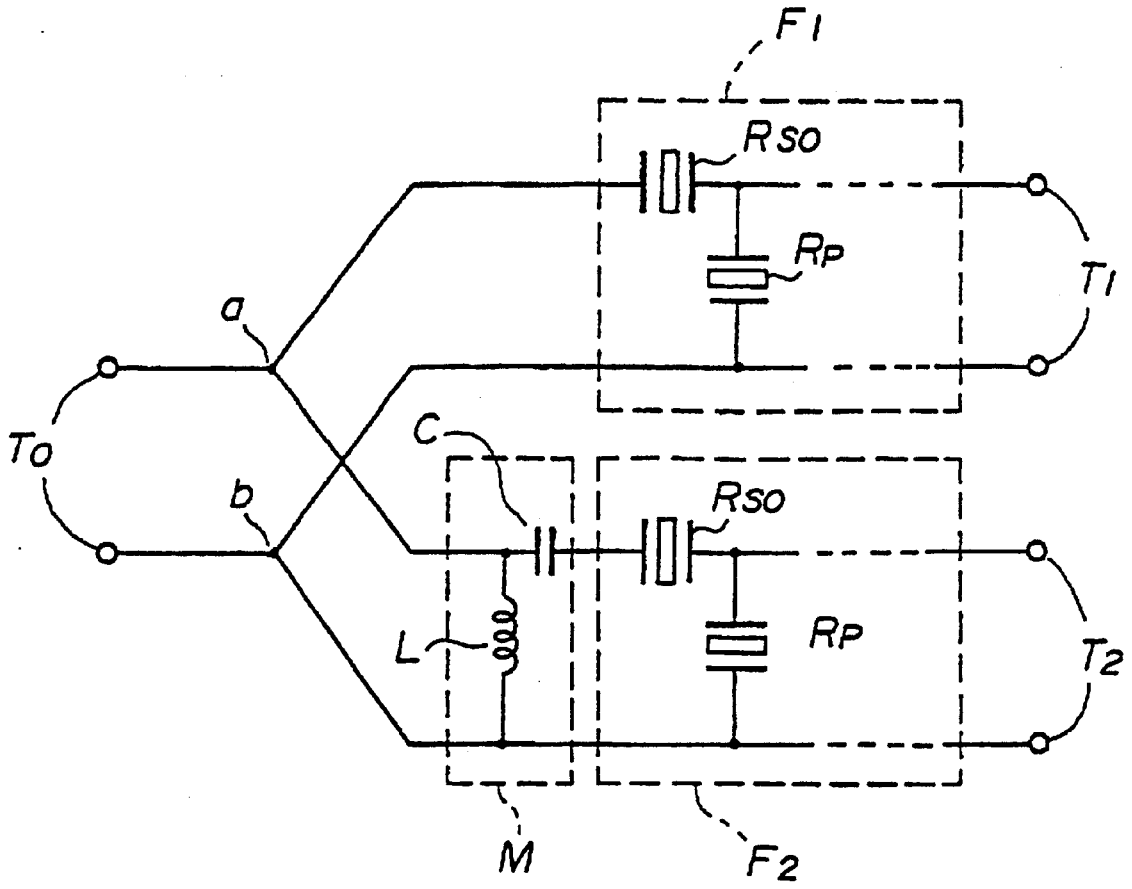
FIG. 76 is a circuit diagram of a wave filter according to an eighteenth embodiment of the present invention.

FIG. 76 shows a wave filter according to an eighteenth embodiment of the present invention. In FIG. 76, parts that are the same as parts shown in the previously described figures are given the same reference symbols. The wave filter shown in FIG. 76 can be obtained by connecting a capacitor C, which corrects the quantity of phase rotation of the inductor L, in series between the inductor L and the series-arm resonator Rso. There is a possibility that a suitable impedance matching may be not obtained by means of only inductor L. As shown in a Smith's chart shown in FIG. 77, the phase is rotated in the direction indicated by the arrow shown in FIG. 77 first, and is rotated by means of the inductor L second.

Figure 78:
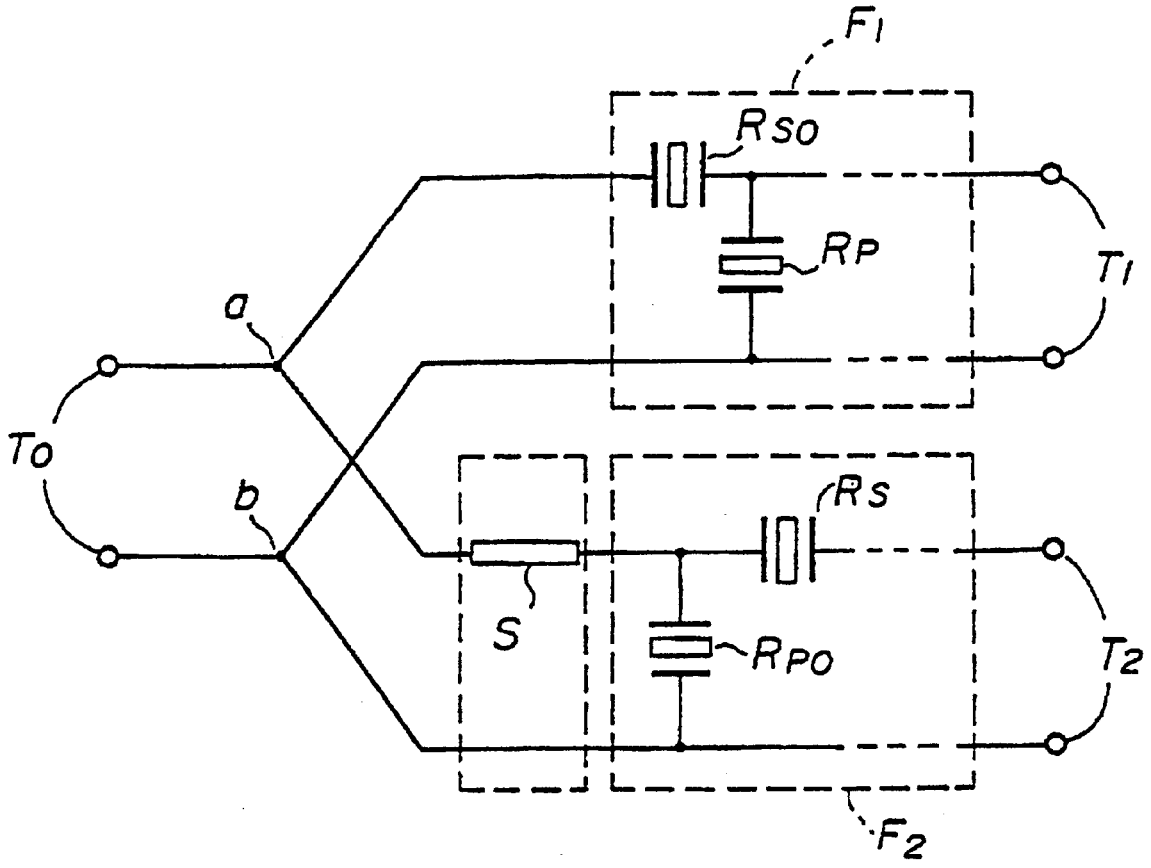
FIG. 78 is a circuit diagram of a wave filter according to a nineteenth embodiment of the present invention.

FIG. 78 shows a wave filter according to a nineteenth embodiment of the present invention. The filter F1 comprises the series-arm SAW resonator Rso and the parallel-arm SAW resonator Rp, which are connected so that the series-arm resonator is located at the first stage of the filter F1. The parallel-arm SAW resonator Rpo of the filter F is located at the first stage of the filter F. A line S for use in phase rotation is connected in series to the SAW filter F2. It is possible to increase the impedance of the filter F1 within the high-frequency attenuation band B thereof even by an arrangement such that only the filter F1 has the series-arm resonator of the first stage. In this case, the resonator of the first stage of the filter F2 is the parallel-arm resonator Rpo connected in parallel to the pair of common signal terminals T0, and the low-frequency attenuation band A of the filter F2 (corresponding to the pass band of the filter F1) does not have a high impedance. Hence, according to the present embodiment, the phase rotation line S is connected in series to the filter F2.

Figure 77:
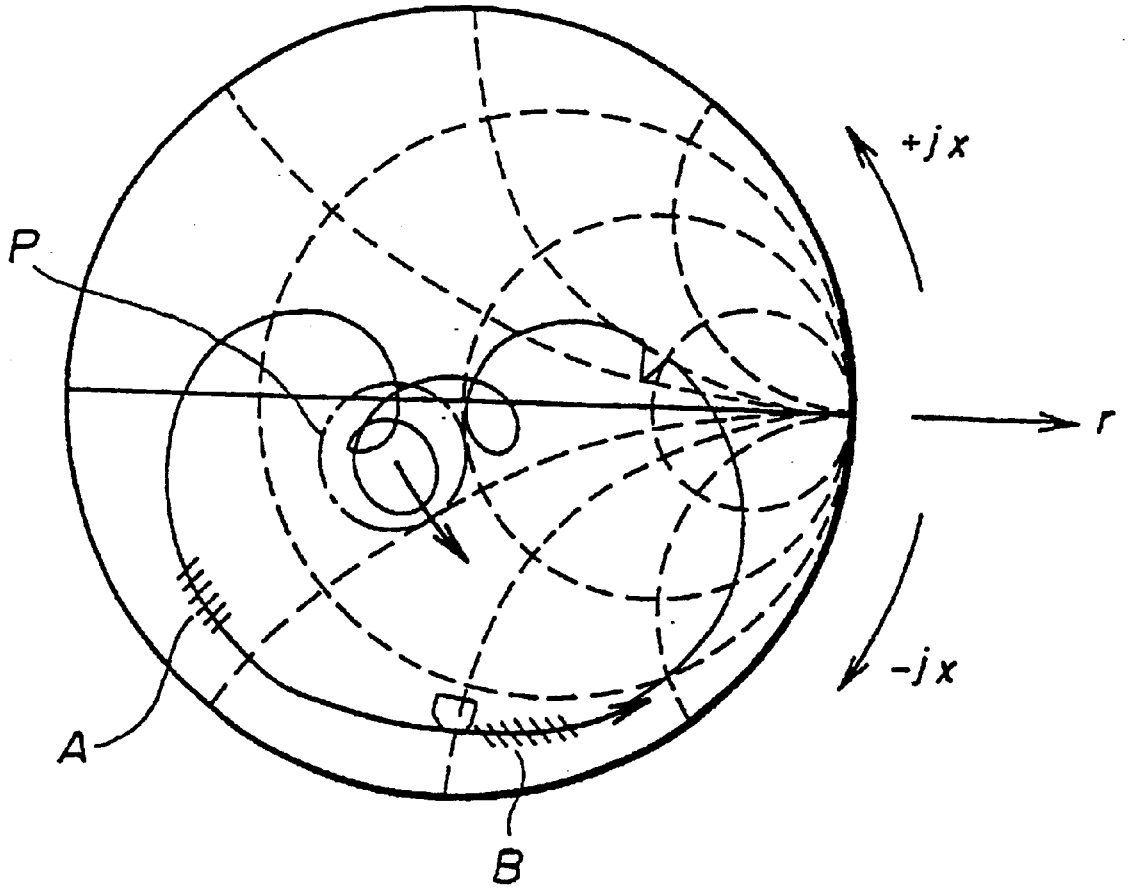
FIG. 77 is a Smith's chart of the wave filter shown in FIG. 76.
Figure 79:
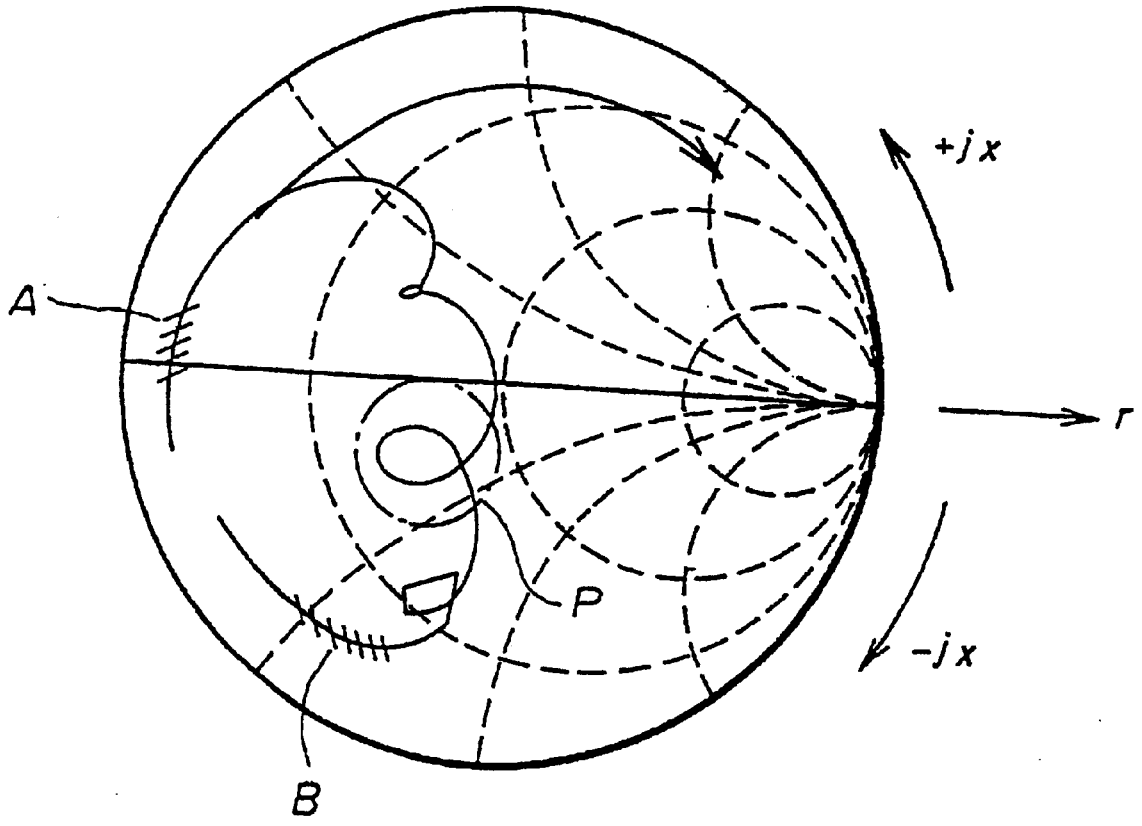
FIG. 79 is a Smith's chart of the wave filter shown in FIG. 78.

As shown in FIG. 79, the direction of phase rotation caused by the line S is opposite to the directions shown in FIGS. 75 and 77. However, as shown in FIG. 80, suitable matching of the filter F2 can be obtained. In this case, the length of the line S formed on the glass-epoxy substrate is approximately 25 mm, and the length of the line S formed on the ceramic substrate is approximately 26 mm.

A variation of the configuration shown in FIG. 78 can be made by providing the inductor L in the same manner as shown in FIG. 74. It is also possible to further provide the capacitor C in the same manner as shown in FIG. 76.

The band center frequencies $f_1$ and $f_2$ of the sixteenth through nineteenth embodiments of the present invention are not limited to 887 MHz and 932 MHz.

The present invention is not limited to the specifically disclosed embodiments, and variations and modifications may be made without departing from the scope of the present invention.

What is claimed is:

1. A SAW filter comprising:

a first SAW resonator having a pair of terminals and a predetermined resonance frequency ($f_{rp}$), said first SAW resonator being provided in a parallel arm of the SAW filter;

a second SAW resonator having a pair of terminals and a predetermined resonance frequency ($f_{rs}$) approximately equal to a predetermined antiresonance frequency of the first SAW resonator ($f_{ap}$), said second SAW resonator being provided in a series arm of the SAW filter; and an inductance element connected in series with the first SAW resonator in the parallel arm, the inductance element functioning to increase the admittance of the parallel arm and decrease the resonance frequency.

2. The SAW filter as claimed in claim 1, wherein an aperture length (Ap) of the first SAW resonator is larger than an aperture length (As) of the second SAW resonator.

3. The SAW filter as claimed in claim 1, wherein a number (Np) of electrode finger pairs of the first SAW resonator is larger than a number (Ns) of electrode finger pairs of the second SAW resonator.

4. The SAW filter as claimed in claim 1, wherein the first SAW resonator comprises an exciting interdigital electrode and first and second reflectors respectively located on opposite sides of the exciting electrode so that β is equal to 0.4, said β being defined in the following equation:

$$d=(n+\beta)\cdot\lambda$$

wherein d denotes a distance between the exciting electrode and each of the first and second reflectors, n is an integer, β is a real number equal to or less than 1, and λ denotes a period of the exciting interdigital electrode corresponding to the resonance frequency.

5. [The] *A* SAW filter [as claimed in claim 1, wherein] *comprising*:

*a first SAW resonator having a pair of terminals and a predetermined resonance frequency ($f_{rp}$), said first SAW resonator being provided in a parallel arm of the SAW filter; and*

*a second SAW resonator having a pair of terminals and a predetermined resonance frequency ($f_{rs}$) approximately equal to a predetermined antiresonance frequency of the first SAW resonator ($f_{ap}$), said second SAW resonator being provided in a series arm of the SAW filter, wherein*

*the first and second SAW resonators are formed on a piezoelectric substrate including at least one of $LiTaO_3$ and $LiNbO_3$;* the first SAW resonator comprises an exciting interdigital electrode and first and second reflectors, each of which comprises either aluminum or an aluminum alloy containing a few weight percentage of metal, other than aluminum; and the respective film thicknesses of the exciting interdigital electrode and the first and second reflectors are in a range of from 0.06 to 0.09 times the period of the exciting interdigital electrode.

6. [The] *A* SAW filter [as claimed in claim 1, wherein] *comprising*:

*a first SAW resonator having a pair of terminals and a predetermined resonance frequency ($f_{rp}$), said first SAW resonator being provided in a parallel arm of the SAW filter; and*

*a second SAW resonator having a pair of terminals and a predetermined resonance frequency ($f_{rs}$) approximately equal to a predetermined antiresonance frequency of the first SAW resonator ($f_{ap}$), said second SAW resonator being provided in a series arm of the SAW filter, wherein*

*the first and second SAW resonators are formed on a piezoelectric substrate including at least one of $LiTaO_3$ and $LiNbO_3$;* the first SAW resonator comprises an exciting interdigital electrode and first and second reflectors, each of which comprises either gold or a gold alloy containing a few weight percentage of metal other than gold; and the respective film thicknesses of the exciting interdigital electrode and the first and second reflectors are in a range of from 0.0086 to 0.013 times the period of the exciting interdigital electrode.

7. The SAW filter as claimed in claim 1, wherein said inductance element comprises a bonding wire.

8. The SAW filter as claimed in claim 1, wherein said inductance element comprises:

a ceramic package accommodating a filter chip, the first and second SAW resonators being formed on the filter chip; and a microstrip line which is formed on the ceramic package and extends between, and interconnects, the first SAW resonator and a terminal.

9. The SAW filter as claimed in claim 1, wherein said inductance element comprises:

a filter chip, the first and second SAW resonators being formed on the filter chip; and a microstrip line which is formed on the filter chip and extends from the first SAW resonator.

10. A SAW filter comprising:

a plurality of first SAW resonators, each having a pair of terminals and a predetermined resonance frequency ($f_{rp}$), said first SAW resonators being respectively provided in parallel arms of the SAW filter;

a plurality of second SAW resonators, each having a pair of terminals and a predetermined resonance frequency ($f_{rs}$) approximately equal to a predetermined antiresonance frequency of the first SAW resonator ($f_{ap}$), said second SAW resonators being provided in a series arm of the SAW filter; and inductance elements (Ls) respectively connected in series to the second SAW resonators.

11. The SAW filter as claimed in claim 10, wherein:

each of the first SAW resonators comprises an exciting interdigital electrode and first and second reflectors respectively located on opposite sides of the exciting electrode so that β is equal to 0.4, said β being defined in the following equation:

$$d=(n+\beta)\cdot\lambda$$

wherein d denotes a distance between the exciting electrode and each of the first and second reflectors, n is an integer, β is a real number equal to or smaller than 1, and λ denotes a period of the exciting interdigital electrode corresponding to the resonance frequency.

12. The SAW filter as claimed in claim 11, wherein each of said inductance elements comprises:

a ceramic package accommodating a filter chip, the first and second SAW resonators being formed on the filter chip; and microstrip lines which are formed on the ceramic package and respectively extend between, and interconnect, the second SAW resonators and corresponding terminals.

13. The SAW filter as claimed in claim 11, wherein each of said inductance elements comprises:

a filter chip, the first and second SAW resonators are formed; and microstrip lines which are formed on the filter chip and extend respectively from the second SAW resonators.

14. A SAW filter comprising:

a plurality of first SAW resonators, each having a pair of terminals and a predetermined resonance frequency ($f_{rp}$), said first SAW resonators being connected in respective, parallel arms of the SAW filter;

a plurality of second SAW resonators, each having a pair of terminals and a predetermined resonance frequency ($f_{rs}$) approximately equal to the predetermined antiresonance frequency of the first SAW resonator ($f_{ap}$), said second SAW resonators being provided in a series arm of the SAW filter; and inductance elements respectively connected in series with the first SAW resonators in the parallel arms.

[15. A SAW filter comprising:

a first SAW resonator having a pair of terminals, a first resonance frequency ($f_{rp}$) and a first antiresonance frequency ($f_{ap}$), based on the first resonance frequency and a first capacitance ratio (τ) and higher than the first resonance frequency, said first SAW resonator being provided in a parallel arm of the SAW filter; and a second SAW resonator having a pair of terminals, a second resonance frequency ($f_{rs}$) and a second antiresonance frequency ($f_{as}$), based on the second resonance frequency and a second capacitance ratio (τ) and higher than the second resonance frequency, said second SAW resonator being provided in a series arm of the SAW filter, wherein:

the second resonance frequency ($f_{rs}$) is higher than the first antiresonance frequency ($f_{ap}$), and a difference between the second resonance frequency and the first antiresonance frequency is equal to a value which provides an allowable ripple range and an allowable insertion loss.]

16. [The] *A* SAW filter [as claimed in claim 15, wherein] *comprising*:

*a first SAW resonator having a pair of terminals, a first resonance frequency ($f_{rp}$) and a first antiresonance frequency ($f_{ap}$), based on the first resonance frequency and a first capacitance ratio (τ) and higher than the first resonance frequency, said first SAW resonator being provided in a parallel arm of the SAW filter; and*

*a second SAW resonator having a pair of terminals, a second resonance frequency ($f_{rs}$) and a second antiresonance frequency ($f_{as}$), based on the second resonance frequency and a second capacitance ratio (τ) and higher than the second resonance frequency, said second SAW resonator being provided in a series arm of the SAW filter, wherein:*

*the second resonance frequency ($f_{rs}$) is higher than the first antiresonance frequency ($f_{ap}$), and*

*a difference between the second resonance frequency and the first antiresonance frequency is equal to a value which provides an allowable ripple range and an allowable insertion loss, wherein:* the first and second SAW resonators are formed on a piezoelectric substrate;

the second SAW comprises an interdigital electrode which is formed on the piezoelectric substrate and which has a predetermined period; and a normalized value, obtained by normalizing said difference by the second resonance frequency, is larger than [zero] *0.002* and smaller than α, as defined by the following equation:

$$\alpha = 1\left(\sqrt{P(\tau^2+\tau)/0.06} - \tau\right)$$

wherein P is a ratio of an electrostatic capacitance, based on an aperture length and a number of finger pairs of the interdigital electrode of the second SAW resonator, to an electrostatic capacitance, based on an aperture length and a number of finger pairs of an interdigital electrode of the first SAW resonator.

17. [The] *A* SAW filter [as claimed in claim 15, wherein] *comprising*:

*a first SAW resonator having a pair of terminals, a first resonance frequency ($f_{rp}$) and a first antiresonance frequency ($f_{ap}$), based on the first resonance frequency and a first capacitance ratio (τ) and higher than the first resonance frequency, said first SAW resonator being provided in a parallel arm of the SAW filter; and*

*a second SAW resonator having a pair of terminals, a second resonance frequency ($f_{rs}$) and a second antiresonance frequency ($f_{as}$), based on the second resonance frequency and a second capacitance ratio (τ) and higher than the second resonance frequency, said second SAW resonator being provided in a series arm of the SAW filter, wherein:*

*the second resonance frequency ($f_{rs}$) is higher than the first antiresonance frequency ($f_{ap}$), and*

*a difference between the second resonance frequency and the first antiresonance frequency is equal to a value which provides an allowable ripple range and an allowable insertion loss, wherein:* the first and second SAW resonators are formed on a piezoelectric substrate;

the second SAW *resonator* comprises an interdigital electrode which is formed on the piezoelectric substrate [and which has a] predetermined period;

said piezoelectric substrate comprises 36° Y-cut X-propagation $LiTaO_3$; [and]

*Cop/Cos is less than 1.8, wherein Cop and Cos are the electrostatic capacitances of the first SAW resonator and the second SAW resonator, respectively; and*

[the predetermined period of the interdigital electrode of the second SAW resonator is selected so that said normalized ratio] *a normalized value, obtained by normalizing said difference by the second resonance frequency,* is larger than [zero] *0.007* and is smaller than a, as defined by the following equation:

$$\alpha = 6.67\times10^{-2}/\left(4.22\sqrt{P} - 1\right)$$

wherein P is a ratio of an electrostatic capacitance, *Cop/Cos,* based on an aperture length and a number of finger pairs of the interdigital electrode of the second SAW resonator, to an electrostatic capacitance, based on an aperture length and a number of finger pairs of an interdigital electrode of the first SAW resonator.

18. [The] *A* SAW filter [as claimed in claim 15, wherein] *comprising*:

*a first SAW resonator having a pair of terminals, a first resonance frequency ($f_{rp}$) and a first antiresonance frequency ($f_{ap}$), based on the first resonance frequency and a first capacitance ratio (τ) and higher than the first resonance frequency, said first SAW resonator being provided in a parallel arm of the SAW filter; and*

*a second SAW resonator having a pair of terminals, a second resonance frequency ($f_{rs}$) and a second antiresonance frequency ($f_{as}$), based on the second resonance frequency and a second capacitance ratio (τ) and higher than the second resonance frequency, said second SAW resonator being provided in a series arm of the SAW filter, wherein:*

*the second resonance frequency ($f_{rs}$) is higher than the first antiresonance frequency ($f_{ap}$), and*

*a difference between the second resonance frequency and the first antiresonance frequency is equal to a value which provides an allowable ripple range and an allowable insertion loss, wherein:*

*Cop/Cos is less than 1.8, wherein Cop and Cos are the electrostatic capacitances of the first SAW resonator and the second SAW resonator, respectively; and* the first and second SAW resonators are formed on a piezoelectric substrate;

the second SAW resonator comprises an interdigital electrode which is formed on the piezoelectric substrate and which has a predetermined period;

said piezoelectric substrate comprises 64° Y-cut X-preparation $LiNbO_3$; and

[the predetermined period of the interdigital electrode of the second SAW resonator is selected so that said normalized ratio] *a normalized value, obtained by normalizing said difference by the second resonance frequency,* is larger than [zero] *0.0073* and is smaller than α, as defined by the following equation:

$$\alpha = 1.47\times10^{-2}/\left(4.37\sqrt{P} - 1\right)$$

wherein P is a ratio of an electrostatic capacitance, *Cop/Cos,* based on an aperture length and a number of finger pairs of the interdigital electrode of the second SAW resonator, to an electrostatic capacitance, based on an aperture length and a number of finger pairs of an interdigital electrode of the first SAW resonator.

19. [The] *A* SAW filter [as claimed in claim 15, wherein] *comprising*:

*a first SAW resonator having a pair of terminals, a first resonance frequency ($f_{rp}$) and a first antiresonance frequency ($f_{ap}$), based on the first resonance frequency and a first capacitance ratio (τ) and higher than the first resonance frequency, said first SAW resonator being provided in a parallel arm of the SAW filter; and*

*a second SAW resonator having a pair of terminals, a second resonance frequency ($f_{rs}$) and a second antiresonance frequency ($f_{as}$), based on the second resonance frequency and a second capacitance ratio (τ) and higher than the second resonance frequency, said second SAW resonator being provided in a series arm of the SAW filter, wherein:*

*the second resonance frequency ($f_{rs}$) is higher than the first antiresonance frequency ($f_{ap}$), and a difference between the second resonance frequency and the first antiresonance frequency is equal to a value which provides an allowable ripple range and an allowable insertion loss, wherein:*

*Cop/Cos is less than 1.8, wherein Cop and Cos are the electrostatic capacitances of the first SAW resonator and the second SAW resonator, respectively; and* the first and second SAW resonators are formed on a piezoelectric substrate;

the second SAW resonator comprises an interdigital electrode which is formed on the piezoelectric substrate and which has a predetermined period;

said piezoelectric substrate comprises 41° Y-cut X-propagation $LiNbO_3$; and

[the predetermined period of the interdigital electrode of the second SAW resonator is selected so that said normalized ratio] *a normalized value, obtained by normalizing said difference by the second resonance frequency,* is larger than [zero] *0.0074* and is smaller than α, as defined by the following equation:

$$\alpha = 2.273\times10^{-1}/(4.52\sqrt{P}-1)$$

wherein P is a ratio of an electrostatic capacitance, *Cop/Cos,* based on an aperture length and a number of finger pairs of the interdigital electrode of the second SAW resonator, to an electrostatic capacitance, based on an aperture length and a number of finger pairs of an interdigital electrode of the first SAW resonator.

20. A SAW filter comprising:

a plurality of first SAW resonators, each having a pair of terminals, a first resonance frequency ($f_{rp}$) and a first antiresonance frequency ($f_{ap}$), based on the first resonance frequency and a first capacitance ratio (τ) and higher than the first resonance frequency, said first SAW resonators being connected in respective, parallel arms of the SAW filter; and a plurality of second SAW resonators, each having a pair of terminals, a second resonance frequency ($f_{rs}$) and a second antiresonance frequency ($f_{as}$), based on the second resonance frequency and a second capacitance ratio (τ) and higher than the second resonance frequency, said second SAW resonators being connected in a series arm of the SAW filter, wherein: the first and second SAW resonators are connected so as to form a ladder-type filter structure, the second resonance frequency is higher than [or equal to] the first antiresonance frequency, a first outermost arm, closest to either an input or an output of the SAW filter, is said series arm and a second outermost arm, closest to a remaining one of the input and the output, is one of the parallel arms, and the respective one of the second SAW resonators connected in the first outermost arm has an impedance smaller than that of each of remaining second SAW resonators connected in the series arm and located interiorally of said SAW filter, relatively to said respective one of the second SAW resonators connected in the first outermost arm.

21. The SAW filter as claimed in claim 20, wherein the respective one of the first SAW resonators connected in the second outermost arm has an admittance smaller than that of each of remaining first SAW resonators connected respectively in the parallel arms and located interiorally of said SAW filter, relatively to said respective one of the first SAW resonators connected in the second innermost arm.

22. The SAW filter as claimed in claim 20, wherein the impedance of said respective one of the second SAW resonators is half that of each of the remaining second SAW resonators.

23. The SAW filter as claimed in claim 21, wherein the impedance of said respective one of the second SAW resonators is half that of each of the remaining second SAW resonators.

24. The SAW filter as claimed in claim 20, wherein:

a first electrostatic capacitance based on a first product is larger than a second electrostatic capacitance based on a second product;

the first product is a product of an aperture length of said one of the second SAW resonators in the first outermost arm, a number of finger pairs thereof, and a dielectric constant of a substrate of the first and second SAW resonators; and the second product is a product of an aperture length of each of said remaining second SAW resonators, a number of finger pairs thereof, and said dielectric constant.

25. The SAW filter as claimed in claim 20, wherein each of said remaining second SAW resonators in the series arm comprises a plurality of component SAW resonators connected in series and *each of the plurality of component SAW resonators* has the same capacitance as said respective one of the second SAW resonators connected in the first outermost arm.

26. The SAW filter as claimed in claim 21, wherein:

a first electrostatic capacitance based on a first product is [larger] *smaller* than a second electrostatic capacitance based on a second product;

the first product is a product of an aperture length of said one of the first SAW resonators in the second outermost arm, a number of finger pairs thereof, and a dielectric constant of a substrate of the first and second SAW resonators; and the second product is a product of an aperture length of each of said remaining first SAW resonators, a number of finger pairs thereof, and said dielectric constant.

27. The SAW filter as claimed in claim 21, wherein each of said remaining second SAW resonators in the series arm comprises a plurality of component SAW resonators connected in series and *each of the plurality of component SAW resonators* has the same impedance as said respective one of the second SAW resonators connected in the first outermost arm.

28. The SAW filter as claimed in claim 21, wherein the admittance of said respective one of the first SAW resonators is half that of each of the remaining first SAW resonators.

29. The SAW resonator as claimed in claim 21, wherein:

a first electrostatic capacitance based on a first product is smaller than a second electrostatic capacitance based on a second product;

the first product is a product of an aperture length of said one of the first SAW resonators in the second outermost arm, a number of finger pairs thereof, and a dielectric constant of a substrate of the first and second SAW resonators; and the second product is a product of an aperture length of each of said remaining first SAW resonators, a number of finger [paris] *pairs* thereof, and said dielectric constant.

30. The SAW resonator as claimed in claim 21, wherein each of said remaining first SAW resonators in the respective parallel arms comprises a plurality of component SAW resonators connected in parallel and *each of the plurality of component SAW resonators* has the same capacitance as said respective one of the first SAW resonators connected in the second outermost arm.

31. The SAW filter as claimed in claim 23, wherein:

a first electrostatic capacitance based on a first product is larger than a second electrostatic capacitance based on a second product;

the first product is a product of an aperture length of said respective one of the second SAW resonators connected in the first outermost arm, a number of finger pairs thereof, and a dielectric constant of a substrate of the first and second SAW resonators; and the second product is a product of an aperture length of each of said remaining second SAW resonators, a number of finger pairs thereof, and said dielectric constant.

32. The SAW filter as claimed in claim 23, wherein each of said remaining second SAW resonators in the series arm comprises a plurality of component SAW resonators connected in series and *each of the plurality of component SAW resonators* has the same capacitance as said respective one of the second SAW resonators connected in the first outermost arm.

33. The SAW resonator as claimed in claim 28, wherein:

a first electrostatic capacitance based on a first product is smaller than a second electrostatic capacitance based on a second product;

the first product is a product of an aperture length of said respective one of the first SAW resonators connected in the second outermost arm, a number of finger pairs thereof, and a dielectric constant *of a substrate, and the second product is a product of an aperture length of each of said remaining first SAW resonators, a number of finger pairs thereof and said dielectric constant*.

34. The SAW resonator as claimed in claim 28, wherein each of said remaining first SAW resonators connected in the respective parallel arms comprises a plurality of component SAW resonators connected in parallel and *each of the plurality of component SAW resonators* has the same capacitance as said respective one of the first SAW resonators connected in the second outermost arm.

35. A saw filter having an input and an output, comprising:

a plurality of first SAW resonators, each having a pair of terminals, a first resonance frequency ($f_{rp}$) and a first antiresonance frequency ($f_{ap}$), based on the first resonance frequency and a first capacitance ratio ($\tau$) and higher than the first resonance frequency, said first SAW resonators being connected in respective, parallel arms of the SAW filter; and a plurality of second SAW resonators, each having a pair of terminals, a second resonance frequency ($f_{rs}$) and a second antiresonance frequency ($f_{as}$), based on the second resonance frequency and a second capacitance ratio ($\tau$) and higher than the second resonance frequency, said second SAW resonators being connected in a series arm of the SAW filter, wherein:

the first and second SAW resonators are connected so as to form a ladder-type filter structure, the second resonance frequency is higher than [or equal to] the first antiresonance frequency, and a first outermost arm, closest to one of the input and the output of the SAW filter, comprises said series arm and a second outermost arm, closest to the other of the input and the output, comprises one of the parallel arms, and the respective first SAW resonator connected in the second outermost arm has an admittance smaller than that of each of the remaining first SAW resonators, connected in the remaining, respective parallel arms and located interiorly of said SAW filter relatively to the respective first SAW resonator connected in the second outermost arm.

36. The SAW filter as claimed in claim 35, wherein the admittance of said one of the first SAW resonators is half that of each of the remaining first SAW resonators.

37. The SAW filter as claimed in claim 35, wherein:

a first electrostatic capacitance based on a first product is smaller than a second electrostatic capacitance based on a second product;

the first product is a product of an aperture length of said one of the first SAW resonators in the second outermost arm, a number of finger pairs thereof, and a dielectric constant of a substrate of the first and second SAW resonators; and the second product is a product of an aperture length of each of said remaining first SAW resonators, a number of finger pairs thereof, and said dielectric constant.

38. The SAW filter as claimed in claim 35, wherein each of said remaining first SAW resonators connected respectively in the parallel arms comprises a plurality of component SAW resonators connected in parallel and *each of the plurality of component SAW resonators* has the same capacitance as said respective one of the first SAW resonators connected in the second outermost arm.

39. A SAW filter comprising:

a plurality of first SAW resonators, each having a pair of terminals, a first resonance frequency ($f_{rp}$) and a first antiresonance frequency ($f_{ap}$), based on the first resonance frequency and a first capacitance ratio ($\tau$) and higher than the first resonance frequency, said first SAW resonators being connected in respective, parallel arms of the SAW filter; and a plurality of second SAW resonators, each having a pair of terminals, a second resonance frequency ($f_{rs}$) and a second antiresonance frequency ($f_{as}$), based on the second resonance frequency and a second capacitance ratio ($\tau$) and higher than the second resonance frequency, said second SAW resonators being connected in a series arm of the SAW filter, wherein:

the first and second SAW resonators are connected so as to form a ladder-type filter structure;

the second resonance frequency is higher than [or equal to] the first antiresonance frequency;

a first outermost arm, closest to an input of the SAW filter, comprises one of the parallel arms, and a second outermost arm, closest to an output of the SAW filter, comprises another one of the parallel arms; and the respective one of the first SAW resonators connected in one of the first and second outermost arms has an admittance smaller than that of each of the remaining first SAW resonators respectively connected in the parallel arms and located interiorly of the SAW filter relatively to said respective one of the first SAW resonators connected in said one of the first and second outermost arms.

40. The SAW filter as claimed in claim 39, wherein the admittance of said respective one of the first SAW resonators in at least one of the first and second outermost arms is half that of each of said remaining first SAW resonators.

41. The SAW filter as claimed in claim 40, wherein:

a first electrostatic capacitance based on a first product is smaller than a second electrostatic capacitance based on a second product;

the first product is a product of an aperture length of said respective one of the first SAW resonators in at least one of the first and second outermost arms, a number of finger pairs thereof, and a dielectric constant of a substrate of the first and second SAW resonators; and the second product is a product of an aperture length of each of said remaining first SAW resonators, a number of finger pairs thereof, and said dielectric constant.

42. The SAW filter as claimed in claim 40, wherein each of said remaining first SAW resonators connected respectively in the parallel arms comprises a plurality of component SAW resonators connected in parallel and *each of the plurality of component SAW resonators* has the same capacitance as said respective one of the first SAW resonators connected in one of the first and second outermost arms.

43. A SAW filter comprising:

a plurality of first SAW resonators, each having a pair of terminals, a first resonance frequency ($f_{rp}$) and a first antiresonance frequency ($f_{ap}$), based on the first resonance frequency and a first capacitance ratio ($\tau$) and higher than the first resonance frequency, said first SAW resonators being connected in respective, parallel arms of the SAW filter; and a plurality of second SAW resonators, each having a pair of terminals, a second resonance frequency ($f_{rs}$) and a second antiresonance frequency ($f_{as}$), based on the second resonance frequency and a second capacitance ratio ($\tau$) and higher than the second resonance frequency, said second SAW resonators being provided in a series arm of the SAW filter, wherein:

the first and second SAW resonators are connected so as to form a ladder-type filter structure;

the second resonance frequency is higher than [or equal to] the first antiresonance frequency;

a first outermost arm, closest to an input of the SAW filter, is said series arm and a second outermost arm, closest to an output of the SAW filter, is also said series arm; and one of the second SAW resonators connected in a respective one of the first and second outermost arms has an impedance smaller than that of each of remaining second SAW resonators provided in the series arm and located interiorally of said SAW filter, relatively to said one of the second SAW resonators.

44. The SAW filter as claimed in claim 43, wherein the impedance of said one of the second SAW resonators is half that of each of the remaining second SAW resonators.

45. The SAW filter as claimed in claim 43, wherein each of said remaining second SAW resonators in the respective series arms comprises a plurality of SAW resonators connected in series and *each of the plurality of component SAW resonators* has the same capacitance as said one of the second SAW resonators provided in the at least one of the first and second outermost arms.

46. The SAW filter comprising:

a first SAW resonator having a pair of terminals and a predetermined resonance frequency ($f_{rp}$), said first SAW resonator being provided in a respective parallel arm of the SAW filter; and a second SAW resonator having a pair of terminals and a predetermined resonance frequency ($f_{rs}$) approximately equal to or higher than a predetermined antiresonance frequency of the first SAW resonator ($f_{ap}$), said second SAW resonator being provided in a series arm of the SAW filter, a first electric resistance (rs) of an interdigital electrode of said second SAW resonator being smaller than a second electric resistance (rp) of an interdigital electrode of said first SAW resonator.

47. The SAW filter as claimed in claim 46, wherein:

an aperture length (ls) of the interdigital electrode of said second SAW resonator is smaller than that (lp) of the interdigital electrode of said first SAW resonator; and a number (Ns) of finger pairs of the interdigital electrode of said second SAW resonator is larger than a number (Np) of finger pairs of the interdigital electrode of said first SAW resonator.

48. The SAW filter as claimed in claim 46, wherein a film thickness of the interdigital electrode of said first SAW resonator is smaller than a film thickness of the interdigital electrode of said second SAW resonator.

49. A band-pass filter comprising:

a plurality of SAW filters having respective pass bands and comprising a plurality of one-port SAW resonators connected in a ladder structure, each having at least a first stage and a series-arm resonator located at the first stage;

a pair of input terminals commonly connected to the plurality of SAW filters;

a plurality of pairs of output terminals respectively connected to the plurality of SAW filters;

an inductance element, located between at least one of the SAW filters and the pair of input terminals and connected in parallel to said at least one of the SAW filters; and a capacitance element connected in series between said inductance element and said series-arm resonator.

50. A band-pass filter comprising:

a plurality of SAW filters having respective pass bands and SAW resonators and each having at least a first stage;

a pair of input terminals commonly connected to the plurality of SAW filters;

a plurality of pairs of output terminals respectively connected to the plurality of SAW filters;

a first one of the SAW filters comprises a series-arm SAW resonator, located at the first stage of said first one of the SAW filters, and a parallel-arm SAW resonator, connected to said series-arm SAW resonator;

a second one of the SAW filters comprises a parallel-arm SAW resonator, located at the first stage of said second one of the SAW filters, and a series-arm SAW filter connected to said parallel-arm SAW resonator located at the first stage of the second one of the SAW filters; and a line used for phase rotation and connected in series between one of the pair of input terminals and the second one of the SAW filters.

51. The band-pass filter as claimed in claim 50, further comprising an inductance element located between the first one of the SAW filters and the pair of input terminals, and connected in parallel to the first one of the SAW filters.

52. The band-pass filter as claimed in claim 51, further comprising a capacitance element connected in series between said inductance element and the series-arm resonator of said first one of the SAW filters.

*53. The SAW filter as claimed in claim 1, wherein:*

*a product of an aperture length (Ap) and a number of (Np) of electrode finger pairs of the first SAW resonator is larger than a product of an aperture length (As) and a number (Ns) of electrode finger pairs of the second SAW resonator.*

*54. The SAW filter as claimed in claim 7, further comprising input and output terminals and wires connected to*

*said input and output terminals, wherein said bonding wire is longer than at least one of the wires which is connected to said input and output terminals.*

*55. The SAW filter as claimed in claim 7, further comprising:*

*a ceramic package to support said first and second SAW resonators; and*

*a metal terminal formed on said ceramic package and coupled to an external terminal.*

*56. The SAW filter as claimed in claim 14, wherein at least two of said inductance elements have different values of inductances.*

*57. The SAW filter as claimed in claim 14, wherein at least two of the first SAW resonators in the parallel arms of said SAW filter have different values of capacitances.*

*58. The SAW filter as claimed in claim 14, further comprising input and output terminals and wires connected to said input and output terminals, wherein at least one of said inductance elements comprises a bonding wire which is longer than at least one of the wires connected to said input and output terminals.*

*59. The SAW filter as claimed in claim 14, further comprising:*

*a ceramic package to support said first and second SAW resonators; and*

*a metal terminal formed on said ceramic package and coupled to an external terminal.*

*60. The SAW filter as claimed in claim 16, wherein the normalized value is larger than* $1/[1.3416(\tau+100)-\tau]$.

* * * * *

Disclaimer

RE37,375—Yoshio Satoh; Osamu Ikata; Tsutomu Miyashita; Takashi Matsuda Mitsuo Takamatsu, all of Nakahara-ku (JP). SURFACE ACOUSTIC WAVE FILTER. Patent dated Sep. 18, 2001. Disclaimer filed Sep. 18, 2001, by the assignee, Fujitsu Limited, Kawasaki (JP).

Hereby enters this disclaimer to claims 5 and 6, of said patent.

*(Official Gazette, September 23, 2003)*